United States Patent
Fan et al.

(10) Patent No.: US 11,063,425 B2
(45) Date of Patent: Jul. 13, 2021

(54) AUTONOMOUS ELECTRIC POWER FAULT DETECTION, ISOLATION AND RESTORATION SYSTEMS

(71) Applicant: Southern States, LLC, Hampton, GA (US)

(72) Inventors: Jiyuan Fan, Hampton, GA (US); Joseph R Rostron, Hampton (GA); Hua Fan, Hampton, GA (US); David Moore, Hampton, GA (US); Raj Anand, Hampton, GA (US); Brian Berner, Hampton, GA (US); Buddy Reneau, Hampton, GA (US)

(73) Assignee: Southern States, LLC, Hertford, NC (US)

(*) Notice: Subject to any disclaimer, the term of this patent is extended or adjusted under 35 U.S.C. 154(b) by 252 days.

(21) Appl. No.: 16/292,039

(22) Filed: Mar. 4, 2019

(65) Prior Publication Data
US 2019/0277904 A1 Sep. 12, 2019

Related U.S. Application Data

(60) Provisional application No. 62/639,638, filed on Mar. 7, 2018.

(51) Int. Cl.
*G01R 31/08* (2020.01)
*H02H 7/26* (2006.01)
(Continued)

(52) U.S. Cl.
CPC .......... *H02H 7/262* (2013.01); *G01R 31/08* (2013.01); *G01R 31/085* (2013.01);
(Continued)

(58) Field of Classification Search
USPC ....... 324/127, 424, 509–512, 761.01–764.01
See application file for complete search history.

(56) References Cited

U.S. PATENT DOCUMENTS

| 8,659,862 B2 | 2/2014 | Rostron |
| 8,717,721 B2 | 5/2014 | Rostron |

(Continued)

OTHER PUBLICATIONS

Tom Short, Fault Location on Distribution Systems: An Update on EPRI and DOE Research, IEEE Distribution Subcommittee presentation, Orlando, FL Jan. 19, 2007.

(Continued)

*Primary Examiner* — Melissa J Koval
*Assistant Examiner* — Joseph O Nyamogo
(74) *Attorney, Agent, or Firm* — Mehrman Law Office; Michael J. Mehrman

(57) ABSTRACT

Fault detection, isolation and restoration systems for electric power systems using "smart switch" points that autonomously coordinate operations to minimize the number of customers affected by outages and their durations, without relying on communications with a central controller or between the smart switch points. Each smart recloser can be individually programmed to operate as a tie-switch, a Type-A (normal or default type) sectionalizer, or a Type-B (special type) sectionalizer. The Type-A recloser automatically opens when it detects a fault, uses a direction-to-fault and zone-based distance-to-fault operating protocol, and stays "as is" with no automatic opening when power (voltage) is lost on both sides of the switch. The Type-B sectionalizer does the same thing and is further configured to automatically open when it detects that it is deenergized on both sides for a pre-defined time period, and to operate like a tie-switch once open.

20 Claims, 33 Drawing Sheets

(51) Int. Cl.
*H02H 1/00* (2006.01)
*H02H 7/22* (2006.01)
*G01R 31/28* (2006.01)
*H02H 7/30* (2006.01)

(52) U.S. Cl.
CPC ....... *G01R 31/2836* (2013.01); *H02H 1/0007* (2013.01); *H02H 1/0092* (2013.01); *H02H 7/22* (2013.01); *H02H 7/261* (2013.01); *H02H 7/30* (2013.01)

(56) References Cited

U.S. PATENT DOCUMENTS

| | | | |
|---|---|---|---|
| 8,861,155 B2 | 10/2014 | Rostron | |
| 8,866,487 B2 | 10/2014 | Rostron et al. | |
| 2001/0034568 A1* | 10/2001 | Egolf | H02H 3/07 700/292 |
| 2007/0005193 A1* | 1/2007 | Nelson | G06Q 10/06 700/286 |
| 2010/0161151 A1* | 6/2010 | Yang | H02J 13/0004 700/297 |
| 2012/0203479 A1* | 8/2012 | Yadav | H02H 7/261 702/58 |
| 2013/0024043 A1* | 1/2013 | Shaffer | H02H 7/30 700/297 |

OTHER PUBLICATIONS

Sayed Khundmir T, Fault Locating Using Voltage and Current Measurements, The Best Group, The Buffalo Energy Science ans Technology Group, Winter Lecture Series, Winter 2013.

Karl Zimmerman and David Costello, Impedance-Based Fault Location Experience, SEL Journal of Reliable Power, No. 1, Jul. 2010.

\* cited by examiner

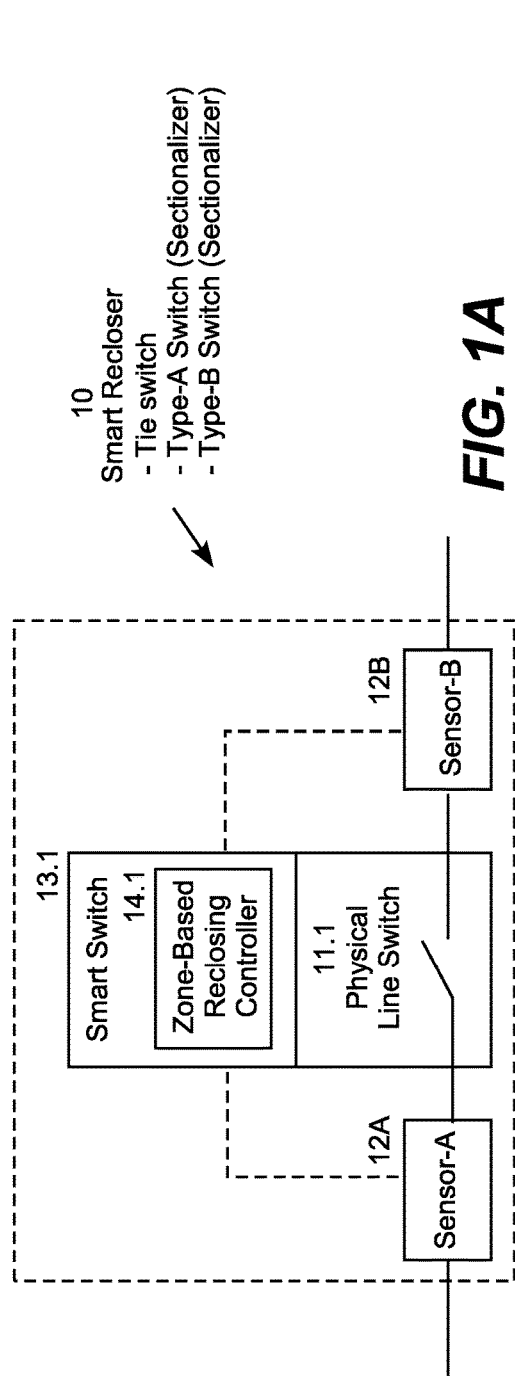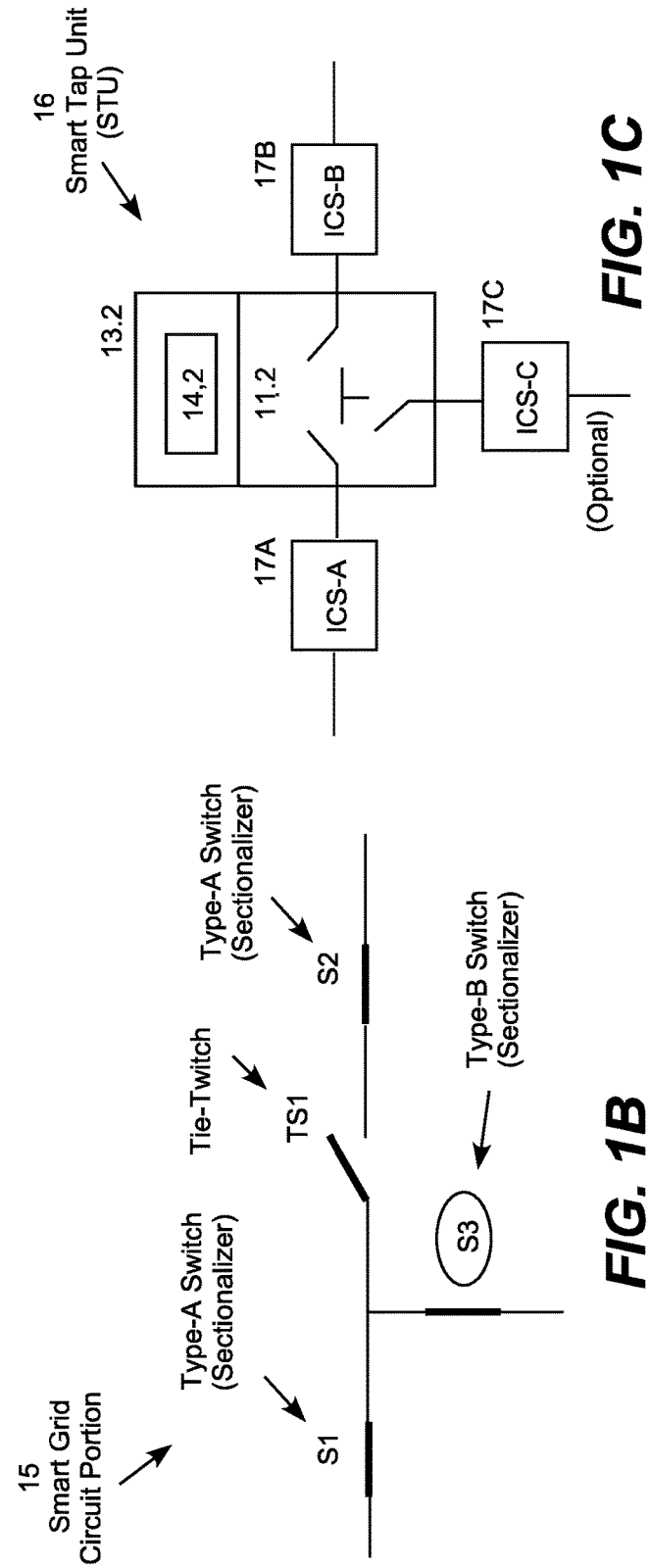

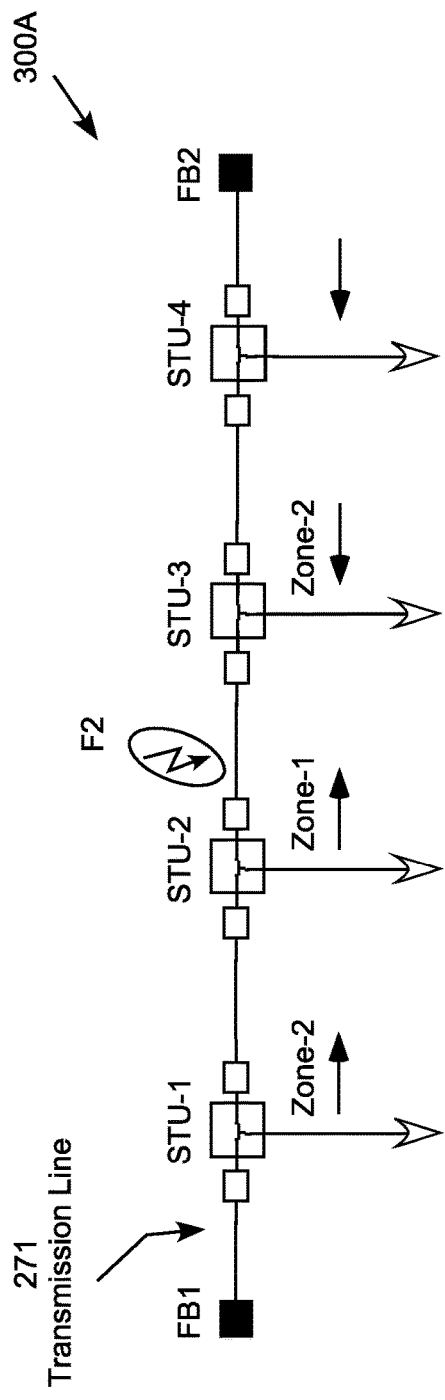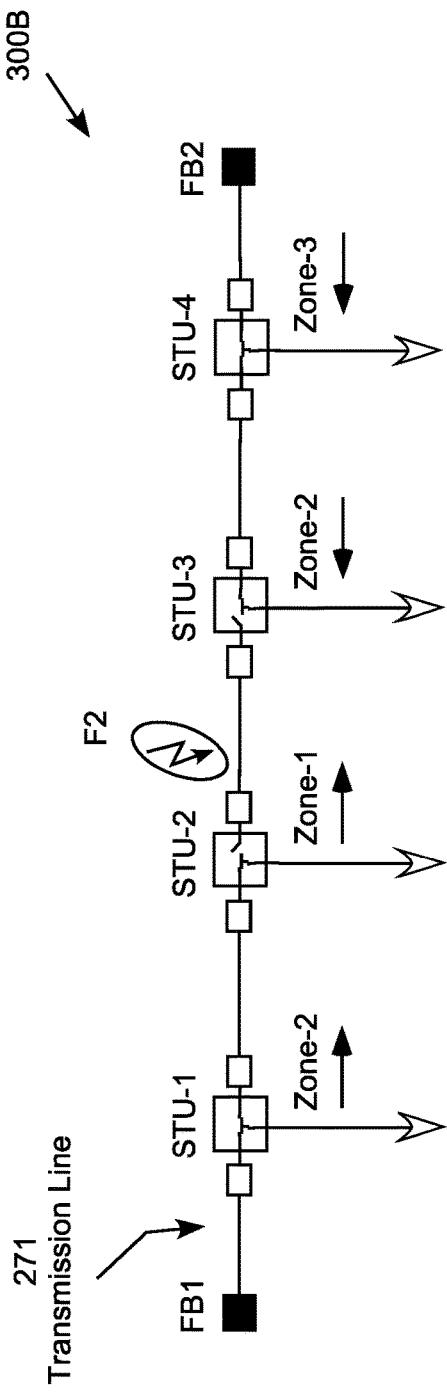

AUTONOMOUS ELECTRIC POWER FAULT DETECTION, ISOLATION AND RESTORATION SYSTEMS

REFERENCE TO RELATED APPLICATION

This application claims priority to commonly owned U.S. Provisional Application Ser. No. 62/639,638 entitled "Autonomous Electric Power Fault Detection, Isolation and Restoration Systems" filed on Mar. 7, 2018, which is incorporated by reference.

TECHNICAL FIELD

The present invention is directed to electric power systems and, more particularly, to electric power fault detection, isolation and restoration systems using "smart switch" points that detect direction-to-fault and zone-based distance-to-fault to autonomously coordinate operation among multiple switch points without relying on communications with a central controller or between the smart switch points.

BACKGROUND

Fault detection, isolation and service restoration (also referred to more compactly as "fault isolation" or "sectionalizing") is one of the most important tasks in electric power operations. Using automation to improve the reliability and operation of the transmission and distribution electric power grid is a top industry focus known as the "smart grid." Developing fast and reliable fault isolation systems that minimize the number of customers affected by power outages, and the duration of those outages, is one of the most important tasks in electric power automation and management. Conventional approaches for sectionalizing power circuits were designed for large, central-station power generation plants interconnected by a network of generally passive transmission and distribution lines to deliver the power downstream from the generating plants to the loads. The control schemes designed for this central-station paradigm are becoming increasingly unsatisfactory as electric transmission and distribution networks become increasingly active due to increasing penetration of distributed load-side power generation resources, such as solar panels, wind turbines, fuel cells, diesel and gasoline powered generators, and other distributed electric generation resources.

When power outages occur, time is of the essence because electricity is essential to modern life and public safety. Utilities are often penalized based on the duration of an outage and the number of customers affected. To help minimize power outages caused by line faults, sectionalizing switches (also called "reclosers") are used to isolate the faults and tie-switches are used to "back-feed" the non-faulted portions of the affected power lines to minimize the number of customers affected by the outages. But conventional sectionalizing techniques designed for passive transmission and distribution systems are not designed to take full advantage of the back-feed opportunities presented by tie-switches and distributed generation resources. Load-side generation can present additional safety hazards by unexpectedly energizing faulted or disconnected line segments from the downstream side.

While conventional transmission and distribution substations typically have utility-grade Supervisory Control and Data Acquisition (SCADA) communication systems allowing for remote monitoring and control of substation equipment, substations are quite expensive and require significant land and time consuming installation. Many transmission tap points located out on power lines away from the substations rely on non-reclosing circuit breakers and have no communication or remote control equipment. This can result in extremely long outage restoration delays, and associated customer outage times, as technicians have to physically travel to the tap points to reclose the breakers. Manual power restoration often relies on "hunt and peck" procedures as technicians try to locate faults on many miles of power lines with multiple tap points between sub stations.

Conventional distribution systems use automatic reclosers known as sectionalizers or reclosers to isolate faults. The vast majority of these are located on power lines away from the SCADA-controlled substations. After initially tripping, most conventional reclosers automatically attempt to reclose based on pre-set timing to give the fault a chance to clear without further action. A fault can clear by itself, for example, when a tree branch falls away after momentarily causing a line fault. If the fault persists after two or three reclosing attempts, the recloser typically locks open requiring a manual reset once the fault has been cleared.

Distribution feeders are generally configured to operate in a radial structure by setting a selected recloser that connects lines to two substations to be a normally-open tie-switch. The tie-switch is set to normally-open to avoid creating a connectivity loop between the substations in normal operation, but automatically closes to back-feed a portion of the circuit when it detects an outage condition. Although the selection of the tie-switch may be dynamic, a particular set of reclosers are usually designated to be the tie-switches for normal circuit conditions. A normally-open tie-switch automatically closes when it detects that power is lost on only one side of the tie-switch to provide a "back-feed" path to the line section that has lost power. Once closed, the tie-switch typically operates like a normally-closed sectionalizer.

More advanced fault isolation techniques typically involve detecting the distance and direction to an electric fault. Conventional "distance relays" estimate the distance to a power line fault by determining the line impedance after the fault occurs. However, conventional distance relays do not work well for faults on transmission lines with tap connections because the existence the tapped-off lateral lines affects the line impedance calculation and interfere with the distance estimation. Some transmission lines have upwards of nine taps, which can make it difficult to locate a fault and then sectionalize and reenergize quickly.

In distribution circuits, conventional automated fault isolation techniques can cause unnecessary open and close operations of the sectionalizers when isolating faults, which exposes the power lines to repeated transient disturbances including fault currents, voltage drops, and power outages. This causes unnecessary mechanical wear-and-tear on the switches, as well as multiple transient disturbances on customer equipment, which can knock customer equipment off line and damage electronics. Electric service reliability is generally perceived to decrease as the number of these incidents increases.

Communication systems have been added to transmission and distribution switches located away from substations to enhance fault isolation techniques. For example, certain tap units, tie-switches and sectionalizers may include SCADA radios that communicate with the central control station. When a fault occurs on a line segment between two switches, the feeder breaker at the substation typically trips to clear the fault, while fault detection devices at each switch along the fault current path reports a fault flag to the central controller for manual or automatic fault isolation and service restoration. The feeder breakers are typically configured to automatically attempt to reclose two or three times trying to restore the service quickly if the fault is not permanent. This type of solution typically relies on utility-grade SCADA communication and centralized control systems, which are quite complex and costly. The effectiveness of any fault isolation technique is ultimately measured by the speed, reliability, and effectiveness of the fault isolation response. In general, these SCADA approaches are much better than manual "hunt and peck" fault isolation techniques but still involve relatively long procedures, up to tens of minutes in some practical operations.

Automated solutions using switch-level communications and decentralized control have also been developed. The IntelliTeam® system sold by S&C Electric Company is a representative example. This type of solution organizes groups of adjacent switches as independent teams that detect faults through multi-party communications among the team members to determine whether the fault has occurred within the team. When this occurs, all members of the team typically trip without reclosing to initially isolate the fault. When the feeder breaker re-energizes the faulted line section, the deenergized team switches located downstream automatically reclose in cascade as one side of each switch is energized one after another. This approach usually results in an unnecessarily large number switching events and may leave switches unnecessarily open at the end of the restoration process. The sectionalizing process is further complicated by tie-switches and distributed generation resources that can be used to back-feed line sections as the fault is isolated. This may result in multiple reclosing sequences in which a single error in the switching sequencing or the multi-party communications during the restoration process can leave the feeder incompletely restored with many switches unnecessarily left open.

Communication-based fault isolation techniques face another challenge because the communication equipment used for fault isolation is needed most at the precise times when the electric power system experiences outages. The loss of electric power therefore interrupts the operation of the grid-powered communication components just when they are needed most. In addition, the communication systems are also vulnerable to severe weather conditions in which the electric power grid faults have more chance to occur. While battery-powered radios may continue to operate during a power outage, the batteries require monitoring and occasional replacement. The U.S. electrical grid includes over five million miles of electric power distribution lines with several million switch points operating at a range of voltages. Many of these switches are in remote locations and the vast majority are located on low-voltage distribution lines that are costly to patrol. Installing a communication system among the switch points or between a central controller and the switch points is an important cost factor in electric power systems, typically costing in the range of $500,000 for "carrier" systems or $30,000 per mile for fiber communications. Installing and maintaining battery-powered radios can be cost prohibitive for many of these switch points. Other types of communication systems are unreliable, often unavailable up to 50% of the time when they are needed. Dedicated hard-wire phone lines are a thing of the past.

The electric power industry therefore has a continuing need for new and more effective, economic, reliable and safe techniques for "smart grid" power line fault detection, isolation and service restoration.

SUMMARY

The present invention solves the problems described above through Fault Detection, Isolation and Restoration (FDIR) Systems using "smart switches" that detect direction-to-fault and zone-based distance-to-fault to autonomously coordinate operation without relying on communications with a central controller or between the switch points. In an illustrative embodiment, the smart switches operate during the substation breaker reclose cycles while the substation breakers are open, which enables the substation breakers to reclose successfully to restore service within their normal reclosing cycles. Alternatively, the smart switch may be timed to operate before the substation breakers trip to effectively remove the substation breakers from the fault isolation process. Both approaches allow the FDIR system to be installed with minimal reconfiguration of the substation protection scheme. The first reclose may be based on a "fuse-safe" step-distance logic designed to prevent fuses on the faulted line section from tripping, while the second reclose may be based on a "step-ascend" logic designed to cause the fuses on the faulted line section to trip if the fault does not clear during the second reclose attempt.

It will be understood that specific embodiments may include a variety of features in different combinations, and that all of the features described in this disclosure, or any particular set of features, needs to be included in particular embodiments. The specific techniques and structures for implementing particular embodiments of the invention and accomplishing the associated advantages will become apparent from the following detailed description of the embodiments and the appended drawings and claims.

BRIEF DESCRIPTION OF THE FIGURES

The numerous advantages of the invention may be better understood with reference to the accompanying figures in which:

FIG. 1A is block diagram of a smart switch.

FIG. 1B is a one-line diagram of a an illustrative section of an electric power distribution circuit including smart switches.

FIG. 1C is block diagram of a smart tap unit.

FIG. 30A illustrates the STU system before reacting to a second power line fault.

FIG. 30B illustrates the STU system after reacting to the second power line fault.

DESCRIPTION OF ILLUSTRATIVE EMBODIMENTS

Figure 2:
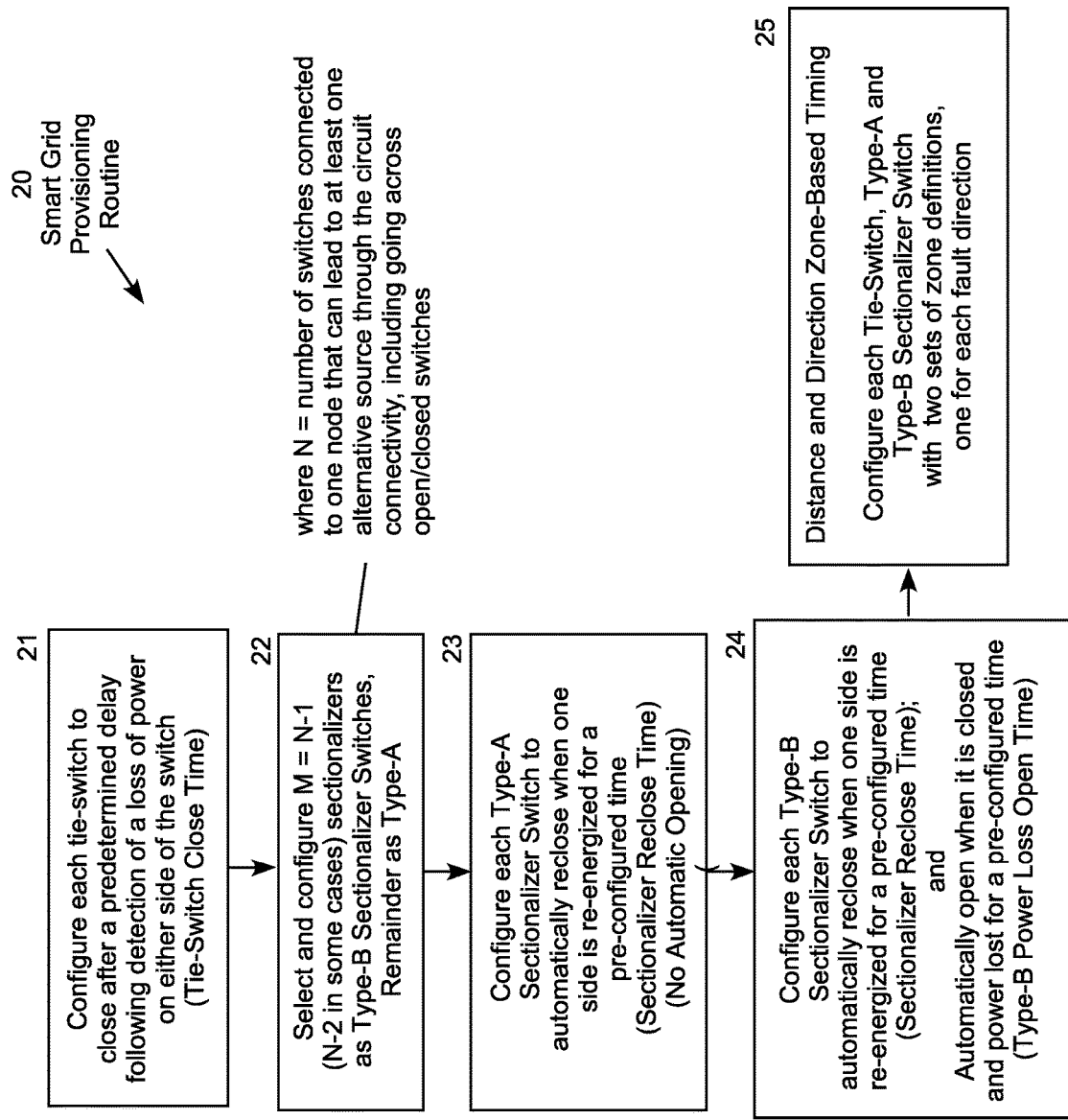
FIG. 2 is a logic flow diagram for provisioning a smart grid system.

The present invention may be embodied in a variety of electric power automation systems referred to as Fault Detection, Isolation and Restoration (FDIR) Systems, in which each electric power "smart switch" includes voltage and current line sensors allowing the switch point to independently determine the direction-to-fault and zone-based distance-to-fault of electric power line faults. Each smart switch also includes a reclosing controller that allows the switch point to implement operating algorithms independently of the other switch points to isolate the faults automatically to minimize the number of customers affected and the durations of the outages. Sophisticated zone definitions and trip and reclosing timing algorithms allow the smart switches to autonomously coordinate their operation without relying on communications with a central controller or between the switch points. In various embodiments, the smart switches include transmission smart tap units (STUs) and distribution tie-switches and two varieties of sectionalizers, Type-A (normal or default type) and Type-B (special type). Although a central controller may be used to remotely provision the smart switches prior to operation, the smart switches are configured to operate autonomously without relying on communications at the time of fault isolation.

At the transmission level, the FDIR system is referred to as a "Transmission Fault Detection, Isolation and Restoration (T-FDIR) System," and at the distribution level the system is referred to as a "Distribution Fault Detection, Isolation and Restoration (D-FDIR) System." All or only a portion of the switch points in a particular electric power system may be configured as "smart grid" reclosers. In addition, autonomous FDIR switch points may be combined with communication-based switching systems, as a matter of design choice. These embodiment are referred to as "Hybrid Fault Detection, Isolation and Restoration (H-FDIR) Systems."

The illustrative D-FDIR embodiments are designed for normally radial distribution circuits with tie-switches allowing back-feed configurations to be created on an as-needed basis as part of fault isolation procedures, while the illustrative T-FDIR embodiments are designed for transmission line sections with one or more tap points. Although the D-FDIR and T-FDIR embodiments are configured to operate autonomously without communication between switching points or master control from a central controller, a SCADA or other management system may be responsible for remotely provisioning (programming) the smart switches. This allows the recloser type, timing settings, zone definitions, and operating algorithms to be managed remotely on an as-needed basis by centrally located system operators. Power line measurements and smart switch operation logs are typically stored locally and reported to the central management system for display, analysis, troubleshooting, response equipment operation, and other functions.

Commonly owned U.S. Pat. Nos. 8,866,487; 8,861,155; 8,717,721 and 8,659,862 are incorporated by reference. These patents describes techniques for detecting high impedance faults, determining the direction to the faults, and isolating the faults using power line measurements and communications between the switch points and a central controller. The innovative FDIR systems may utilize or be integrated with the techniques described in these documents. In addition, U.S. patent application Ser. No. 15/971,968 (Pub. No. 20180321285), which is also incorporated by reference, describes a transmission voltage substation-based smart switch using combined voltage and current power line sensors referred to as the Intelligent Circuit Sensor (ICS). The transmission level T-FDIR systems use higher voltage sensors and switches, while distribution level D-FDIR systems use lower voltage sensors and switches with similar functionality in physically smaller packages suitable for their lower operating voltages. Additional documents describing the FDIR systems, along with several background references, are included in U.S. Provisional Application Ser. No. 62/639,638 entitled "Autonomous Electric Power Fault Detection, Isolation and Restoration Systems" filed on Mar. 7, 2018, which is also incorporated by reference. Several background references in this provisional application describe conventional techniques for estimating the distance to electric power faults, which typically involves measuring the impedance of the power line before and after a fault occurs. The FDIR systems use these or similar techniques to detect faults and estimate the distances to the faults.

The innovative FDIR systems reduce the need for fault distance accuracy by only using the distance-to-fault estimations to categorize detected faults into distance zones. For example, a particular switch (typically a D-FDIR switch) may be configured to identify a fault as a "Zone-1" fault when it is "very likely" (e.g., above 80% probability) that particular switch is the closest switch to the fault location. The same switch may also be configured to identify a fault as a "Zone-2" fault when it is "somewhat likely" (e.g., above 20% but less than 80% probability) that particular switch is the closest switch to the fault location. Similarly, the switch may be configured to identify a fault as a "Zone-3" fault when it is "unlikely" (e.g., below 20% probability) that particular switch is the closest switch to the fault location. Since the distance from any particular switch to the next switch along the power line is typically different in the upstream and downstream directions, each smart switch is ordinarily configured with two sets of zone parameters, one for each direction along the main power line. A distribution tap point may include Zone-1, Zone-2 and Zone-3 definitions for each direction from the tap point.

Alternatively, a particular switch (typically a T-FDIR switch) may be configured to identify a fault as a "Zone-1" fault when the switch is configured to trip during the first breaker reclose cycle following a fault (e.g., when the fault is estimated to have occurred within 80% of the distance to the adjacent switch). The same switch may also be configured to identify a fault as a "Zone-2" fault when the switch is configured to trip during the second breaker reclose cycle following the fault (e.g., when the fault is estimated to have occurred more than 80% of the distance to the adjacent switch but less than 160% of the distance to the adjacent switch). Similarly, the switch may also be configured to identify a fault as a "Zone-3" fault when it is configured to do nothing or only trip during a third breaker reclose cycle following the fault (e.g., when the fault is estimated to have occurred more than 160% of the distance to the adjacent switch). The switch may also be configured to identify a fault as a "Zone-4" fault when the fault is determined to have occurred on a tapped line segment. Again, each switch is usually programmed with separate zones for each direction in which a power line segment extends from a switch or tap point, for example a 3-way tap point may be configured with a third set of zone parameters for the direction along the tapped line segment. In some cases, the 3-way tap may be configured to identify a fault occurring anywhere on a taped line section as a Zone-4 fault and trip immediately in the direction of the fault whenever it detects a fault on the tapped line segment. This may be appropriate, for example, where the tapped line segment does not include another sectionalizer downstream from the 3-way tap point.

In a conventional electric distribution system, a tie-switch remains open so long as both sides of the switch are energized, and closes when a loss of power (voltage) is detected on either side of the switch. Once closed, the tie-switch operates as a conventional sectionalizer. A conventional sectionalizer automatically opens when it detects a fault and typically attempts to reclose two or three times based on pre-set timing. That is, the conventional recloser trips in response to a fault, and then locks open if it recloses into the fault two or three times (i.e., if the fault persists through two or three reclose cycles). A load switch (also referred to as a disconnect switch), as well as non-reclosing circuit breakers, lock open when they initially trip upon detecting a fault without having the ability to automatically reclose. Conventional reclosing schemes that perform better than the manual "hunt and peck" or "trial and error" techniques typically require some form of communication among the switch points, or between a central control point and the switch points, to isolate a fault and restore the non-faulted part of the system in a coordinated manner. For example, a SCADA system providing communication among the switch points, or between a central controller and the switch points, may be used to remotely operate the switches in a coordinated manner.

In both D-FDIR and T-FDIR systems, strategically selected and positioned sets of direction-to-fault and zone-based distance-to-fault detecting smart switches are installed and programmed to operate independently, but in a coordinated manner, to produce autonomous FDIR systems that automatically isolate electric power faults without communications among the switch points or between a central control point and the switch points at the time of fault isolation. These autonomous sectionalizing techniques produce far better fault isolation response times than the conventional "hunt and peck" approaches, to minimize the numbers of customers affected by fault-related outages and the durations of the outages. In most cases, D-FDIR fault isolation is accomplished with a maximum of two reclosing attempts by any smart switch. T-FDIR fault isolation, on the other hand, is typically accomplished with a maximum of two reclosing attempts by the associated substation breakers, while the STUs at the tap points operate between the breaker trip and reclose events (i.e., during the reclose cycles) while the affected section of transmission line is deenergized by the substation breakers.

The D-FDIR system autonomously sectionalizes faults on distribution feeders while using tie-switches and load-side generation resources to back-feed non-faulted line sections to the extent possible within circuit overload protection limits. Each D-FDIR smart recloser can be individually programmed (and reprogrammed, as desired) to operate as a tie-switch, a Type-A (normal or default type) sectionalizer, or a Type-B (special type) sectionalizer. A smart tie-switch is configured to automatically close when it is open with only one side energized. Once closed, the tie-switch may be programmed to operate as a Type-A switch or a Type-B switch. The Type-A recloser determines whether to trip (or reclose) based on sophisticated zone definitions and direction-to-fault and zone-based distance-to-fault timing. The Type-A switch also stays "as is" with no automatic opening or reclosing when power (voltage) is lost on both sides of the switch. The Type-A switch only attempts to reclose twice, the first time using zone-based step-distance (fuse-safe) timing, and the second time using zone-based step-ascend (fuse-trip) timing.

A Type-B switch does the same thing and, unlike a Type-A recloser, is further configured to open automatically when it is closed but loses power (voltage) on both sides of the switch for a preconfigured time period. This can occur, for example, after an upstream recloser has tripped to isolate a fault and before a downstream tie-switch has closed to back-feed the line section. During this time interval, the Type-B recloser automatically opens to give the tie-switch sufficient time to close to back-feed the downstream line segment. After the tie-switch closes, an open Type-B switches with connectivity to the now closed tie-switch automatically closes because it detects voltage on only one side of the switch. The now closed Type-B switch will then remain closed if it does not detect a fault, or it will automatically trip if it closes into the fault and may automatically attempt to reclose to clear the fault in accordance with its preconfigured reclosing protocol. If the fault persist, the Type-B switch locks open to isolate the fault. Multiple Type-B switches with connectivity to the same tie-switch are programmed with different timing to avoid forming connectivity loops. Like a tie-switch, the Type-B recloser also closes back (recloses) automatically when only one side is re-energized for a preconfigured time. In other words, the Type-B switch automatically opens when it detects a loss of voltage on both sides of the switch of the switch for a predetermined time period, automatically closes when it detects voltage on only one side of the switch for a predetermined time period, remains closed so long it detects voltage on both sides of the switch of the switch without detecting a fault condition, and trips and recloses with direction-to-fault and zone-based distance-to-fault logic when it detects a fault. Type-B reclosers may also reclose with different timing if more than one Type-B switch is involved in one section to avoid forming connectivity loops.

When a tie-switch closes into a faulted line section, the closest recloser to the faulted section (i.e., the Zone-1 sectionalizer on the downstream side) will trip to isolate the faulted section from the downstream side. The smart recloser knows whether it is on the upstream or the downstream side of the fault from the fault direction. The Zone-1 downstream sectionalizer may therefore trip without reclosing when it detects the fault, or it may utilize one or more reclosing cycles, depending on its programmed logic. In addition, load-side distributed energy resource (DER) and distributed generation (DG) can often ride through momentary single-phase faults with two-phase operation for a period of time. Thus, there may be no need to immediately disconnect all three phases for load-side generation sources in response to single-phase fault interruptions. They will often ride through with two-phase operation if the single-phase faults clears. And, if the single-phase fault does not clear, they will eventually be disconnected when the fault persists beyond the typical two-reclose fault-clearing process (e.g. 15 to 30 seconds).

For a D-FDIR system, if the number of sectionalizers connecting to the same feeder section is more than two, i.e., N>2, then at least M=N−1 (or N−2 in special cases) sectionalizers that directly or indirectly connect to at least one tie-switch are configured as Type-B sectionalizers. This ensures that there are sufficient Type-B switches to back-feed non-faulted line sections. It is possible that a fault may occur near the feeder head and the entire feeder may have to be picked up by one tie-switch in extreme conditions. This could result in significant overloading of the back-feeding circuit, which could cause the alternative feeder breaker to trip causing a significant and potentially cascading outage. To avoid this type of potentially severe black-out, each tie-switch defines an upper limit for picking up new load. Once the load exceeds the limit, the tie-switch trips to avoid overloading the back-feeding circuit. For example, the tie-switch may automatically trip whenever its current exceeds a pre-defined threshold (e.g., 50%, 70% or 90% of a feeder's rated load). This limits back-feeding from tie-switches to only occur safely within the overload protection limit of then back-feeding circuit.

D-FDIR fault isolation and electric service restoration on the upstream side of the fault proceeds as follows. Based on the direction-to-fault and the zone-based distance-to-fault settings, the closest upstream recloser (i.e., the Zone-1 sectionalizer on the upstream side) to the fault will trip, reclose, trip again and lock out for a permanent fault, which isolates the fault on the upstream side without causing upstream service interruption. The Zone-1 upstream sectionalizer knows that it is on the upstream side from the fault direction, and therefore knows to reclose to attempt to clear the fault in accordance with its programmed logic. If two consecutive sectionalizers on the upstream side of the fault trip due to the limited accuracy of distance estimation (i.e., preconfigured distance zone overlap, see FIG. 24), the downstream sectionalizer loses power due to operation of the upstream sectionalizer and, therefore, will remain open without reclosing. The upstream sectionalizer will therefore reclose successfully because it will be isolated from the fault by the now open downstream sectionalizer. The end result will be isolation of the fault on the upstream side by the nearest recloser to the fault.

D-FDIR fault isolation and restoration on the downstream side proceeds as follows. Upstream isolation leaves the downstream sections deenergized. This causes the Type-B sectionalizers to open automatically according to their preset timing configuration. After the Type-B switches have opened, at least one tie-switch in the downstream section will have voltage on only one side (one-side-hot tie-switch), which causes the tie-switch to close automatically. If the tie-switch does not close into the fault, it remains closed to back-feed the non-faulted line section. If the tie-switch does close into the fault, on the other hand, the closest sectionalizer to the fault (i.e., the Zone-1 sectionalizer on the downstream side) will trip and lock out typically without trying to reclose. If two consecutive sectionalizers on the downstream side of the fault trip due to the limited accuracy of distance estimation (i.e., preconfigured distance zone overlap, see FIG. 24), the upstream sectionalizer loses power due to operation of the downstream sectionalizer and, therefore, will remain open without reclosing. The downstream sectionalizer will therefore reclose successfully because it will be isolated from the fault by the now open upstream sectionalizer. The end result will be isolation of the fault on the downstream side by the nearest recloser to the fault. The above process effectively isolates the faulted section between the two closest (Zone-1) reclosers on the upstream and downstream sides of the fault, and restores power to the non-faulted sections of the circuit. This is the complete fault isolation and electric service restoration process for a simple circuit configuration that includes only one tie-switch providing only one potential back-feed path as an alternative power source.

In more complicated circuits with multiple tie-switches in play, the tie-switches are timed to operate in a staggered manner, which may cause D-FDIR sectionalizing to proceed sequentially for the available tie-switches. For example, operation of a first Type-B switch may cause a first tie-switch to have voltage on only one side, causing that tie-switch to close to back-feed the connected line section. This may overload the tie-switch (or another switch) causing it trip and lock open. This may cause another Type-B switch to lose voltage on both sides, causing it to open automatically. This, in turn, may cause a different tie-switch to have voltage on only one side, causing this tie-switch to close to back-feed the connected section. This may overload that tie-switch (or another switch) causing it to trip and lock open, which causes another Type-B switch to lose voltage on both sides and thus open, and so forth. The process continues until a tie-switch is located that successfully back-feeds the non-faulted sections of the faulted circuit, or when there are no tie-switches left as possible back-feed sources. No matter how many tie-switches may be in play, the sectionalizing process will eventually complete when no Type-B switches automatically close or reopen (i.e., all Type-B switches are either locked open or closed with no fault current and voltage on both sides). Completion is ensured because all of the smart reclosers are configured to lock open after a preconfigured number of reclosing trials, typically two, which is sufficient to clear any temporary faults and back-feed any non-faulted line sections to the extent permitted by the available tie-switches within circuit overload protection. The end result will be isolation of the fault between the two closest smart reclosers, with tie-switches and load-side generation resources back-feeding the non-faulted line sections to the extent permitted by circuit overload protection.

In addition, each D-FDIR switch typically utilizes a sophisticated reclosing technique including step-distance (fuse-safe) reclose timing for the first reclosing attempt designed to prevent the fuses on the faulted line section to tripping, and step-ascend (fuse-trip) reclose timing designed to cause the fuses on the faulted line section to trip (blow) if the second reclosing attempt fails. These distance zones are typically defined separately for each direction from the switch. For example, directional zones can be defined to properly cover the trunk feeder sections in both directions from the smart recloser as well as lateral lines tapped off from the trunk sections. The step-ascend (fuse-trip) reclose timing effectively forces the second reclosing attempt to succeed because at least one overloaded fuse on the faulted line section trips (blows) during the second reclosing attempt, which restores power to at least some portion of the faulted line section (i.e., the line section between the recloser and the first blown fuse, which is hopefully the fuse closest to the location of the fault).

The D-FDIR control logic can be implemented for both 3-phase and single-phase operated smart reclosers. Single-phase switching is very effective for active distribution grids with a high penetration of distributed load-side generation, where anti-islanding is a challenging task. With the feature of single-phase switching, the DERs/DGs in the distribution feeders do not necessarily have to be fully disconnect from the feeder due to a single-phase fault, but can ride through the single-phase outage for a short time period (e.g., 10 to 30 seconds) with two-phase operation, to provide time for the D-FDIR fault isolation procedure to complete. For single-phase faults, which are the majority cases in practical operation, fault isolation can be executed for the faulted phase only, while maintaining the other two healthy phases running. This is very useful for the active feeders with DERs/DGs connected. During the downstream restoration, a temporary two-phase loop will form before the faulted section is fully isolated. As a result, anti-islanding is no longer a difficult problem for most fault conditions.

The D-FDIR technology produces several key benefits for distribution systems. Unlike the existing solutions in use today, D-FDIR operation does not use any communication between smart reclosers, but instead relies on local logic based on preconfigured algorithms and local voltage and current measurements. Fast and reliable upstream fault clearing and isolation is accomplished without service interruption to the upstream feeder sections. Fast and reliable downstream restoration is also accomplished with rule-based logic embedded in the smart switch controllers. No dynamic configuration is needed for changes in feeder topology. The same control logic is applicable to all smart reclosers, with zone definitions and timing parameters provisioned as needed (remotely where communication systems are in place), hence field setup is convenient and quick.

Effective solutions can be implemented in stages working with the existing feeder configuration and the existing load switches by initially replacing the statically configured tie-switches with smart reclosers as the first stage. A sufficient number of existing reclosers can be replaced with Type-B smart reclosers as the next stage, with the remaining reclosers replaced by Type-A smart reclosers in the final stage. The autonomous D-FDIR smart-grid operation can be completely independent of the existing SCADA-based distribution automation system, allowing the SCADA system to focus on FDIR system management and playing a backup role for the autonomous smart-grid scheme. The FDIR system also isolates a fault to a single line section with distance estimation from the nearest tripped reclosers, which facilitates quick fault location and repair.

Most D-FDIR smart switches will be located away from the substations where they will be physically closer to the faults, which provides for more accurate voltage and current measurements, which translates into more accurate direction and distance estimations performed at each switch point. The resultant error will therefore be relatively low and reasonably deterministic, while zone-based distance estimation reduces the need for highly accuracy distance estimation. Avoiding the need for SCADA-based control and highly accurate voltage computations (which are required for highly accurate distance-to-fault computations) at the smart switch points away from the substations allows for lighter weight, less expensive smart switches with lower power requirements to be installed on existing poles and other existing rights-of-way, producing huge cost benefits. And the ability to install lower-cost smart switches, in turn, allows a greater number of D-FDIR smart switches to be economically feasible in a much larger number of locations, resulting in higher levels of "smart grid" penetration. And this, of course, is exactly what is needed to bring the "smart grid" to a far greater portion of the millions of miles of low voltage distribution feeders throughout the U.S. and other countries.

The transmission level T-FDIR systems employ similar technology at the higher transmission voltages. A Smart Tap Unit (STU) is installed at each tap using voltage and current measurements produced by two ICS devices, one on each side of the tap point, to detect faults and then control the tap switches to isolate the faulted section based on the smart switch logic. The STU typically operates during the substation breaker reclose cycles, which enables the substation breakers to reclose successfully to restore service within their normal reclosing cycles. That is, the STU reclosers typically operate between the trip and reclose events of the substation breakers during the first and second reclose cycles of the substation breakers while the substation breakers are open. In practical operation, the first reclose is usually reserved to give a chance for a temporary fault to clear by itself, while the second or the third reclose can guarantee a success to restore service because the FDIR control isolates the permanently faulted section (confirmed with the first reclose failure). For example, the first reclose may be based on a "fuse-safe" step-distance logic designed to prevent fuses on the faulted line section from tripping, while the second reclose may be based on a "step-ascend" logic designed to cause the fuses on the faulted line section to trip. The total restoration time may be around 30 to 60 seconds or less, depending on the timing configuration of the substation breakers.

For each tap point, a representative T-FDIR embodiment defines fault four zones. Zone-1 is a certain percentage length along the main transmission line segment, e.g., from 0 to 70% along the main transmission line segment to the next tap in each direction. Zone-2 starts from 70% to 130% of the main transmission segment to the next tap in each direction. Zone-3 extends from 130% to rest of the main transmission line to the substation breakers. And Zone-4 indicates a fault on a tapped line segment without additional sectionalizers. When a fault occurs, the direction and estimated distance from the STU to the faulted point is computed from the local 3-phase voltage and current measurements, from which the fault direction and zone are determined. A key feature of the T-FDIR system is the associated control scheme based on the fault zone detected at each tap. If the fault falls in Zone-1, the STU will open the corresponding switch in the fault direction after the first (instantaneous) substation breaker reclosing trial fails. If the fault is determined to be in Zone-2, the STU will open the switch after the second substation reclosing trial fails. If in Zone-3, the STU will do nothing. If the fault is in Zone-4 along the tapped line section, the STU will open immediately in the direction of the tapped line. With this control scheme, every tap point takes action by itself independently, without communicating with the substation breakers or the other tap points.

In addition, the substation breakers may be configured to utilize the "fuse-safe" step-distance timing during the first reclose cycle, while the substation breakers may be configured to utilize the "fuse-trip" step-ascend timing during their second reclose cycle. If desired, however, the STUs may be timed to operate before the substation breakers, to effectively take the substation breakers out of the fault isolation process. In this case, the T-FDIR STUs will typically use the fuse-safe timing during its own first reclose attempt, and use the fuse-trip timing during its own second reclose attempt, as described above for D-FDIR reclosers.

Turning to the figures, FIG. 1A is block diagram of an automatic electric power sectionalizer switch referred to as a smart recloser 10 used in smart grid embodiments, FIG. 1B shows a representative section 15 of a smart grid circuit, and FIG. 1C shows a Smart Tap Unit (STU) 16 used in certain embodiments. Although the power line voltages are higher for T-FDIR embodiments, the "smart switch" direction-to-fault detection and zone-based distance-to-fault estimation features are similar for D-FDIR and T-FDIR embodiments. The programmed operating logic is generally different, however, due to the different circuit configurations encountered in distribution versus transmission circuits. More specifically, D-FDIR embodiment utilize smart tie-switches, Type-A and Type-B sectionalizers to solve FDIR problems that commonly occur in distribution circuits, whereas the T-FDIR embodiments utilize 3-way Smart Tap Points (STUs) to solve FDIR problems that commonly occur in transmission circuits.

Referring to FIG. 1A, the smart recloser 10 includes a physical line switch 11.1 and two line sensors 12A and 12B that measure the line currents and voltages both upstream (Sensor-A) and downstream (Sensor-B) from the physical line switch along the controlled power line. The physical line switch 11.1 is controlled by a D-FDIR smart switch 13.1 that includes a zone-based reclosing controller 14.1. The reclosing controller 14.1 includes a microprocessor, memory and power supply, such as a rechargeable battery or capacitor bank that remains charged with a small solar panel, a small wind generator, a small fuel cell, or power harvested from the power line controlled by the recloser so that the recloser can operate when the power line experiences an outage. Other types of power supplies may be employed as a matter of design choice, such as a 120V circuit connected to a power supply other than the power line controlled by the recloser, long-life non-rechargeable batteries, and so forth. The reclosing controller 14.1 is programmable so that the same recloser can be configured to operate as a smart tap unit (STU), tie-switch, Type-A sectionalizer or a Type-B sectionalizer. The reclosing controller 14.1 may also be programmed with different timing and distance-based zone operating protocols. Since the distance of the smart recloser 10 to other switches typically varies in different directions along the power line from the recloser, the reclosing controller 14.1 can be programmed with different timing and distance-based zone operating protocols for different directions from the recloser.

FIG. 1B is a one-line diagram of a representative circuit section 15 of an electric power distribution circuit including several smart reclosers, which may be more specifically referred to as a portion of a Distribution Fault Detection, Isolation and Restoration (D-FDIR) System. The example D-FDIR circuit section 15 has a "T" structure including a normally-open tie-switch TS1, two normally-closed Type-A sectionalizers S1 and S2 and a normally-closed Type-B sectionalizer S3, which is circled to distinguish the Type-B switch from the Type-A switches (not circled). This is the basic one-line diagram circuit notation that will be used to describe the automated operation of D-FDIR circuits. As noted above, the same type of smart recloser 10 can be programmed to operate in any of these modes, as summarized previously and described with reference to flow charts below. To summarize again, a tie-switch automatically closes when it detects a loss of power on either side of the switch, and automatically opens when it detects a fault. Once a tie-switch is closed, it can operates as a Type-A or Type-B recloser according to its programmed logic. Different tie-switches connected to the same circuit may close with different timing to avoid forming connectivity loops. The Type-A recloser automatically opens when it detects a fault employing direction-to-fault and zone-based distance-to-fault detection for use in its operating protocol, and stays "as is" with no automatic opening when power (voltage) is lost on both sides of the switch. The Type-B does the same thing, and (unlike a Type-A recloser) automatically opens when it is closed and power is lost on both sides of the switch for a preconfigured time period. Once open., the Type-B switch beaves like a tie-switch and closes back (recloses) automatically when only one side is re-energized for a preconfigured time. Type-B reclosers may also reclose with different timing if more than one Type-B switch is involved in one section to avoid forming connectivity loops.

Referring to FIG. 1C, the T-FDIR Smart Tap Unit (STU) 16 includes a 3-way physical line switch 11.2 and two Intelligent Circuit Sensors 17A and 17B (ICS-A and ICS-B) that measure the line currents and voltages both upstream (ICS-A) and downstream (ICS-B) from the physical line switch along the controlled power line. An optional third ICS-C 17C may be included on the tap line, but is typically unnecessary when the tapped line section does not include additional sectionalizers because the directional sensors ICS-A and ICS-B on the main line can determine when a fault has occurred on the taped line (i.e., the fault direction at ICS-A and ICS-B are both toward the physical line switch indicates that a fault has occurred on the tapped line).

The physical line switch 11.2 is controlled by a smart switch 13.2 that includes a zone-based reclosing controller 14.2. The reclosing controller 14.2 includes a microprocessor, memory and power supply, such as a rechargeable battery or capacitor bank that remains charged with a small solar panel, a small wind generator, a small fuel cell, or power harvested from the power line controlled by the recloser so that the recloser can operate when the power line experiences an outage. Other types of power supplies may be employed as a matter of design choice, such as a 120V circuit connected to a power supply other than the power line controlled by the recloser, long-life non-rechargeable batteries, and so forth. The reclosing controller 14.2 is programmable with different timing and distance-based zone operating protocols. Since the distance of the STU 16 to other switches typically varies in different directions along the power line from the recloser, the reclosing controller 14.2 can be programmed with different timing and distance-based zone operating protocols for different directions from the recloser.

FIG. 2 is a logic flow diagram 20 for provisioning an example smart grid system. In step 21, the system operator configures each tie-switch to close after a predetermined delay following detection of a loss of power on either side of the switch (Tie-Switch Close Time). The tie-switches are also programmed to operate as Type-A or Type-B reclosers once closed. Step 21 is followed by step 22, in which the system operator selects and configures M=N−1 (N−2 in some cases) sectionalizers as Type-B sectionalizer switches, and selects and configures the remaining sectionalizers as Type-A sectionalizer switches, where N is equal to the number of switches connected to one node that can lead to at least one alternative source through the circuit connectivity, including going across open and closed switches. Step 22 is followed by step 23, in which the system operator configures each Type-A sectionalizer switch to automatically reclose when one side is re-energized for a preconfigured time (Sectionalizer Reclose Time), without programming these switches for automatic opening. Step 23 is followed by step 24, in which the system operator configures each Type-B sectionalizer switch to automatically reclose when one side is re-energized for a preconfigured time (Sectionalizer Reclose Time), and also to automatically open when it is closed and power is lost for a preconfigured time (Type-B Power Loss Open Time). The Type-B switches are also programmed to operate a smart tie-switches when closed. Step 24 is followed by step 25, in which the system operator configures each tie-switch, Type-A and Type-B sectionalizer switch with two sets of zone definitions, one for each fault direction. Multiple tie-switches and Type-B sectionalizers connected to the same circuit are also programmed with staggered timing to prevent connectivity loops.

Figure 3:
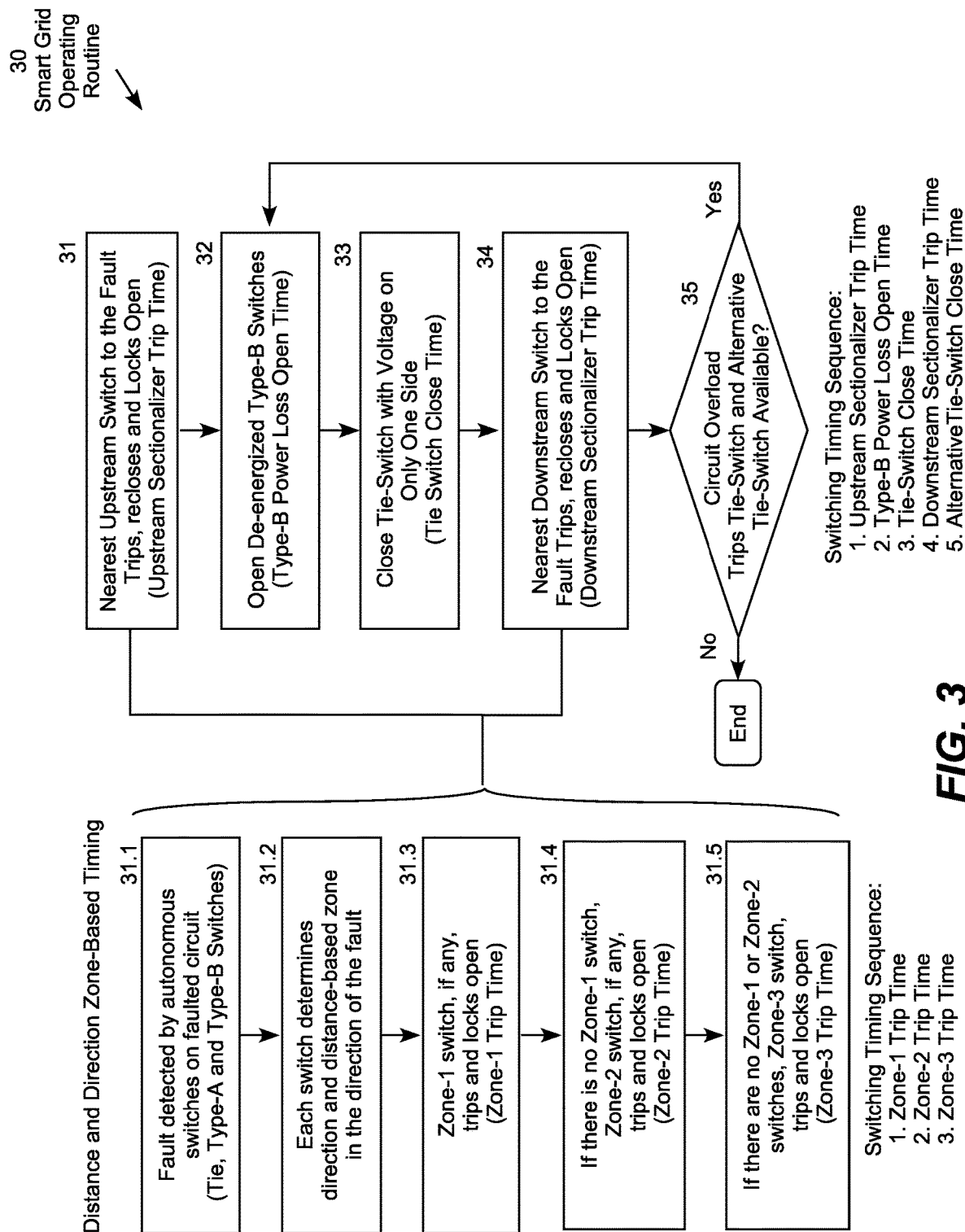
FIG. 3 is a logic flow diagram for operating the smart grid system.

FIG. 3 is a logic flow diagram 30 for operating a smart recloser with direction-to-fault and zone-based distance-to-fault timing in the example smart grid system. In step 31, when a fault occurs the nearest upstream (Zone-1) switch to the fault trips and locks open to isolate the fault. If two consecutive sectionalizers on the upstream side of the fault trip due to the limited accuracy of distance estimation (i.e., preconfigured distance zone overlap, see FIG. 24), the downstream sectionalizer loses power due to operation of the upstream sectionalizer and, therefore, will remain open without reclosing. The upstream sectionalizer will therefore reclose successfully because it will be isolated from the fault by the now open downstream sectionalizer. The end result will be isolation of the fault on the upstream side by the nearest recloser to the fault (Upstream Sectionalizer Trip Time).

Step 31 includes autonomous direction-to-fault and zone-based distance-to-fault timing operation as further detailed in steps 31.1-31.5, which are performed by smart tie-switches when they are closed, Type-A and Type-B sectionalizer switches. In step 31.1, the smart recloser detects a fault. Step 31.1 is followed by step 31.2, in which the smart recloser determines the direction to the fault and the distance-based zone for the fault in that direction (see also FIGS. 23A-23D). Step 31.2 is followed by step 31.3, in which the smart recloser trips and locks open if it has determined that it is in Zone-1 (Zone-1 Trip Time). In other words, the switch that determines that it is the closest switch to the fault (i.e., the Zone-1 switch) may reclose to attempt to clear the fault in accordance with its programed logic, and locks open. If the fault persists because there is no Zone-1 recloser, step 31.3 is followed by step 31.4, in which the Zone-2 switch may reclose to attempt to clear the fault in accordance with its programed logic, and locks open, where the Zone-2 Trip Time is longer than the Zone-1 Trip Time. In other words, the next closest (Zone-2) switch to the fault on the upstream side trips and locks open if there is no Zone-1 switch to respond to the fault. If the fault persists because there is no Zone-1 or Zone-2 switch to respond to the fault, step 31.4 is followed by step 31.5, in which the Zone-3 smart recloser trips and locks open, where the Zone-3 Trip Time is longer than the Zone-2 Trip Time. In other words, the next closest (Zone-3) switch to the fault trips and locks open if there are no Zone-1 or Zone-3 switches to respond to the fault. Additional zones can be defined if desired, but three zones have been found to be sufficient for D-FDIR operation in most practical situations.

Step 31 is followed by step 32, in which the Type-B sectionalizers that are deenergized (i.e., no voltage) on both sides of the switch automatically open (Type-B Power Loss Open Time), where the Type-B Power Loss Open Time is longer than the Zone-3 Trip Time to ensure that step 31 has completed prior to opening the deenergized Type-B switches. Step 32 is followed by step 33, in which the tie-switches with voltage on only one side automatically close (Tie-switch Close Time), where the Tie-switch Close Time is longer than the Type-B Power Loss Open Time to ensure that step 32 has completed prior to closing the tie-switches. Step 33 may occur multiple times to sequentially close the one-side-hot tie-switches in a staggered manner to effectively back-feed those sections of the circuit that can be served by one or more adjacent feeders without causing a circuit overload. Step 33 is followed by step 34, in which the nearest downstream (Zone-1) switch to the fault trips and locks open to isolate the fault. If two consecutive sectionalizers on the downstream side of the fault trip due to the limited accuracy of distance estimation (i.e., preconfigured distance zone overlap, see FIG. 24), the upstream sectionalizer loses power due to operation of the downstream sectionalizer and, therefore, will remain open without reclosing. The downstream sectionalizer will therefore reclose successfully because it will be isolated from the fault by the now open upstream sectionalizer. The end result will be isolation of the fault on the upstream side by the nearest recloser to the fault. As in step 31, step 34 uses autonomous direction-to-fault and zone-based distance-to-fault timing operation select the nearest Zone-1, Zone-2 or Zone-3 switch on the downstream side (Downstream Sectionalizer Trip Time).

Step 34 is followed by step 35, in which the tie-switch (or another switch) trips and locks open due to an overload condition and another tie-switch is available to provide an alternative back-feed path for the downstream side of the faulted circuit. If the tie-switch tripped and locked open due to an overload condition and another tie-switch is available to provide an alternative back-feed path, the "yes" branch is followed to step 32, in which the other Type-B switch on the downstream side loses power and opens. Step 32 is followed by step 33, in which the alternative tie-switch closes and the procedure repeats for the alternative tie-switch. If the alternative tie-switch does not overload or if there are no alternative tie-switches available, the "no" branch is followed from step 35 to the end step. Routine 30 operates properly with the following switch timing Sequence from shortest to longest: (1) Upstream Sectionalizer Trip Time, (2) Type-B Power Loss Open Time, (3) Tie-switch Close Time, (4) Downstream Sectionalizer Trip Time, and (5) Alternative Tie-Switch Close Time.

Figure 4:
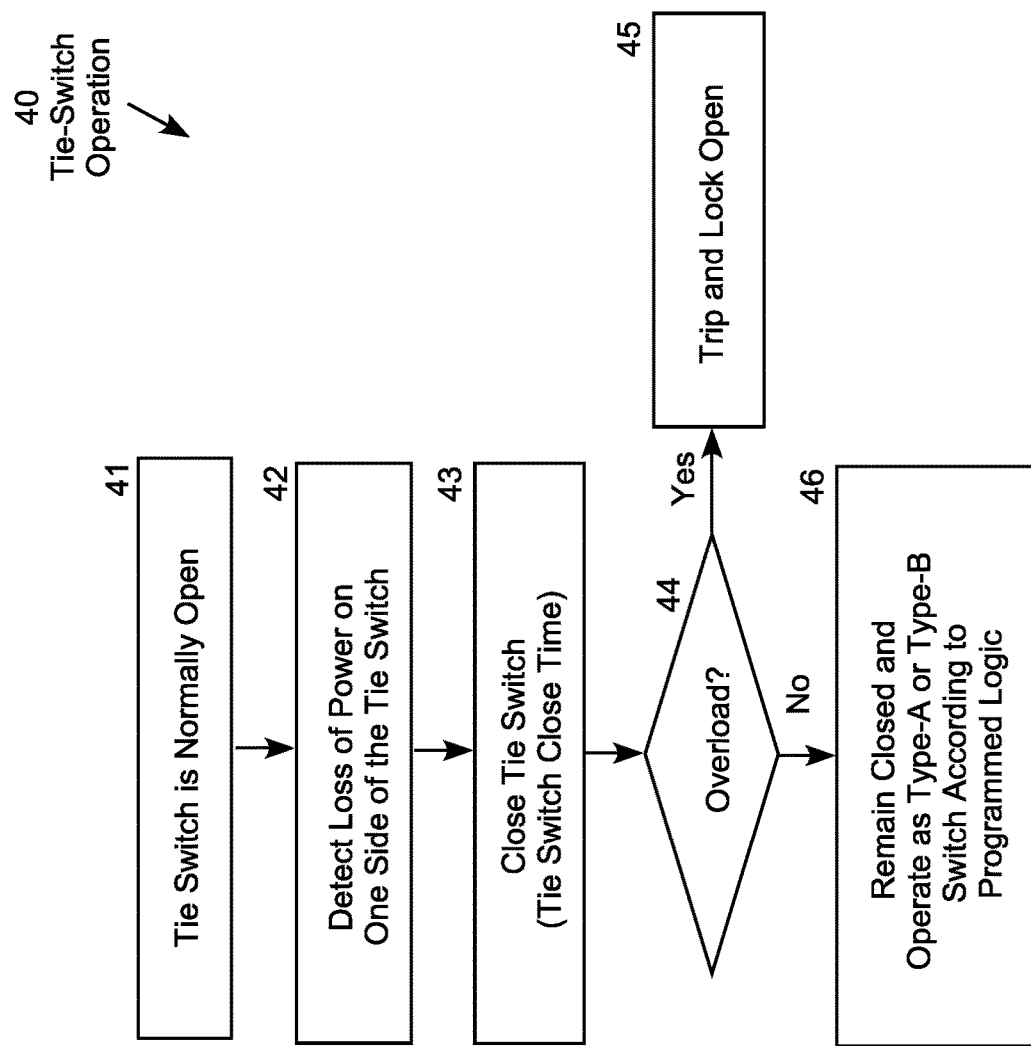
FIG. 4 is a logic flow diagram for operating a tie-switch in the smart grid system.

FIG. 4 is a logic flow diagram 40 for operating a tie-switch in the example smart grid system. In step 41, the tie-switch is normally open. Step 41 is followed by step 42, in which the tie-switch detects as loss of power (voltage) on one side of the switch. Step 42 is followed by step 43, in which the tie-switch closes (Tie-switch Close Time), where the Tie-switch Close Time occurs after Type-B Power Loss Open Time. Step 43 is followed by step 44, in which the tie-switch determines whether back-feeding the non-faulted downstream portion of the faulted circuit causes an overload condition (e.g., the current through the tie-switch exceeds a predefined percentage of the rated circuit current). If an overload condition has occurred, the "yes" branch is followed to step 45 in which the tie-switch trips and locks open. If an overload condition has not occurred, the "no" branch is followed to step 46 in which the tie-switch remains closed and operates as a Type-A or Type-B smart switch according to its programmed logic.

Figure 5:
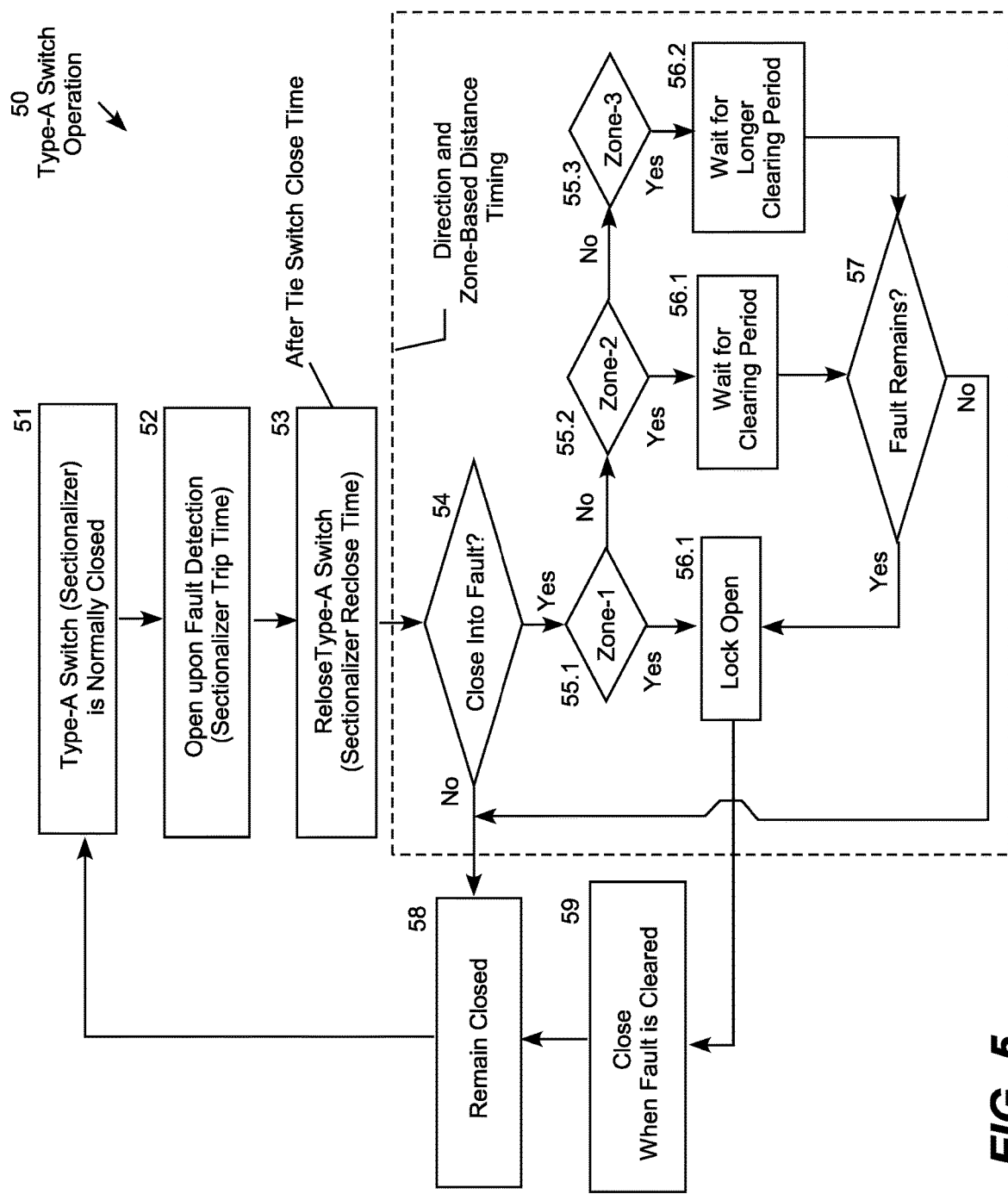
FIG. 5 is a logic flow diagram for operating a Type-A sectionalizer in the smart grid system.

FIG. 5 is a logic flow diagram 50 for operating a Type-A sectionalizer in the example smart grid system. In step 51, the Type-A switch is normally closed. Step 51 is followed by step 52, in which the Type-A switch opens upon fault detection (Sectionalizer Trip Time). Step 52 is followed by step 53, in which the Type-A switch recloses (Sectionalizer Reclose Time). Step 53 is followed by step 54, in which the Type-A switch determines whether it has closed into the fault. If the Type-A switch has closed into the fault, the "yes" branch is followed to step 55.1 in which the Type-A switch determines whether it is in Zone-1 for the fault. If the Type-A switch is in Zone-1 for the fault, the "yes" branch is followed to step 56.1 in which the Type-A switch locks open. If the Type-A switch is not Zone-1 for the fault, the "no" branch is followed to step 55.2 in which the Type-A switch determines whether it is in Zone-2 for the fault. If the Type-A switch is in Zone-2 for the fault, the "yes" branch is followed to step 56.2 in which the Type-A switch waits for a (first) fault clearing period. If the Type-A switch is not Zone-2 for the fault, the "no" branch is followed to step 55.3 in which the Type-A switch determines whether it is in Zone-3 for the fault. If the Type-A switch is in Zone-3 for the fault, the "yes" branch is followed to step 56.3 in which the Type-A switch waits for a longer (second) fault clearing period. Steps 56.1, 56.2 and 56.3 are followed by step 57 in which the Type-A switch determines whether the fault still persists. If the fault still persists, the "yes" branch is followed to step 56.1 in which the Type-A switch locks open. If the fault has cleared, the "no" branch is followed to step 58 in which the Type-A switch remains closed.

Referring again to step 54, if the Type-A switch does not close into the fault, the "no" branch is followed to step 58, in which the Type-A switch remains closed. In addition, step 56.1 is followed by step 59, in which the Type-A switch closes when it detects that the fault has cleared. In different embodiments, this step may be performed automatically, controlled remotely by radio (e.g., SCADA), or performed manually. Step 59 is followed by step 58, in which the Type-A switch remains closed. Step 58 is followed by step 51, in which the Type-A switch has returned to its normally-closed position.

Figure 6:
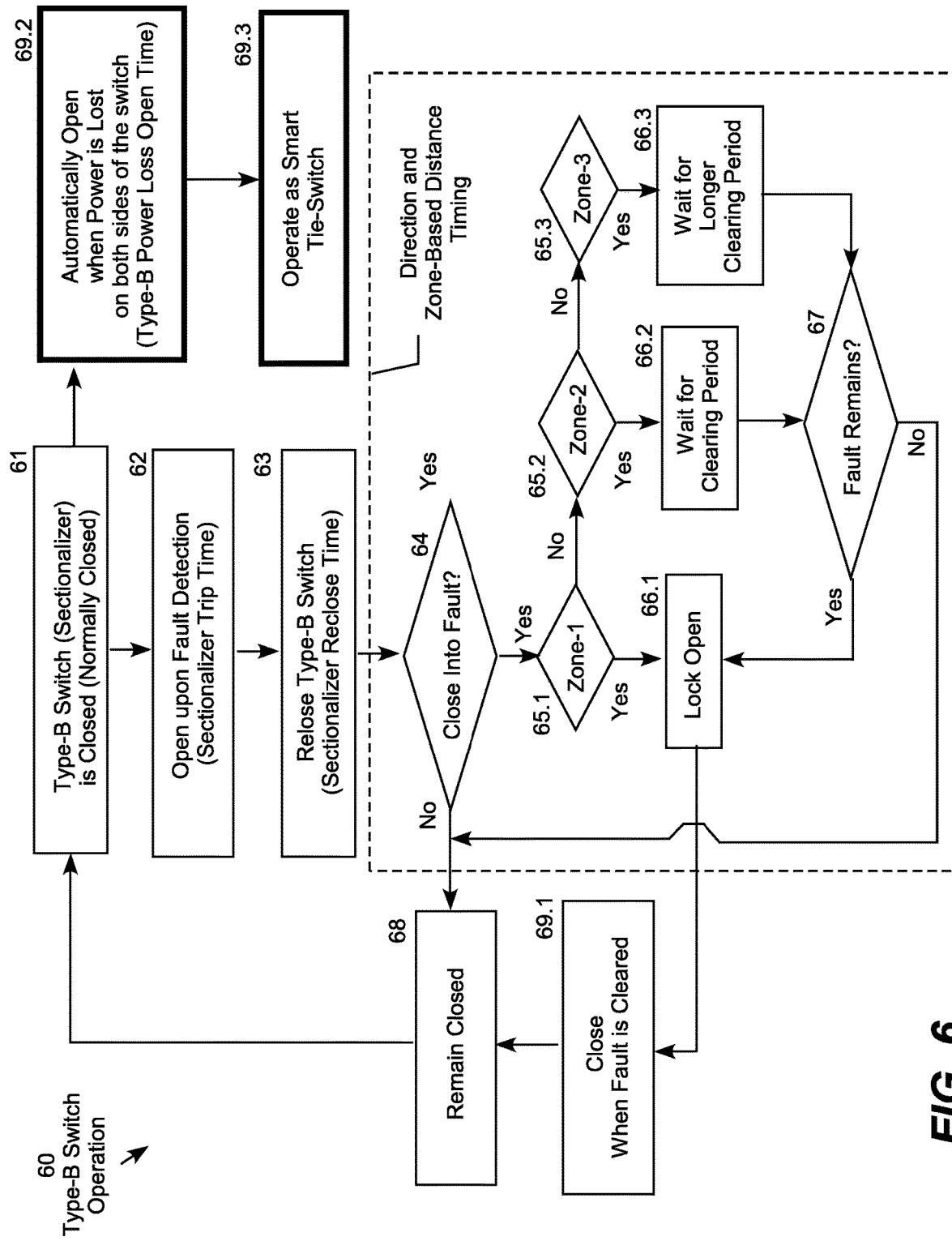
FIG. 6 is a logic flow diagram for operating a Type-B sectionalizer in the smart grid system.

FIG. 6 is a logic flow diagram 60 for operating a Type-B sectionalizer switch in the example smart grid system. In step 61, the Type-B switch is normally closed. Step 61 is followed by step 62, in which the Type-B switch opens upon fault detection (Sectionalizer Trip Time). Step 62 is followed by step 63, in which the Type-B switch recloses (Sectionalizer Reclose Time). Step 63 is followed by step 64, in which the Type-B switch determines whether it has closed into the fault. If the Type-B switch has closed into the fault, the "yes" branch is followed to step 65.1 in which the Type-B switch determines whether it is in Zone-1 for the fault. If the Type-B switch is in Zone-1 for the fault, the "yes" branch is followed to step 66.1 in which the Type-B switch locks open. If the Type-B switch is not Zone-1 for the fault, the "no" branch is followed to step 65.2 in which the Type-B switch determines whether it is in Zone-2 for the fault. If the Type-B switch is in Zone-2 for the fault, the "yes" branch is followed to step 66.2 in which the Type-B switch waits for a (first) fault clearing period. If the Type-B switch is not Zone-2 for the fault, the "no" branch is followed to step 65.3 in which the Type-B switch determines whether it is in Zone-3 for the fault. If the Type-B switch is in Zone-3 for the fault, the "yes" branch is followed to step 66.3 in which the Type-B switch waits for a longer (second) fault clearing period. Steps 66.1, 66.2 and 66.3 are followed by step 67 in which the Type-B switch determines whether the fault still persists. If the fault still persists, the "yes" branch is followed to step 66.1 in which the Type-B switch locks open. If the fault has cleared, the "no" branch is followed to step 68 in which the Type-B switch remains closed.

Referring again to step 64, if the Type-B switch does not close into the fault, the "no"" branch is followed to step 58, in which the Type-B switch remains closed. In addition, step 66.1 is followed by step 69.1, in which the Type-B switch recloses when it detects that the fault has cleared. In different embodiments, this step may be performed automatically, controlled remotely by radio (e.g., SCADA), or performed manually. Step 69.1 is followed by step 68, in which the Type-B switch remains closed. Step 68 is followed by step 61, in which the Type-B switch has returned to its normally-closed position. To this point, the operation of the Type-B switch is the same as the Type-A switch. The difference occurs in step 69.2, in which the Type-B switch automatically opens when it detects that power (voltage) had been lost on both sides of the switch for a preconfigured time (Type-B Power Loss Open Time). Once the Type-B switch is is open, step 69.2 is followed by step 69.3, in which the Type-B switch operates as a smart tie-switch (see FIG. 4) by automatically reclosing when it detects voltage on only one side of the switch for a preconfigured time (Type-B Reclose Time). In other words, the Type-B switch automatically opens when it detects a loss of voltage on both sides of the switch of the switch for a predetermined time period, automatically closes when it detects voltage on only one side of the switch for a predetermined time period, remains closed so long it detects voltage on both sides of the switch of the switch without detecting a fault condition, and trips and recloses with direction-to-fault and zone-based distance-to-fault logic when it detects a fault.

Figure 7:
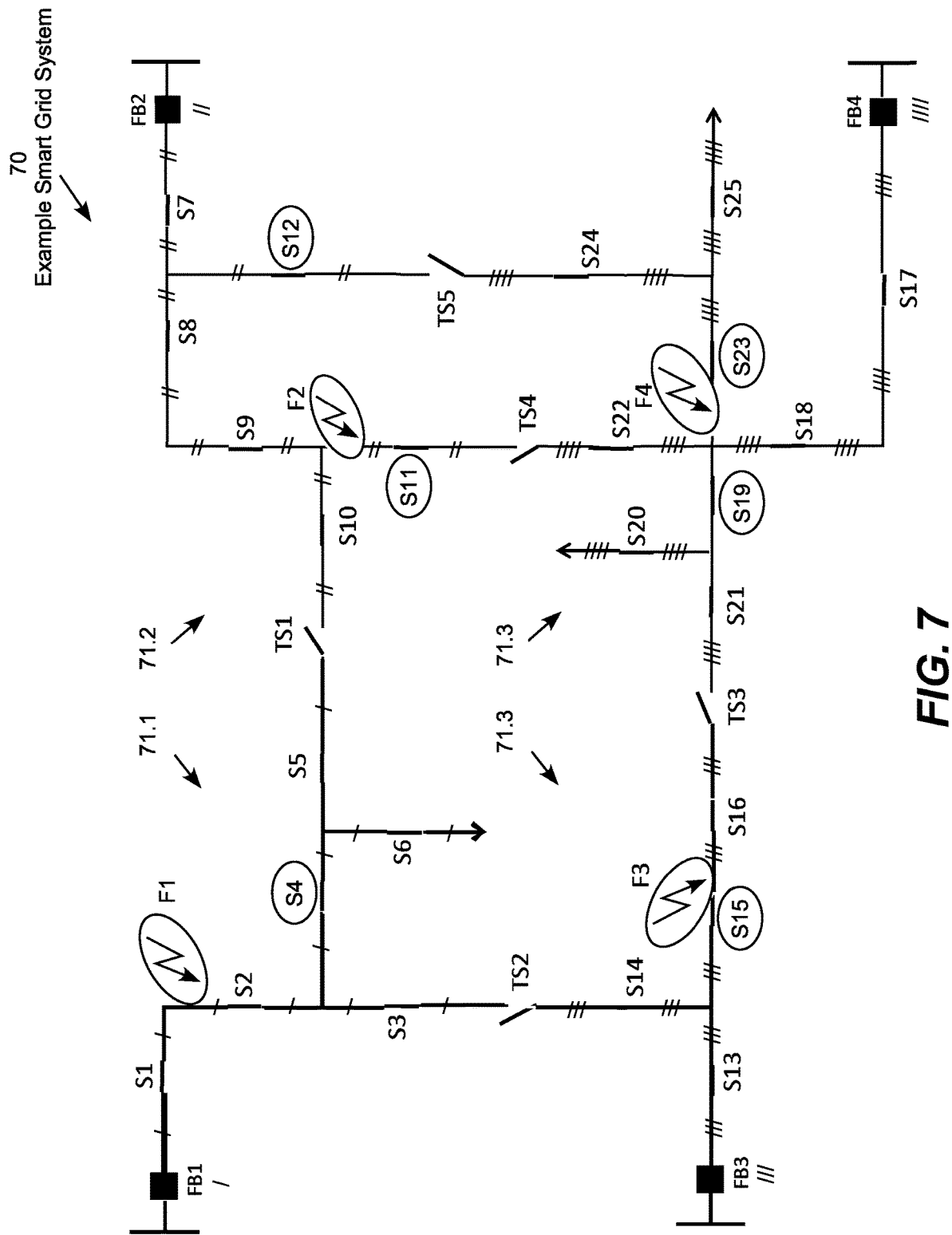
FIG. 7 is a one-line circuit diagram of an example smart grid system.

FIG. 7 is a one-line circuit diagram 70 of an example electric distribution circuit, which will be used to illustrate several examples of autonomous fault isolation without relying on communications with a central controller or between the switch points. The example circuit 70 includes four circuit portions 71.1-71.4 supplied by four substation feeder breakers FB1-FB4, respectively The portion of the example circuit 70 served by FB1 is denoted by a single hash (/), the portion of the example circuit served by FB2 is denoted by a double hash (//), the portion of the example circuit served by FB3 is denoted by a triple hash (///), and the portion of the example circuit served by FB4 is denoted by a quadruple hash (////). The circuit portions 71.1-71.4 are connected by normally-open tie-switches T1-T5, which provide alternative back-feed paths to different feeder breakers as alternative power sources when faults occur. In the following fault scenarios represented by the faults F1-F4, operation of the tie-switches T1-T5 will cause certain circuit sections to be served by different feeder breakers, which will be denoted by changes in the hash symbols associated with those circuit sections. Type-B sectionalizers are shown in circles, while Type-A sectionalizers are not encircled.

FIG. 7 shows the normal circuit condition in which the tie-switches T1-T5 are in their normally-open positions. The circuit portion 71.1 served by FB1 includes sectionalizer switches S1-S6 where only switch S4 is a Type-B switch. The circuit portion 71.2 served by FB2 includes sectionalizer switches S7-S12 where only switches S10 and S11 are Type-B switches. The circuit portion 71.3 served by FB3 includes sectionalizer switches S13-S16 where only switch S15 is a Type-B switch. The circuit portion 71.4 served by FB4 includes sectionalizer switches S17-S25 where only switches S19 and S23 are Type-B switches.

Figure 8:
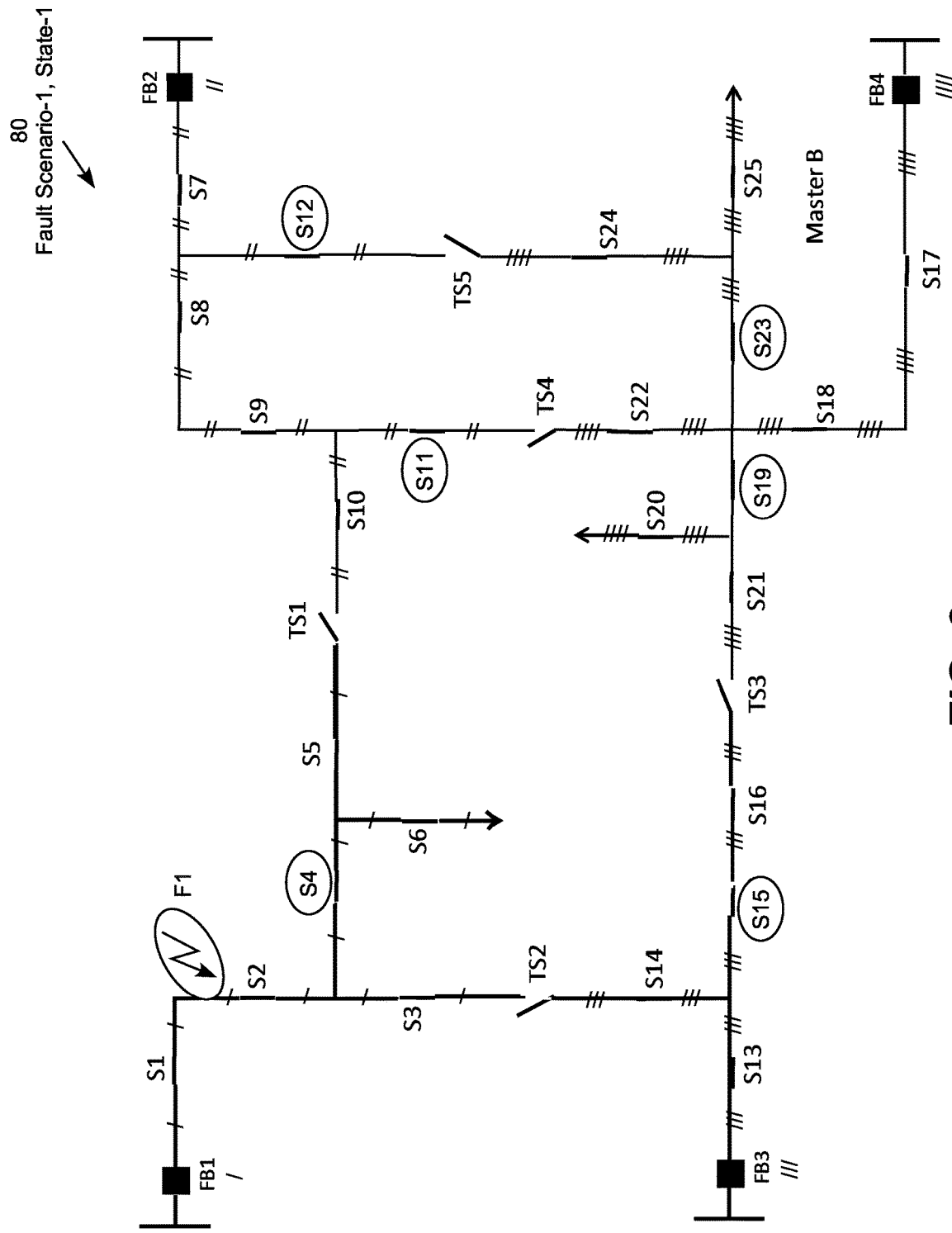
FIG. 8 is a one-line circuit diagram of the example smart grid system demonstrating state 1 of a fault scenario 1.
Figure 9:
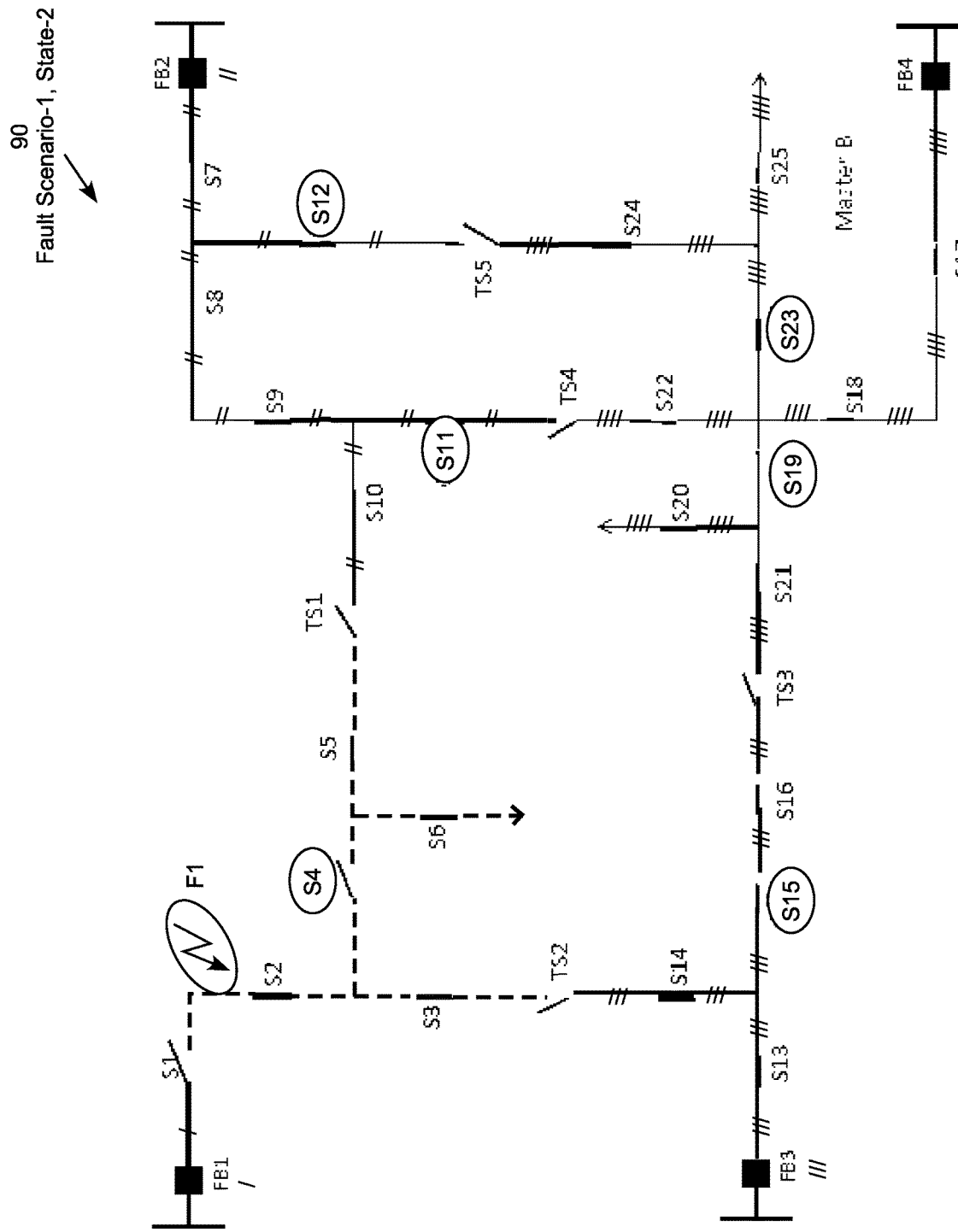
FIG. 9 is a one-line circuit diagram of the example smart grid system demonstrating state 2 of the fault scenario 1.
Figure 10:
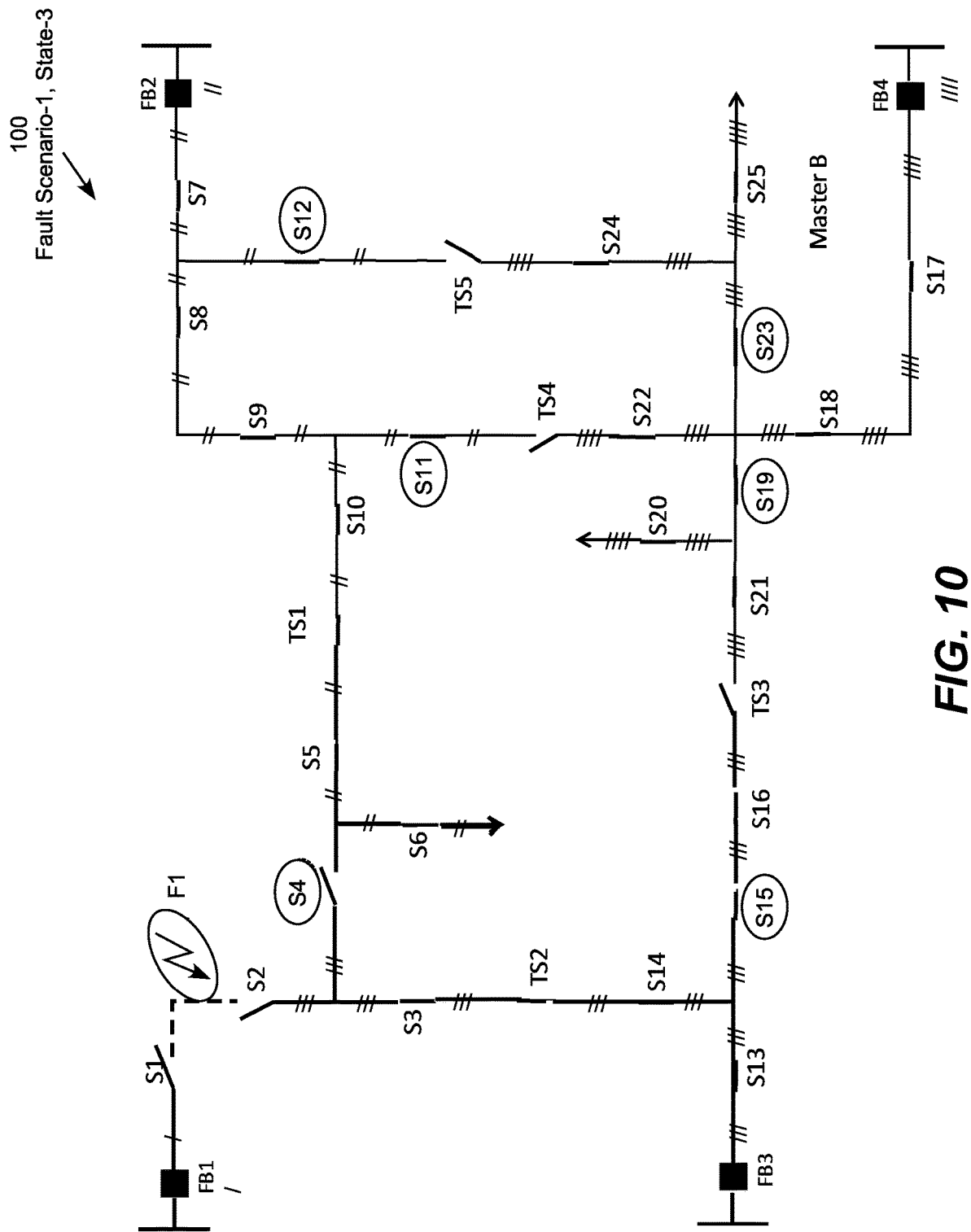
FIG. 10 is a one-line circuit diagram of the example smart grid system demonstrating state 3 of the fault scenario 1.

FIG. 8 is a one-line circuit diagram 80 of the example smart grid system demonstrating the normal state 1 for fault scenario 1 indicated as F1. FIG. 9 shows the one-line circuit diagram 90 for state 2, which occurs after the closest upstream (Zone-1) switch S1 trips first, attempts to reclose into the fault, and locks open. This causes all of the other switches downstream from switch S1 to lose power. Since switch S4 is a Type-B sectionalizer that has lost power on both sides, it automatically opens after the Type-B Power Loss Open Time (e.g., 8 seconds). The trip of S1 causes the tie-switches TS1 and TS2 to detect that power has been lost on only one side of the tie-switches. FIG. 10 shows the one-line circuit diagram 100 for state 3, which occurs after TS1 and TS2 close based on their timing configuration (Tie-Switch Close Times). Next, the closest downstream (Zone-1) sectionalizer S2 trips, may attempt to reclose if programmed to do so, and locks open. Type-B sectionalizer S4 remains open because both sides are energized. The end result has the fault F1 optimally isolated between the closest upstream sectionalizer S1 and the closest downstream sectionalizer S2 with portions of the circuit originally served by breaker FB1 back-fed from breakers FB2 and FB3 through tie-switches TS1 and TS2, which are now closed.

Figure 11:
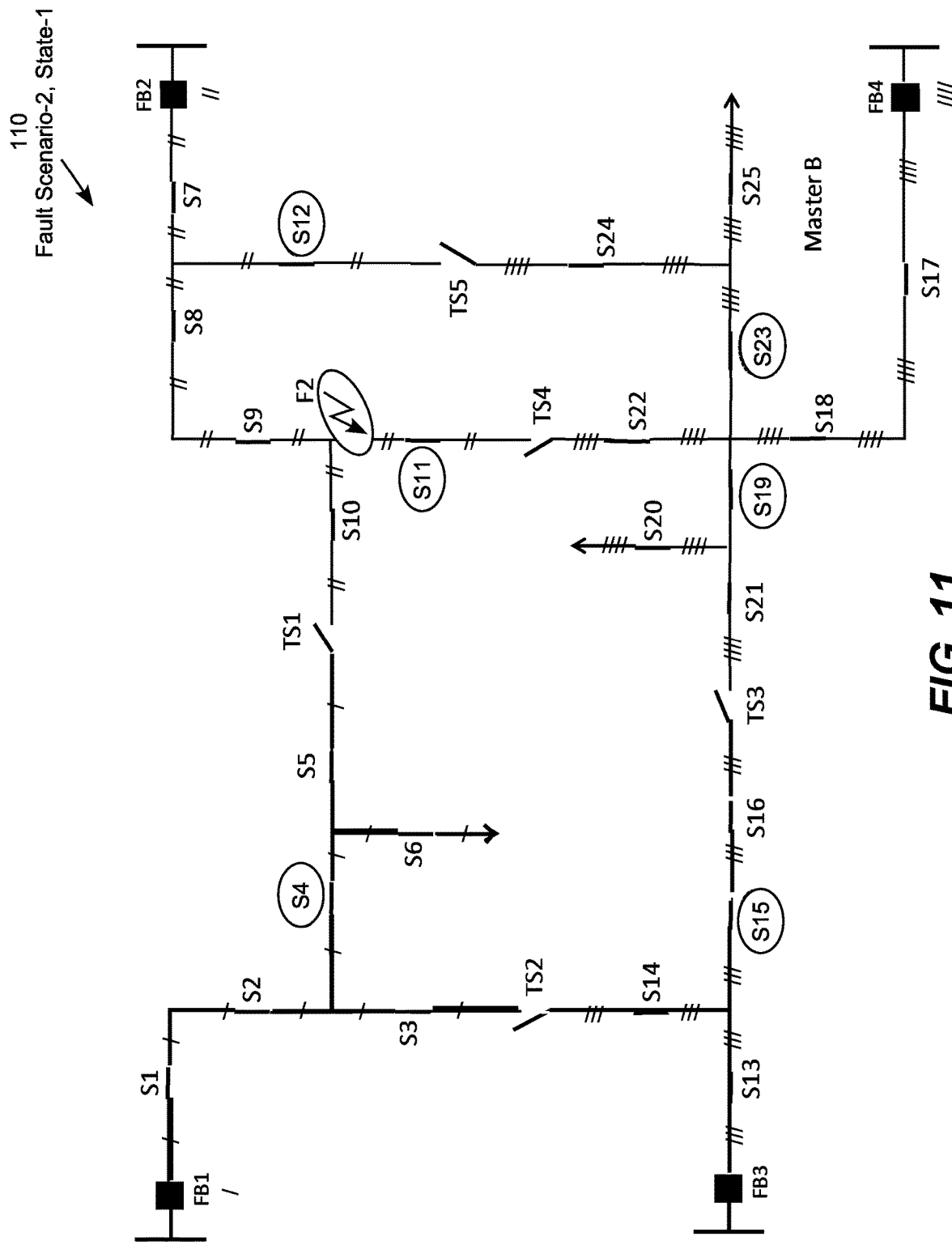
FIG. 11 is a one-line circuit diagram of the smart grid system demonstrating state 1 of a fault scenario 2.
Figure 12:
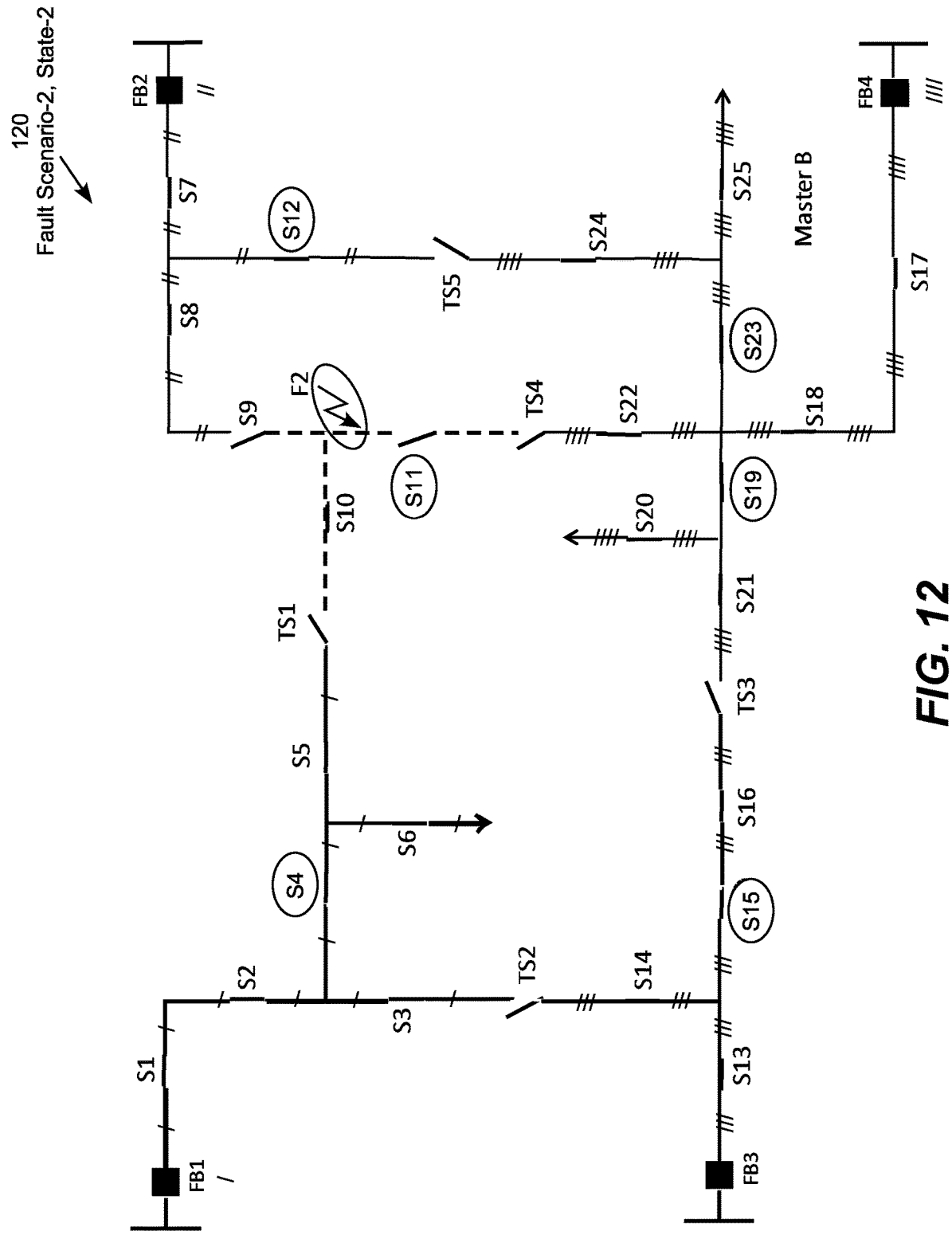
FIG. 12 is a one-line circuit diagram of the example smart grid system demonstrating state 2 of the fault scenario 2.
Figure 13:
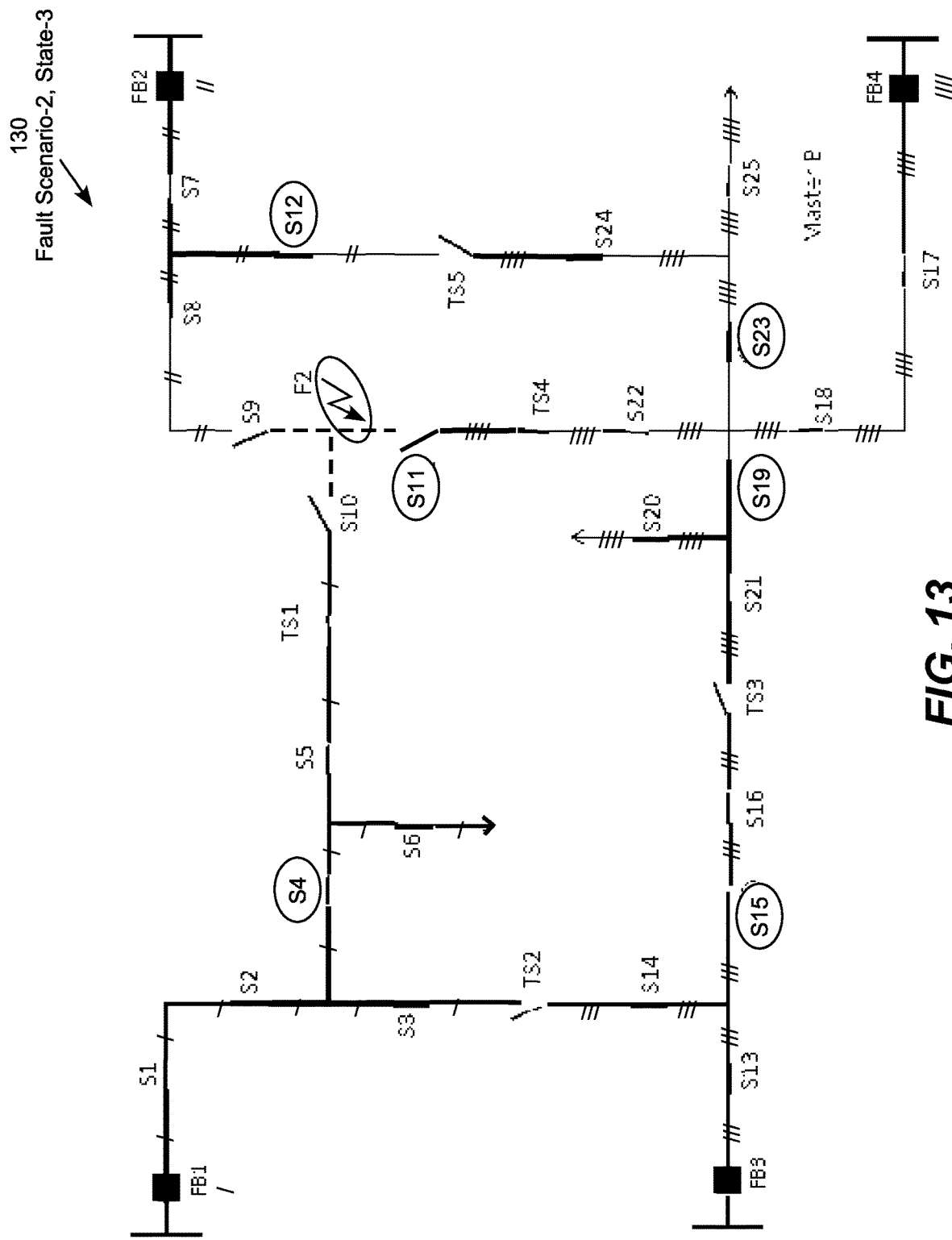
FIG. 13 is a one-line circuit diagram of the example smart grid system demonstrating state 3 of the fault scenario 2.

FIG. 11 is a one-line circuit diagram 110 of the example smart grid system demonstrating state 1 of a second fault scenario denoted as F2. FIG. 12 is a one-line circuit diagram 120 for state 2, which occurs after the closest upstream (Zone-1) switch S9 trips first, attempts to reclose into the fault, and locks open. This causes all of the other switches downstream from switch S9 to lose power. This causes the tie-switches TS1 and TS4 to lose power on only one side, which will cause these tie-switches to close based on their timing configuration (Tie-Switch Close Times). Since switch S11 is a Type-B sectionalizer that has lost power on both sides, it automatically opens after the Type-B Power Loss Open Time. FIG. 13 shows the one-line circuit diagram 130 for state 3, which occurs after TS1 and TS4 close based on their timing configuration (Tie-Switch Close Times). Next, the closest downstream (Zone-1) sectionalizer S10 trips, may attempt to reclose if programmed to do so, and locks open. The Type-B sectionalizer S11, which has power on only in side, attempts to close into the fault and locks open. The end result has the fault F2 optimally isolated between the closest upstream sectionalizer S9 and the closest downstream sectionalizers S10 and S11 with portions of the circuit originally served by breaker FB2 back-fed from breakers FB1 and FB4 through tie-switches TS1 and TS4, which are now closed.

Figure 14:
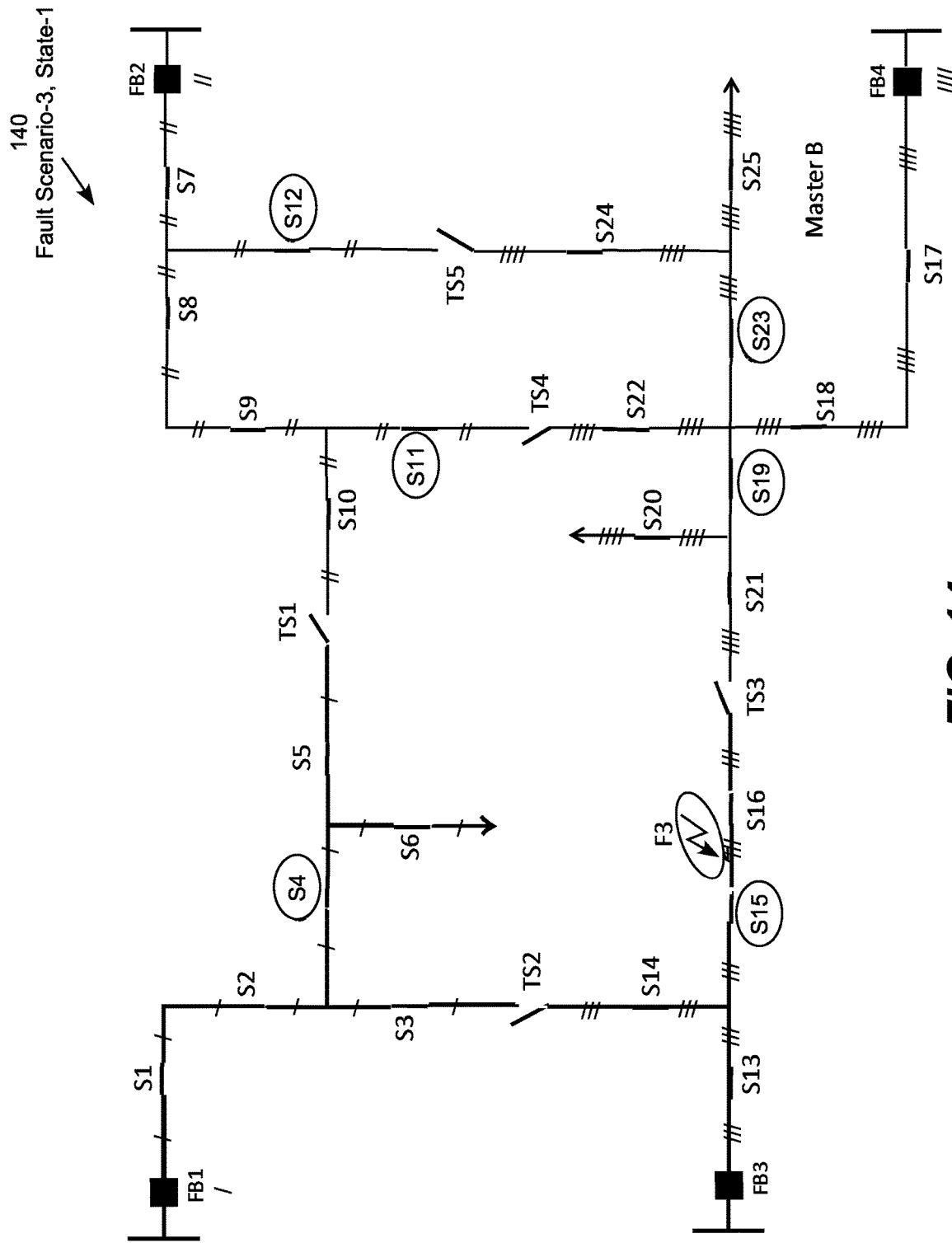
FIG. 14 is a one-line circuit diagram of the example smart grid system demonstrating state 1 of a fault scenario 3.
Figure 15:
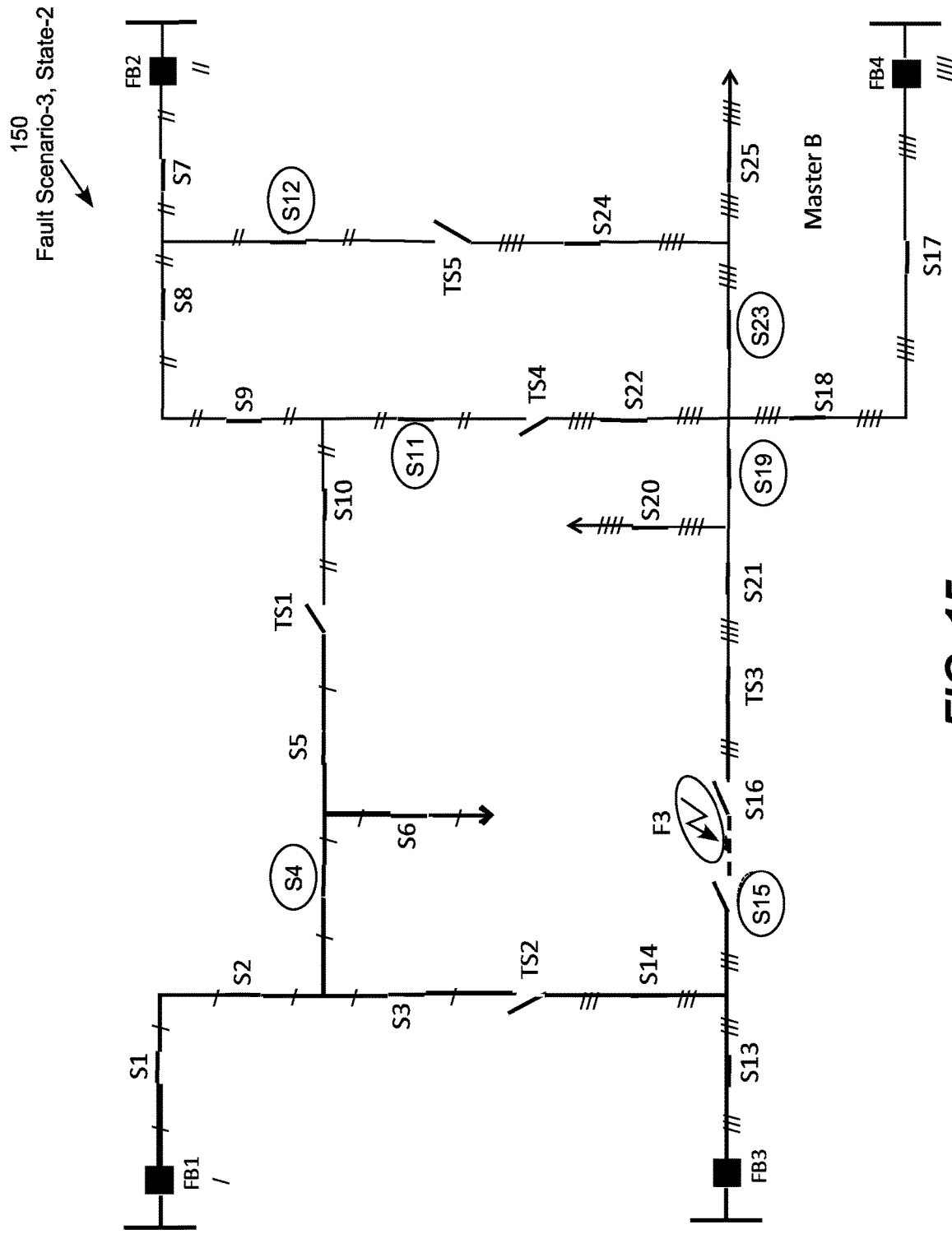
FIG. 15 is a one-line circuit diagram of the example smart grid system demonstrating state 2 of the fault scenario 3.

FIG. 14 is a one-line circuit diagram 140 of the example smart grid system demonstrating state 1 of a third fault scenario denoted as F3. FIG. 15 is a one-line circuit diagram 150 for state 2, which occurs after the closest upstream (Zone-1) sectionalizer S15 trips first, attempts to reclose into the fault, and locks open. This causes all of the other switches downstream from switch S15 to lose power. This causes the tie-switch TS3 to close when it detects that power has been lost on only one side of the tie-switch. Next, closest downstream (Zone-1) sectionalizer S16 trips, may attempt to reclose if programed to do so, and locks open. Type-B sectionalizer S15 remains locked open. The end result has the fault F3 optimally isolated between the closest upstream sectionalizer S15 and the closest downstream sectionalizer S16 with portions of the circuit originally served by breaker FB3 back-fed from breaker FB4 through the tie-switch TS3, which is now closed.

Figure 16:
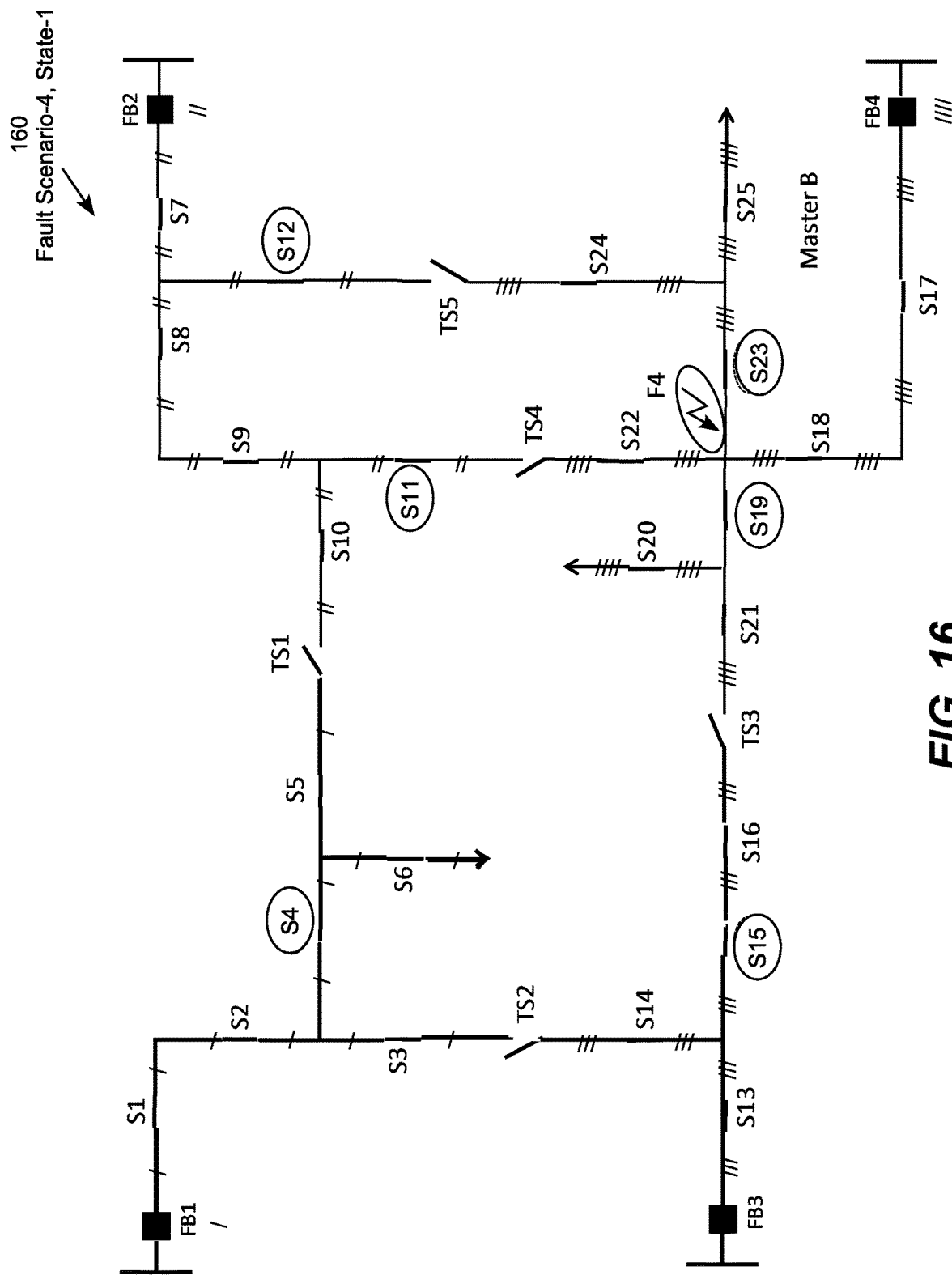
FIG. 16 is a one-line circuit diagram of the example smart grid system demonstrating state 1 of a fault scenario 4.
Figure 17:
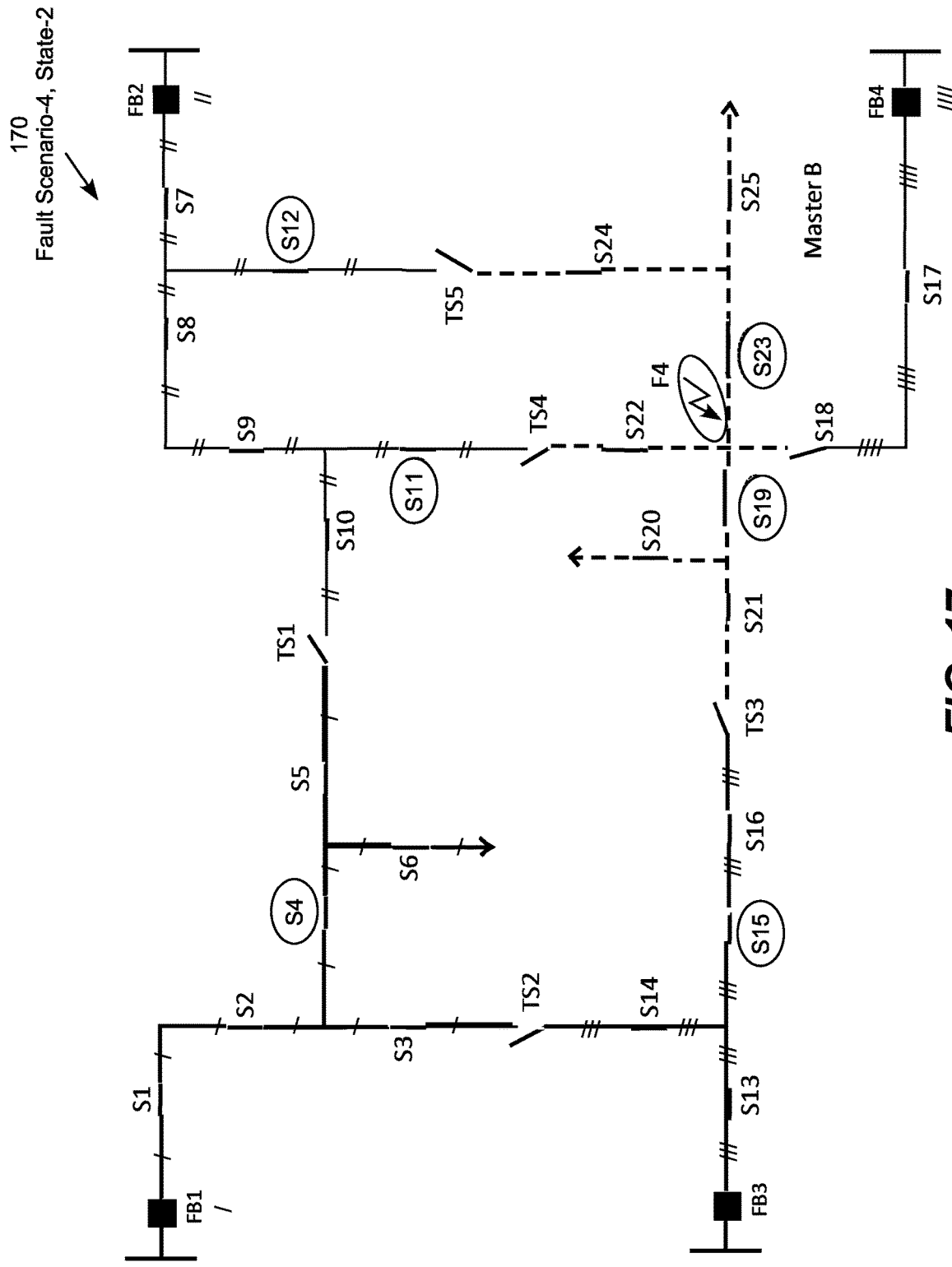
FIG. 17 is a one-line circuit diagram of the example smart grid system demonstrating state 2 of the fault scenario 4.
Figure 18:
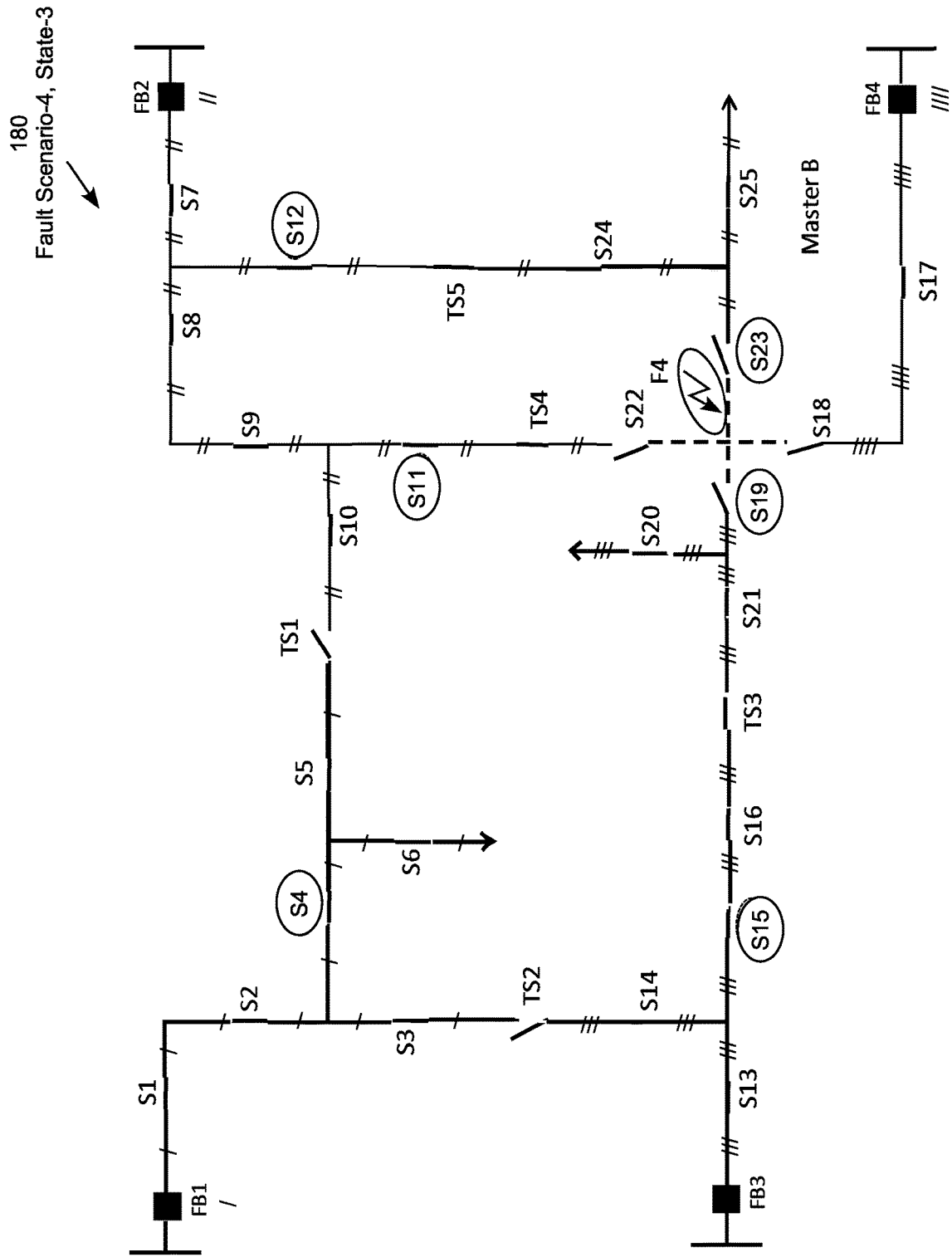
FIG. 18 is a one-line circuit diagram of the example smart grid system demonstrating state 3 of the fault scenario 4.

FIG. 16 is a one-line circuit diagram 160 of the example smart grid system demonstrating state 1 of a fourth fault scenario denoted as F4. FIG. 17 is a one-line circuit diagram 170 for state 2, which occurs after the closest upstream (Zone-1) sectionalizer S18 trips first, attempts to reclose into the fault, and locks open, which causes all of the other switches downstream from switch S18 to lose power. This causes the tie-switches TS3, TS4 and TS5 to detect that power has been lost on one side of the tie-switches. FIG. 18 shows the one-line circuit diagram 180 for state 3. Since switches S19 and S23 are Type-B sectionalizers that have lost power on both sides, they automatically open after their respective Type-B Power Loss Open Times. TS3, TS4 and TS5 then close based on their timing configuration (Tie-Switch Close Times). Next, the closest downstream (Zone-1) sectionalizers S19, S22 and S23 trip, attempt to reclose if programmed to do so, and lock open. The end result has the fault F4 optimally isolated between the closest upstream sectionalizer S18 and the closest downstream sectionalizers S19, S22 and S23 with portions of the circuit originally served by breaker FB4 back-fed from breakers FB1, FB2 and FB2 through tie-switches TS3, TS4 and TS5, which are now closed.

Figure 19:
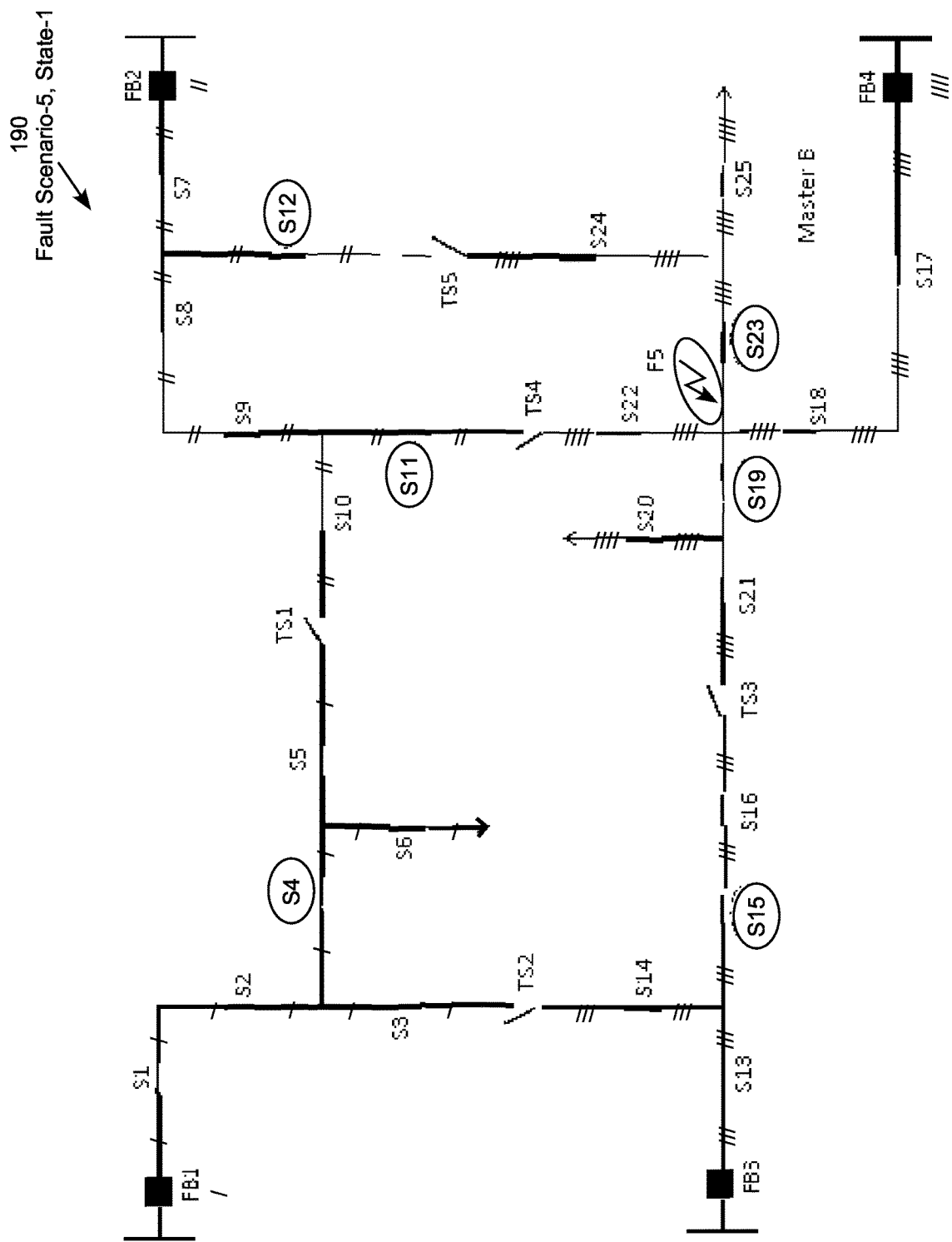
FIG. 19 is a one-line circuit diagram of the example smart grid system demonstrating state 1 of a fault scenario 5.
Figure 20:
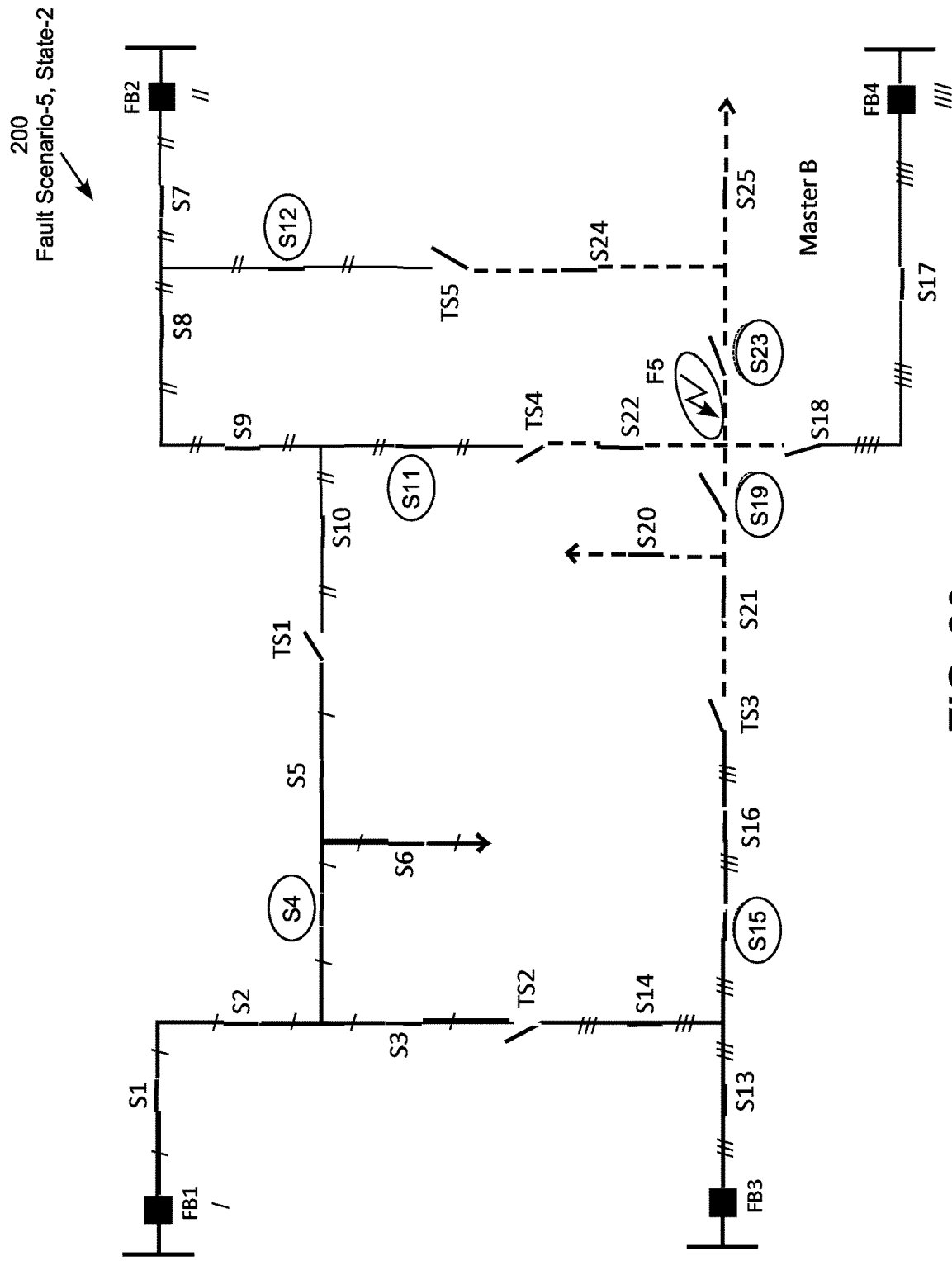
FIG. 20 is a one-line circuit diagram of the example smart grid system demonstrating state 2 of the fault scenario 5.
Figure 21:
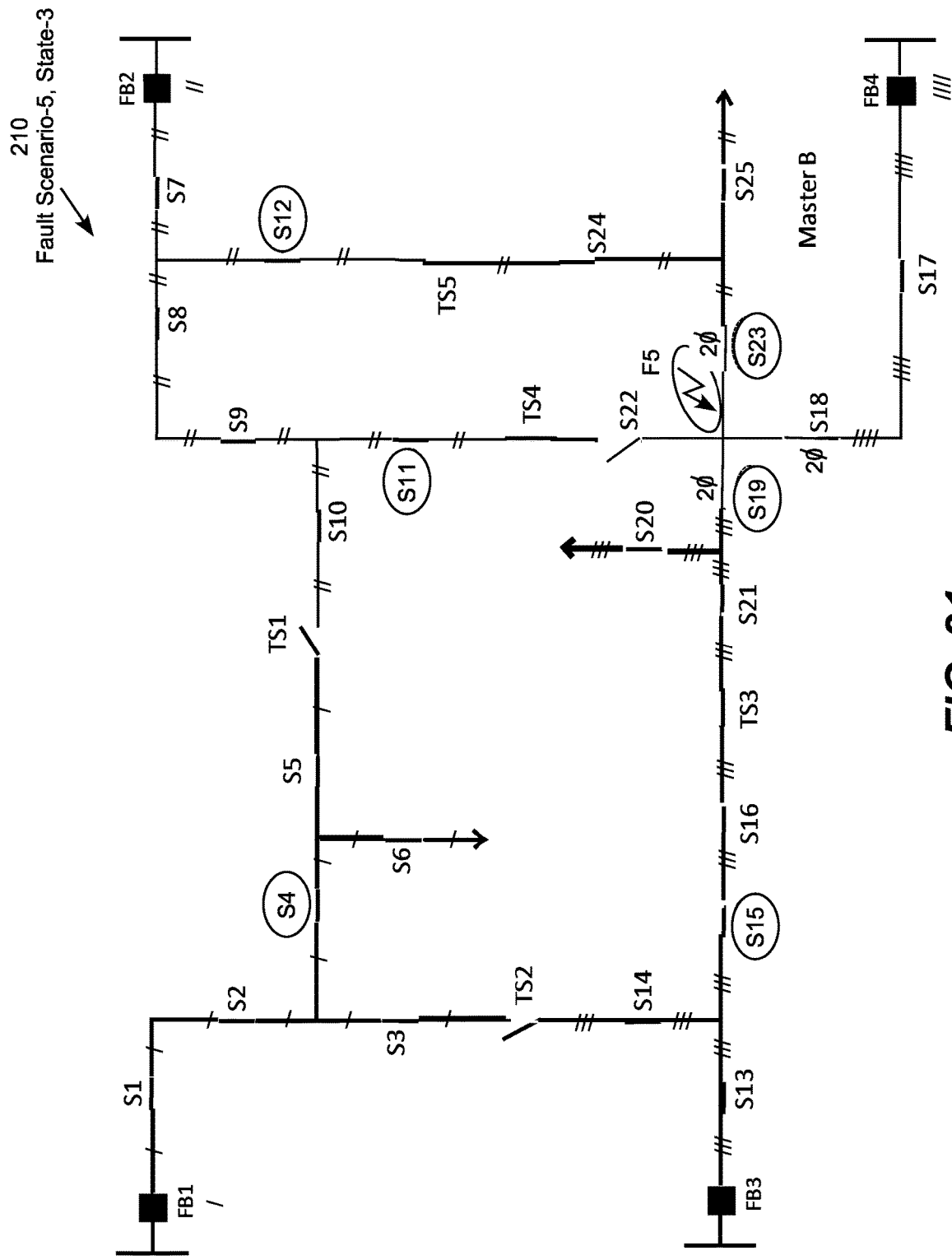
FIG. 21 is a one-line circuit diagram of the example smart grid system demonstrating state 3 of the fault scenario 5.
Figure 22:
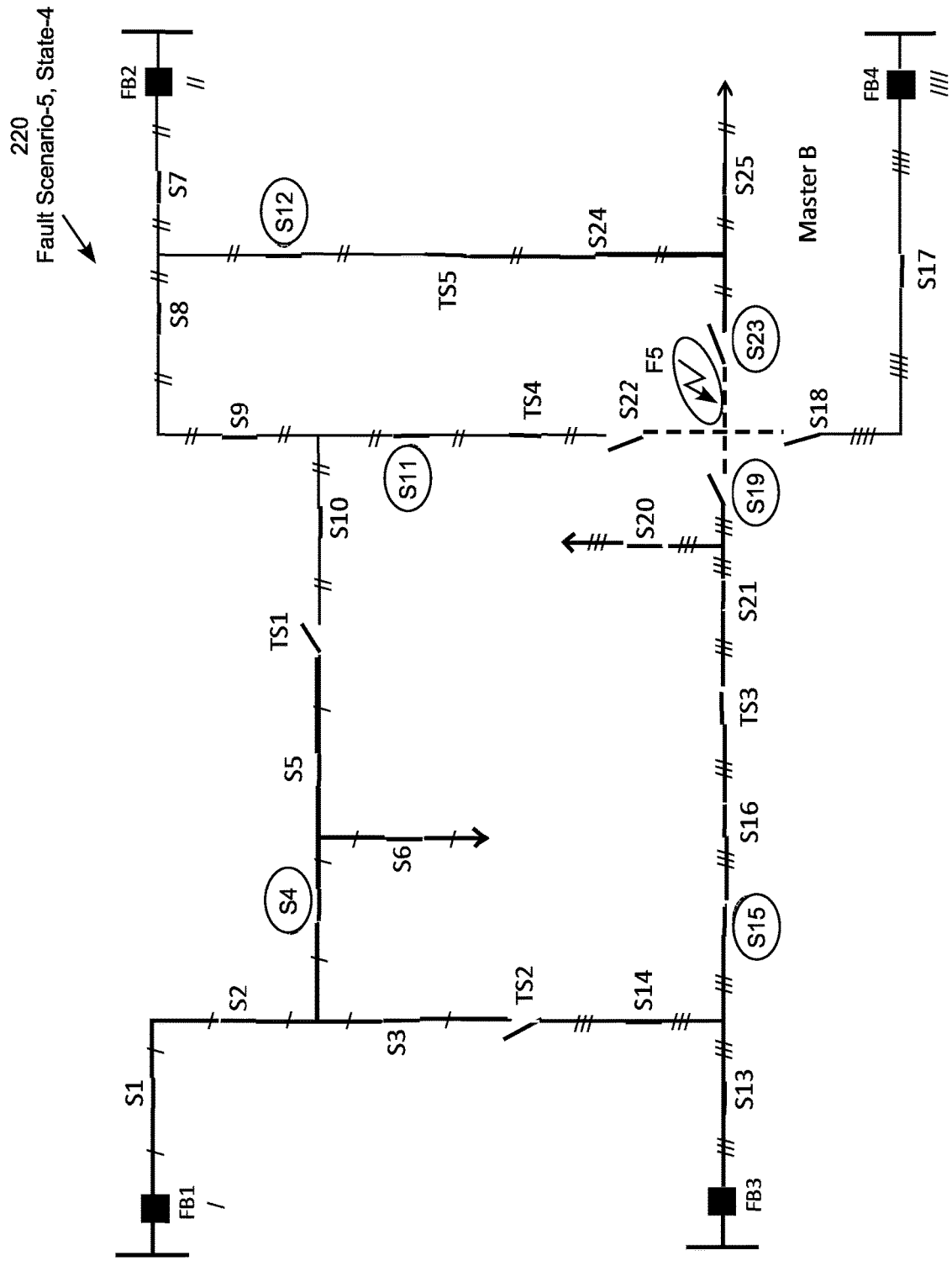
FIG. 22 is a one-line circuit diagram of the example smart grid system demonstrating state 4 of the fault scenario 5.

FIG. 19 is a one-line circuit diagram 190 of the example smart grid system demonstrating state 1 of a fifth fault scenario denoted as F5. Fault F5 occurs in the same location as fault F4 described above, but F5 represents a single-phase fault. FIG. 20 is a one-line circuit diagram 200 for state 2, which occurs after the closest upstream (Zone-1) switch S18 trips the faulted phase first (Zone-1 trip time), attempts to reclose into the fault, and locks open on the faulted phase. This causes all of the other switches downstream from switch S18 to lose power on the faulted phase. Since the Type-B sectionalizers S19 and S23 detect that the faulted phase has very low voltage on one side, they automatically open the faulted phase after their respective Type-B Power Loss Open Times. This causes the tie-switches TS3, TS3 and TS5 to detect that power has been lost on one side of the faulted phase. FIG. 21 shows the one-line circuit diagram 210 for state 3, which occurs after TS3, TS4 and TS5 close for the faulted phase based on their timing configuration (Tie-Switch Close Time). Next, the closest downstream (Zone-1) sectionalizers S19, S22 and S23 trip and lock open the faulted phase. FIG. 22 shows the one-line circuit diagram 220 for state 4, in which the sectionalizers S19, S22 and S23 trip and lock open all three phases after their two-phase operations time out. The end result has all three phases of the fault F5 optimally isolated between the closest upstream (Zone-1) sectionalizer S18 the closest downstream (Zone-1) sectionalizers S19, S22 and S23 with portions of the circuit originally served by breaker FB4 back-fed from breakers FB1, FB2 and FB2 through tie-switches TS3, TS4 and TS5, which are now closed.

FIGS. 23A-23D are graphs and a chart illustrating zone definitions for a portion of an electric power transmission or distribution circuit including four smart switches S1-S4, such as tie-switches, sectionalizers, and STUs. The circuit portion includes a main line section 231, including smart switches S1-S3, which extends from a substation circuit breaker FB1, which may be a radial D-FDIR distribution line connected to a tie-switch or a T-FDIR transmission line connected to another substation circuit breaker. The circuit portion also includes several tapped loads or line sections 232 through 237 spaced along the main line 231. One of the tapped line sections 232 includes a fourth switch S4 spaced apart from the main line 231. The circuit portion also indicates three faults F1 through F3 for the purpose if indicating how those faults fall within the zone definitions of the smart switches S1-S4.

Figure 23B:
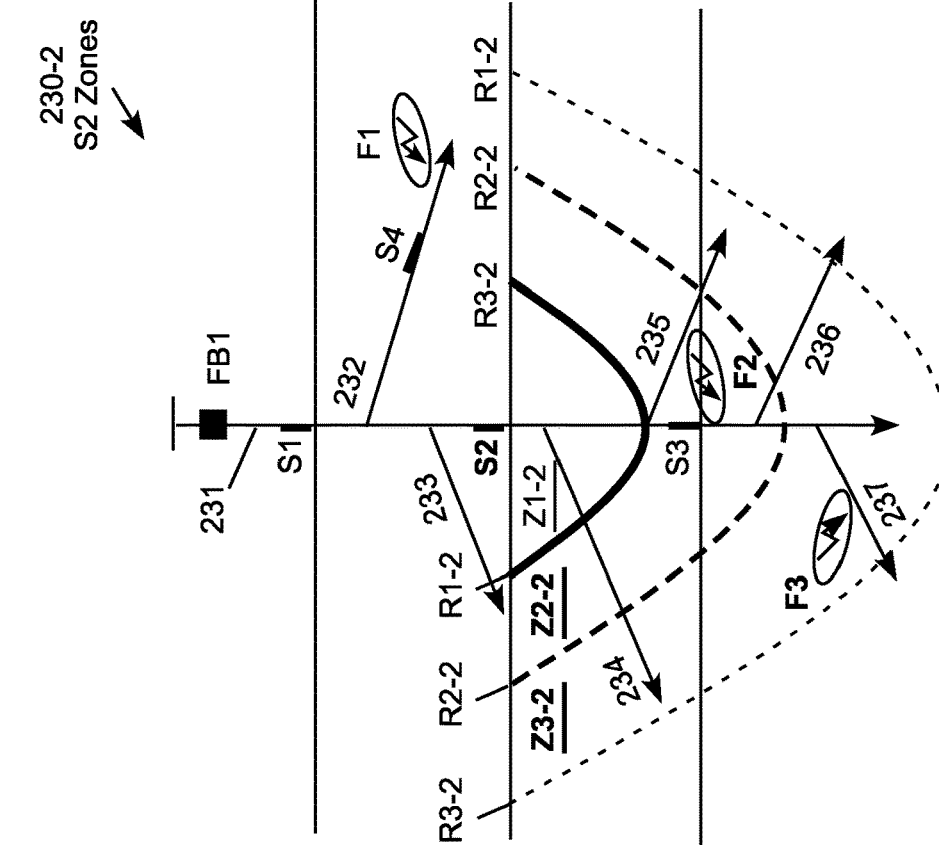
FIG. 23B is a graph illustrating fault zones for a second switch in the zone-based sectionalizing scheme.
Figure 23A:
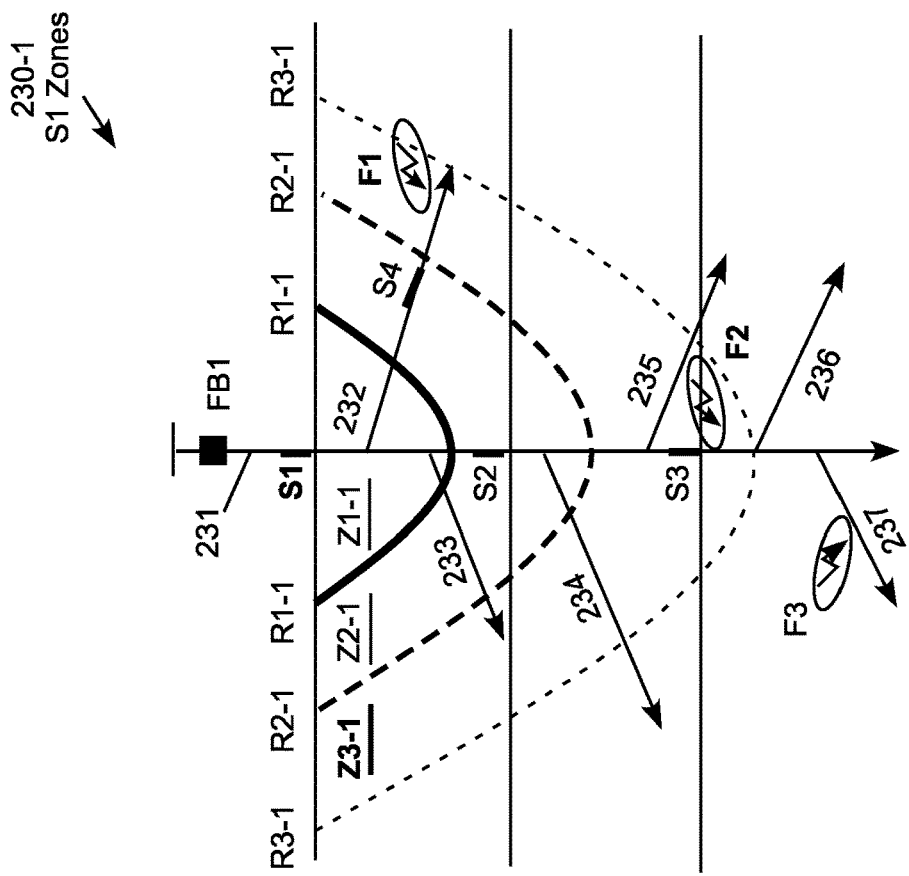
FIG. 23A is a graph illustrating fault zones for a first switch in a zone-based sectionalizing scheme.

FIG. 23A is a graph 230-1 illustrating fault zone definitions for the first switch S1, which include Zone-1 designated as Z1-1 bounded by the range R1-1; Zone-2 designated as Z2-1 bounded by the range R2-1; and Zone-3 designated as Z3-1 bounded by the range R3-1. The faults F1 and F2 fall within Zone-3 of switch S1 designated as Z3-1, while the fault F3 falls outside the range of S1.

FIG. 23B is a graph 230-2 illustrating fault zone definitions for the second switch S2, which include Zone-1 designated as Z1-2 bounded by the range R1-2; Zone-2 designated as Z2-2 bounded by the range R2-2; and Zone-3 designated as Z3-2 bounded by the range R3-2. Switch S2 cannot see the fault F1 because S2 is located downstream from the tapped line 232 where the fault F1 occurs. The fault F2 falls within Zone-2 of switch S2 designated as Z2-2, while the fault F3 falls within Zone-3 of switch S2 designated as Z3-2.

Figures 23C, 23D:
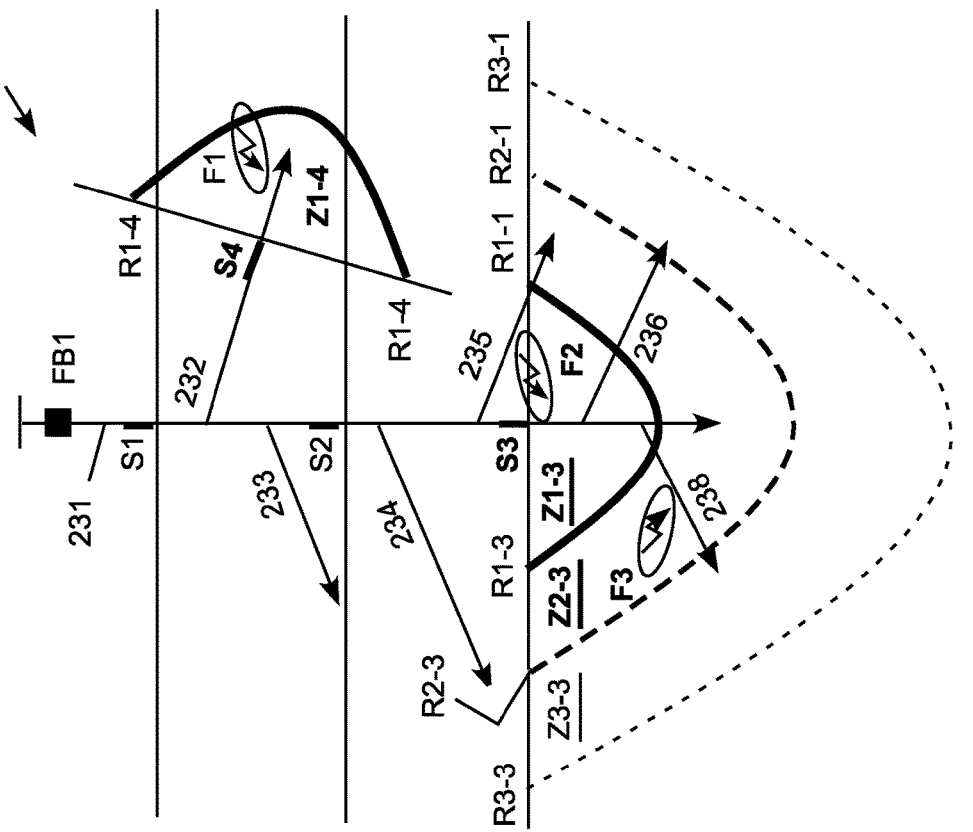
FIG. 23C is a graph illustrating fault zones for third and fourth switches in the zone-based sectionalizing scheme.
FIG. 23D is a chart summarizing fault zones for several faults in the zone-based sectionalizing scheme.

FIG. 23C is a graph 230-3 illustrating fault zone definitions for the third switch S3, which include Zone-1 designated as Z1-3 bounded by the range R1-3; Zone-2 designated as Z2-3 bounded by the range R2-3, and Zone-3 designated as Z3-3 bounded by the range R3-3. Switch S3 cannot see the fault F1 because S3 is located downstream from the tapped line 232 where fault Ft occurs. The fault F2 falls within Zone-1 of switch S3 designated as Z1-3, while the fault F3 falls within Zone-2 of switch S3 designated as Z2-3.

A review of the fault zone definitions chart for the switches S1 through S3 reveals that the faults F2 and F3 fall within Zone-1 or Zone 2 of at least one of the switches, whereas the fault F1 only occurs in Zone-3 of Switch S1. This analysis indicates that the zone definitions for switches 51 through S3 may not be adequate to respond to the fault F1. As one approach to remedy this situation, the system operator may attempt broaden the definition of Zone-2 of the switch S1 to encompass the fault F1, which may not be suitable due to the impact of that adjustment on the rest of the sectionalizing scheme. Another alternative shown in FIG. 23C includes adding another smart sectionalizer S4 along the tapped line 232 that places the fault F4 within Zone-1 of the added switch S4. FIG. 23D is a chart 239 summarizing the fault zones in which the faults F1-F3 fall within the zones of the switches S1-S4. As shown in FIG. 23D, all of the faults occur within Zone-1 or Zone-2 of at least one of the sectionalizers, which is the desired coverage for the FDIR zone definitions. While FIGS. 23A-23D provide a simplified example of the zone definition procedure for an FDIR system, it will be appreciated that system operators can use analogous, although more comprehensive and more complicated procedures, to position smart switches and define their zones throughout the electric power system.

Figure 24:
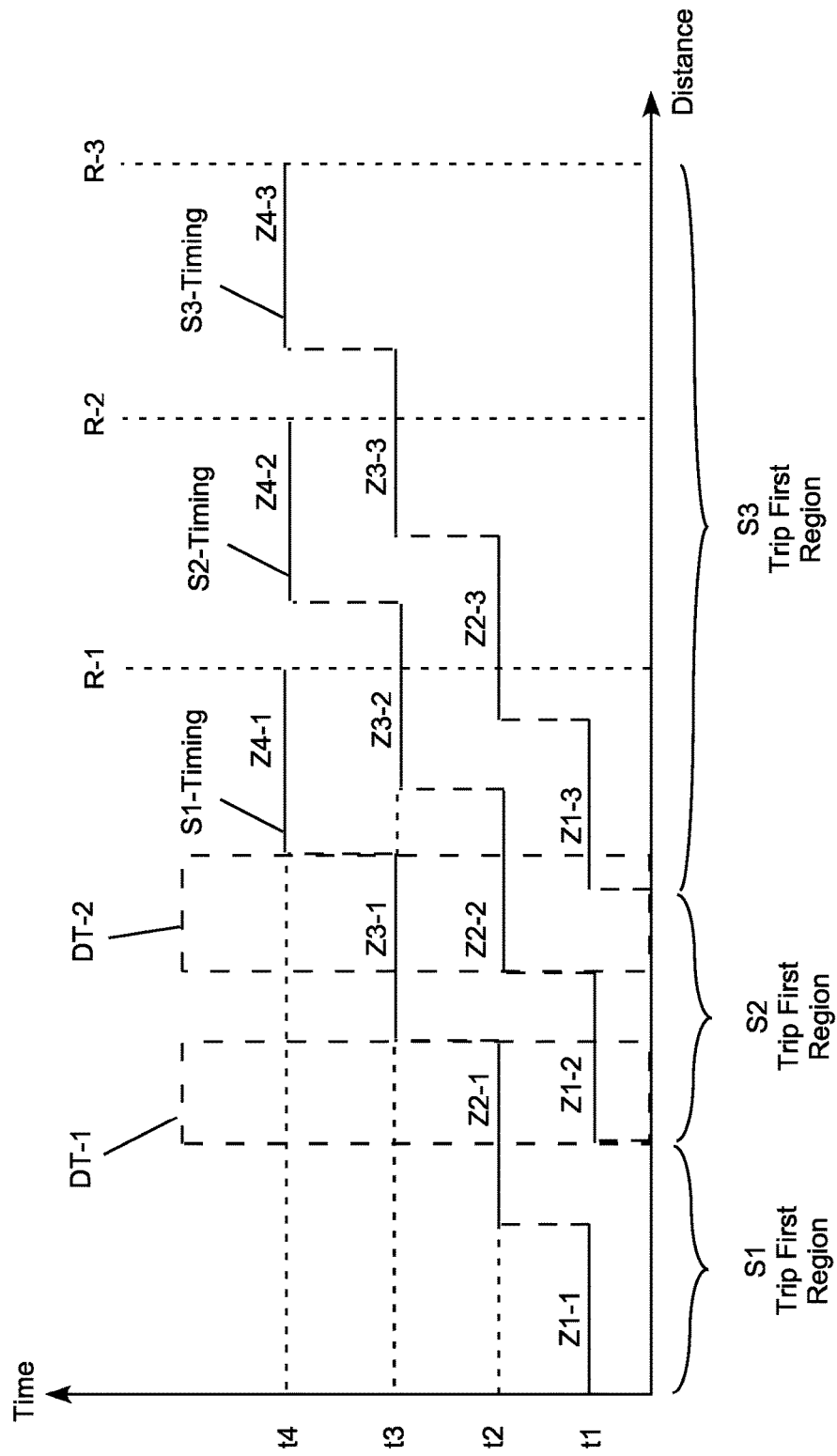
FIG. 24 is a graph a step-distance (fuse-safe) zone definition scheme.
Figure 25:
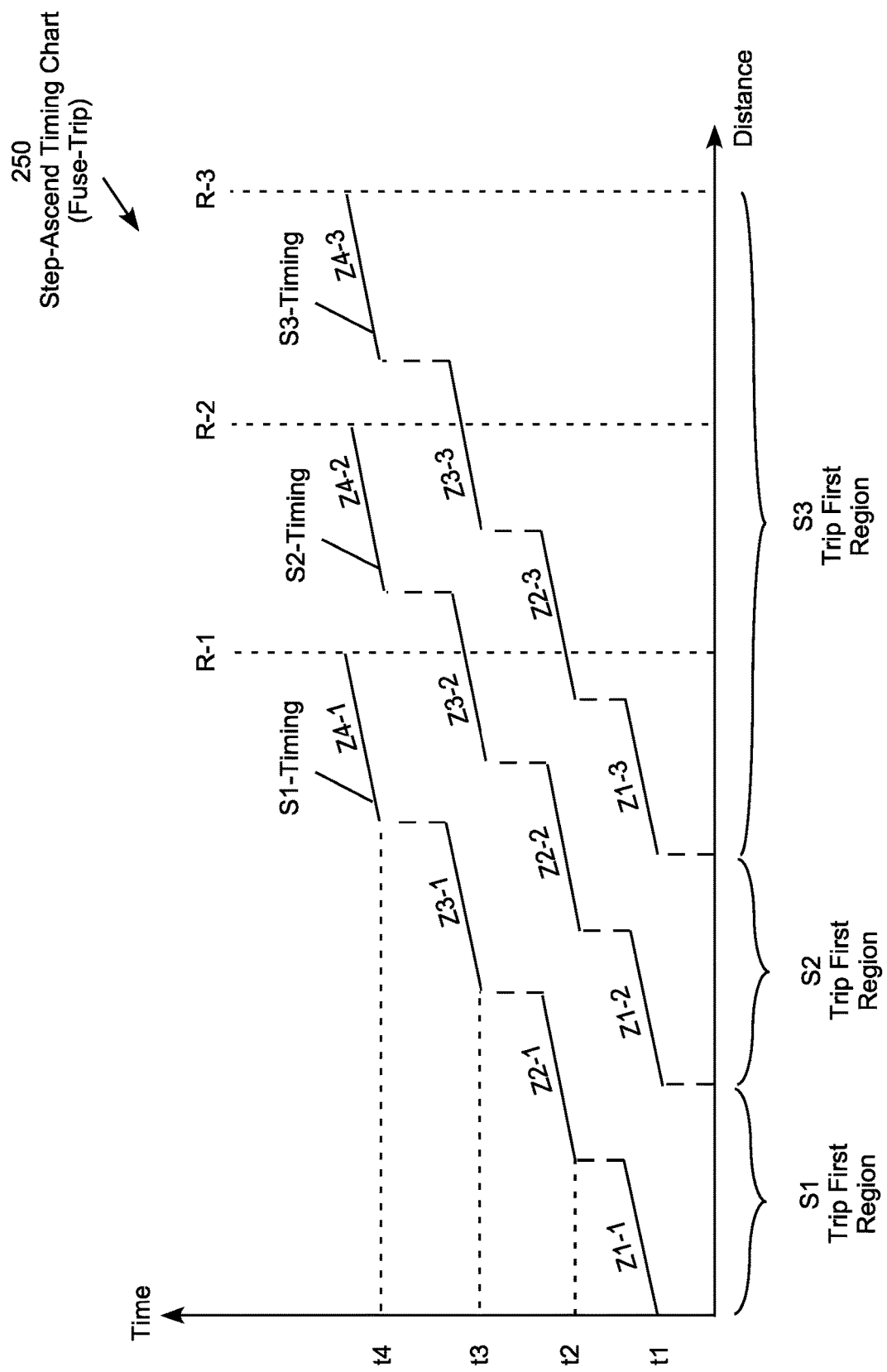
FIG. 25 is a graph a step-ascend (fuse-trip) zone definition scheme.
Figure 26:
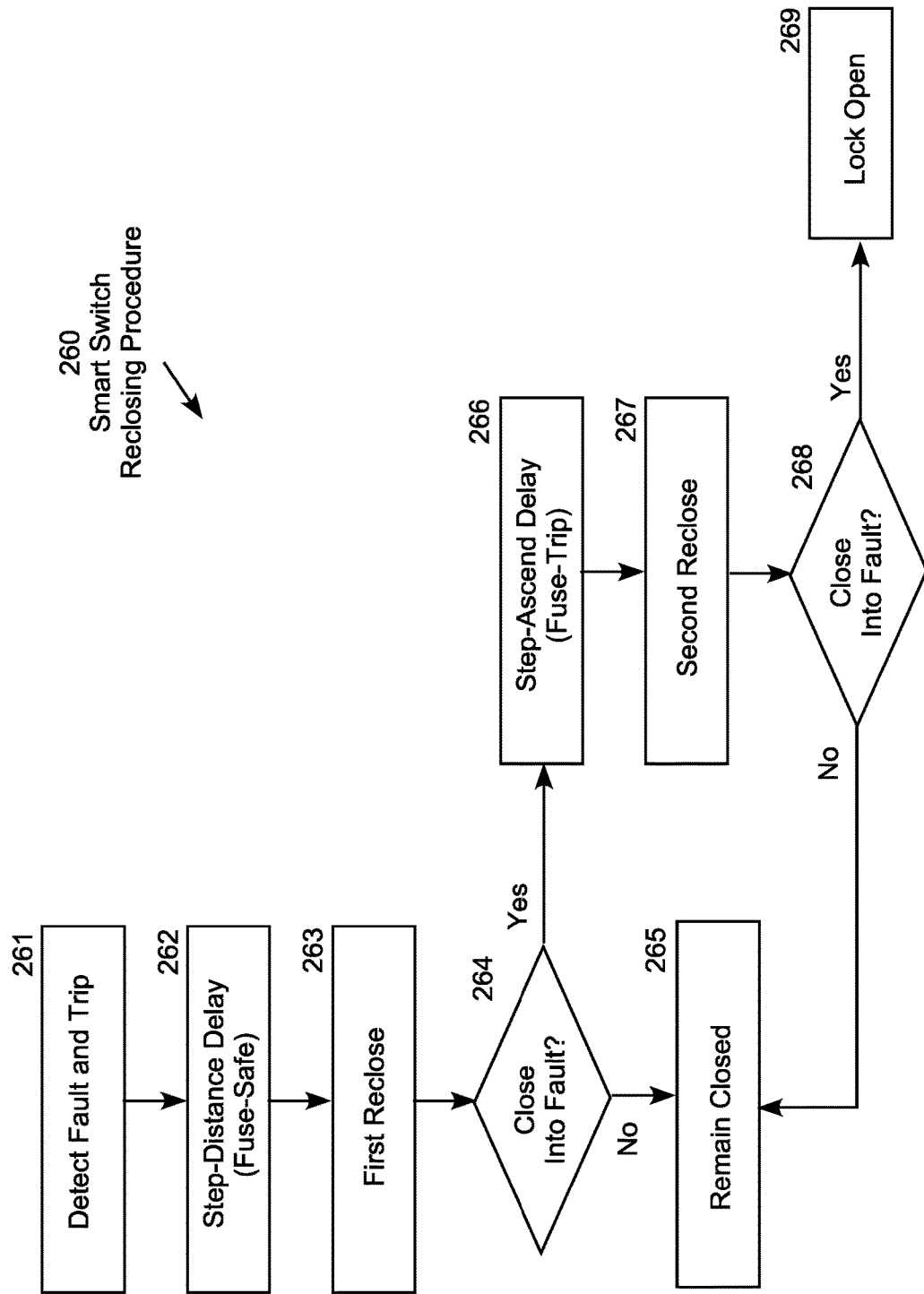
FIG. 26 is a logic flow diagram for a sectionalizer operating procedure using the zone definition schemes of FIGS. 24 and 25.

FIG. 24 is a graph of a step-distance "fuse-safe" reclose timing scheme 240, FIG. 25 is a graph a step-ascend "fuse-trip" reclose timing scheme 250, and FIG. 26 is a logic flow diagram 260 for a zone-based sectionalizer operating procedure utilizing these reclose timing schemes. The vertical axis shows four time points t1-t4 representing the trip points for Zones 1-4 for each switch S1-S3. The horizontal axis shows distance along a transmission line with three sectionalizer switches S1-S3 including three distance regions, a region where S1 trips first, a region where S2 trips first, and a region where S3 trips first. R1 indicates the range of switch S1, R2 indicates the range of switch S2, and R3 indicates the range of switch S1. The timing diagram for S1 has four timing zones Z1-1, Z2-1, Z3-1 and Z4-1; the timing diagram for S2 has four timing zones Z1-2, Z2-2, Z3-2 and Z4-2; the timing diagram for S3 has four timing zones Z1-3, Z2-3, Z3-3 and Z4-3; and the timing diagram for S4 has four timing zones Z1-4, Z2-4, Z3-4 and Z4-4.

The horizontal slope of the timing diagram for each timing zone indicates that the reclose time (i.e., the amount of time that the switch remains closed to test whether the fault has cleared) remains constant over the transmission line distance associated with each timing zone. Since the transmission line has an impedance that increases with the distance (typically expressed as Ohms-per-mile), the fault current occurring on the transmission line generally decreases with the distance that the fault current travels. The horizontal slope of the timing zones therefore represents a decrease in the power caused by the fault current while the switch is attempting to reclose, which is proportional to the fault current over the time during which the fault current is experienced, as the fault current travels further away from the location of the fault. As a result, the fuses along a faulted transmission line are generally less likely to trip (blow) as the distance represented by a timing zone increases. The step-distance zone definition scheme 240 therefore decreases the likelihood that a fault current will trip a fuse as the distance from the fault to the fuse increases. Moreover, the step-distance reclose timing scheme can be configured to prevent expected fault currents from tripping the fuses during the first reclose attempt, which results in a "fuse-safe" zone definition scheme. Of course, all possible fault currents that could be experienced by a transmission or distribution line cannot be determined in advance, and some fault currents, such as those caused by lightning and large capacitor and motor transients, can exceed typical line-to-ground and phase-to-phase line faults. The step-distance zone definition scheme will therefore be understood as "generally" fuse-safe for typical line-to-ground and phase-to-phase line faults originating on distribution lines, which account for the vast majority of faults experienced by the typical FDIR system.

In addition, because the distance-to-fault estimation cannot be expected to be exact, the timing zones for adjacent switches include distance-tolerance overlap regions in which certain zones of adjacent switches overlap, ensuring that at least one of the switches will detect any fault occurring anywhere between the switches. These distance-tolerance overlap regions are indicated on FIG. 25 as DT-1 (where Z2-1 overlaps with Z1-2) and DT-2 (where Z3-1 overlaps with Z2-2 and Z1-3). Using the distance estimations to only determine the distance-to-fault zone, as opposed to the exact distance to the fault, reduces the required accuracy of the distance-to-fault-computations. This, in turn, reduces the required accuracy of the voltage measurements, which allows the FDIR system to utilize lower weight, lower cost line sensors than those used for highly extremely voltage determinations. The end result is that the FDIR smart switches will be economically feasible in a far greater number of locations, resulting in a far greater penetration of the FDIR "smart grid" on the millions of miles of transmission and distribution lines throughout the U.S. and other countries.

FIG. 25 is a graph the step-ascend "fuse-trip" zone definition scheme 250, which is similar to the step-distance "fuse-safe" zone definition scheme 240, except that the timing zones are sloped upward indicating that the reclose time increases with the transmission line distance associated with each zone. The upward slope of the timing zones is designed to maintain approximately constant power caused by the fault current during a reclosing attempt as the fault current travels further away from the location of the fault. As a result, the step-ascent zone definition scheme 250 can be designed to maintain an approximately equal likelihood that a fault current will trip a fuse during a reclose attempt as the distance from the fault to the fuse increases. This allows the step-ascend "fuse-trip" zone definition scheme to be configured to cause expected fault currents to trip the fuses during the second reclose attempt, regardless of the distance of the fuse from the fault. Again, all possible fault currents that could be experienced by a transmission or distribution line cannot be determined in advance, and the step-ascend zone definition scheme will therefore be understood as "generally" fuse-trip for typical line-to-ground and phase-to-phase line faults originating on distribution lines, which account for the vast majority of faults experienced by the typical T-FDIR system.

FIG. 26 is a logic flow diagram 260 for an example operating procedure utilizing the "fuse-safe" step-distance zone definition 240 shown in FIG. 24 and the "fuse-trip" step-ascend zone definition 250 shown in FIG. 25 performed by a zone-based smarts switch, such as sectionalizers in a D-FDIR system or an STU in a T-FDIR system. While this particular example applies to an individual smart switch (e.g., a sectionalizer in a D-FDIR system) implementing two reclosing attempts, a similar procedure may be applied by separate smart switches (e.g., STUs in a T-FDIR system) during the first and second reclosing cycles of substation breakers. In step 261, the smart switch detects a fault and trips. Step 261 is followed by step 262, in which the smart switch adopts the fuse-safe (step-distance) reclose timing definitions. Step 262 is followed by step 263, in which the smart switch implements a first reclose attempt in accordance with the fuse-safe (step-distance) reclose timing. Step 263 is followed by step 264, in which the smart switch determines whether the switch has closed into a fault (i.e., whether the fault persists). If the switch has not closed into a fault, the "no" branch is followed to step 265, in which the switch remains closed. If the switch has closed into a fault, the "yes" branch is followed from step 264 to step 266, in which the smart switch adopts the fuse-trip (step-ascend) reclose timing definitions. Step 266 is followed by step 267, in which the smart switch implements a second reclose attempt in accordance with the fuse-trip (step-ascend) reclose timing. Step 267 is followed by step 268, in which the smart switch determines whether the switch has closed into a fault (i.e., whether the fault persists). If the switch has not closed into a fault, the "no" branch is followed to step 265, in which the switch remains closed, which should be the case because the fault will either clear or fuse-trip reclose timing will cause one or more fuses to blow on the faulted line section during the second reclose attempt. If the switch has closed into a fault (i.e., the fault persists through the second reclose attempt), the "yes" branch is followed from step 268 to step 269, in which the smart switch locks open. According to this methodology, the smart switch attempts the first reclose without tripping the fuses on the faulted section of the transmission line by utilizing the fuse-safe reclose timing definitions. If the first reclose attempt does not find that the fault has cleared, the smart switch trips the fuses on the faulted section of the transmission line during the second reclose attempt by utilizing the fuse-trip reclose timing definitions.

Each smart recloser may therefore be configured to operate independently with up to four reclosing zones for each direction, and the ability to determine whether the recloser is upstream or downstream from the fault based on the direction of the fault and the circuit configuration. Each switch can therefore be configured to operate differently (i.e., reclose or lock open on the initial trip) based on whether the switch is upstream or downstream from the fault. When they do kick in, each D-FDIR recloser may be programmed to attempt two reclosing rounds, the first with the "fuse-safe" step-distance reclose timing 240 designed to avoid tripping the fuses on the faulted line segment, and the second with the "fuse-trip" step-ascent reclose timing 250 designed to intentionally trip the fuses on the faulted line segment, as described with reference to the timing diagrams in FIGS. 24 and 25 and the logic flow diagram in FIG. 26.

In a T-FDIR system, the substation breaker may be configured to utilize the "fuse-safe" step-distance zone definition 240 during the first reclosing cycle of the substation breakers, while the substation breakers may be configured to utilize the "fuse-trip" step-ascend zone definition 250 during the first reclosing cycle of the substation breakers. If desired, however, the STUs may be timed to operate before the substation breakers, to effectively take the substation breakers out of the fault isolation process. In this case, the T-FDIR STUs will typically use the fuse-safe timing during its own first reclose attempt, and use the fuse-trip timing during its own second reclose attempt, as described above for D-FDIR reclosers.

Figure 27:
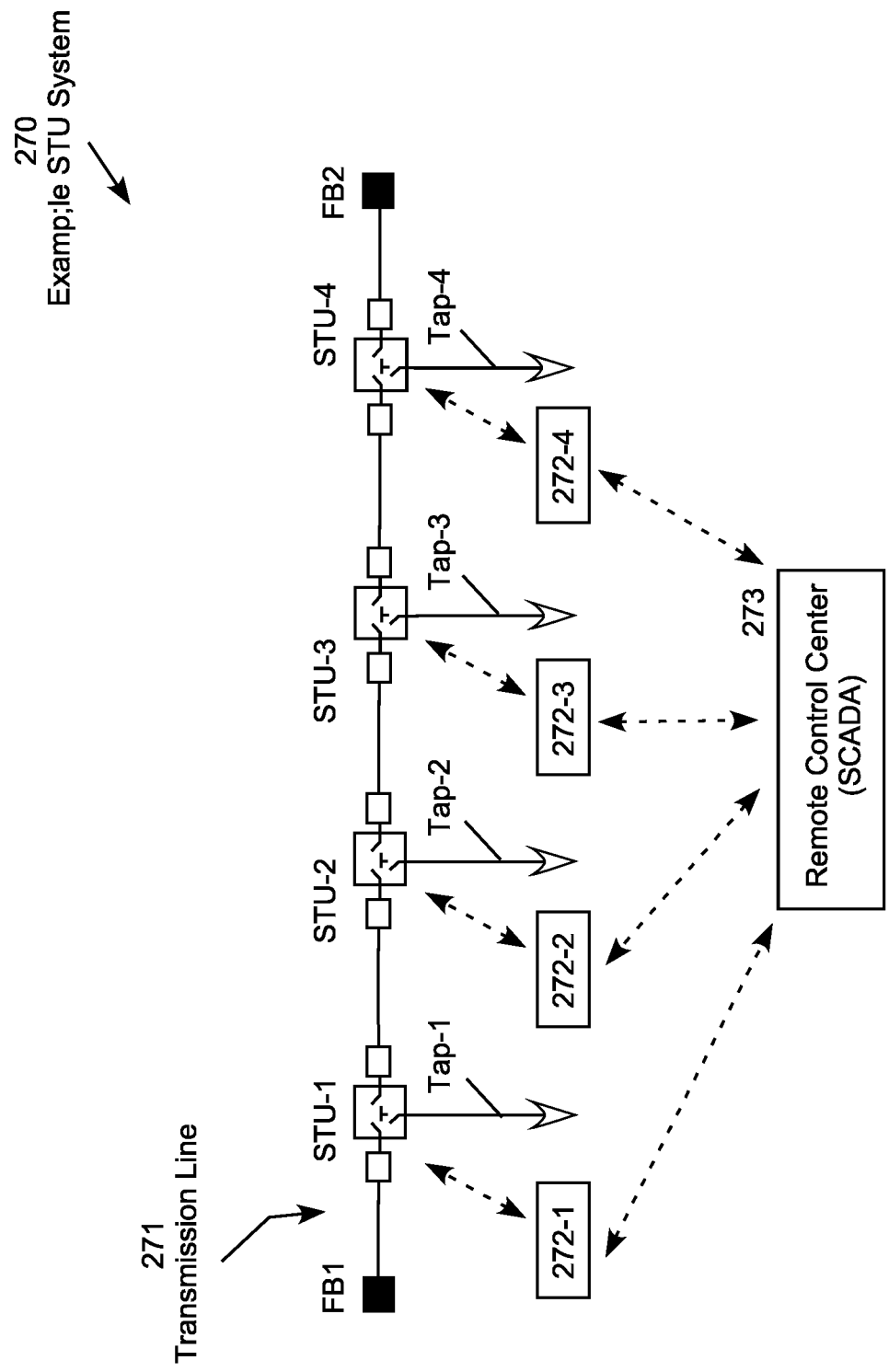
FIG. 27 is a representative portion of a smart tap unit system.

FIGS. 27 through 31A-31B are more specifically directed to an illustrative transmission level T-FDIR embodiment. FIG. 27 is a representative section of a T-FDIR system 270 connected to a section of a main transmission line 271 extending between two substation breakers FB1 and FB2. The main transmission line 271 includes four taped lines Tap-1, Tap-2, Tap-3 and Tap-4 spaced along the main line between the breakers. Each tap point includes a 3-way Smart Tap Unit, STU-1 feeding Tap-1, STU-2 feeding Tap-2, STU-3 feeding Tap-3, and STU-4 feeding Tap-4. As described with reference to FIG. 1C, each STU includes a 3-way switch, a zone-based reclosing controller, two Intelligent Circuit Sensor (ICS) units measuring the voltage and current on the main transmission line 271 on either side of the STU. Although a third ICS may be included to directly measure the voltage and current along the tapped line, two ICS units are sufficient for the illustrative embodiment because there are no additional sectionalizers along the tapped lines. The intelligence required to operate the T-FDIR system may be mounted on the transmission line supports (e.g., towers) and maintained at line voltage. As an alternative, this particular embodiment includes STU line sensors supported by the transmission line 271 that communicate wirelessly with ground-based control units. With this configuration, STU-1 communicates with controller 272-1, STU-2 communicates with controller 272-2, STU-3 communicates with controller 272-3 and STU-4 communicates with controller 272-4.

The ground-based STU controllers 272-1 to 272-4 also communicate wirelessly with a remote control center 273, for example through a SCADA communication system. The control center 273 has the ability to program the STUs remotely, for example by changing zone definitions, timing parameters and operating logic on an as-needed basis. In addition, the STU controllers 272-1 to 272-4 locally record voltage measurements, current measurements, fault detections, switch operations and other operational data. This operational data is regularly communicated to the control center 273 for display, analysis, zone adjustment, timing adjustment, and other provisioning of the STUs system. This type of communication with the control center typically occurs during normal operations (e.g., on a daily schedule) and is not required for autonomous sectionalizing operation of the T-FDIR system. During fault isolation operations, the STUs are configured to operate autonomously without requiring remote or centralized control. This allows the T-FDIR system to operate quickly and autonomously based on preconfigured logic and settings without the need for communications during an outage, when power from the transmission line 271 may be unavailable. The STUs typically include rechargeable batteries that are maintained in a charged state by power harvested from the transmission line allowing the STU to operate even when, and especially when, the transmission line is experiencing an outage. Other types of power supplies, such as solar panels, may also be used to recharge the STU power supplies, which may further include capacitor banks sufficient to operate the STUs for several cycles during outage conditions without relying on battery power. For example, the STUs may include primary capacitor-based power supplies with rechargeable batteries proving back-up power to increase reliability.

Electric power transmission lines in the range of 35 kV to 220 kV usually have several tap points, such as T-connection taps with 3-way switches. These 3-way switches are often disconnect switches (also called load switches) having no capability to clear a fault by automatically reclosing following the initial trip. Therefore, when a fault occurs in a section of a transmission line between two taps, or in a lateral line tapped off from the main transmission line, the relay protection is set to trip the breakers at the two ending substations of the transmission line before the any of the disconnect switches trip at the tap points. Because of the existence of multiple lateral taps, the relay protection schemes at the two substations are not able effectively to isolate the faulted section. It has therefore been a common practice in the power utility industry to locate the faulted section by a trail-and-error approach. This typically includes a manual tap-by-tap search conducted by technicians in trucks driving to the tap points to manually attempt to reclose the switches. For each tap point, each switch is manually opened one at a time, and the substation breakers are then reclosed one at a time, to determine which side of the switch contains the fault. Whenever the breaker at one side trips again, that test divides the line in half and the process continues until the fault has been isolated. This process may take a significant amount of time (potentially hours or even days depending of drive times) and many trips of the breakers, which exposes the power line and connected loads to repeated transient power disturbances.

The T-FDIR system 270 greatly improves upon the conventional approach by combining light weight ICS line sensors providing voltage and current signals at the tap points with direction-to-fault and zone-based distance-to-fault autonomous STU trip and reclosing logic to automatically isolate faults without relying on communications with a central controller or communications between STUs. By locating the STUs at multiple points outside substations, the ability to discriminate the fault location is greatly enhanced, which allows for the use of light weight, inexpensive ICS sensors with relatively low voltage measurement accuracy. The use of zone-based control schemes minimizes the importance of voltage accuracy. The T-FDIR system thus allows for a high penetration of light weight, cost effective STUs to be placed throughout the transmission system outside of substation environments in existing rights-of-way and on existing line support structures. The result is an enormous cost savings allowing for a much wider spread implementation of "smart-grid" technology for electric power transmission systems.

Figure 28:
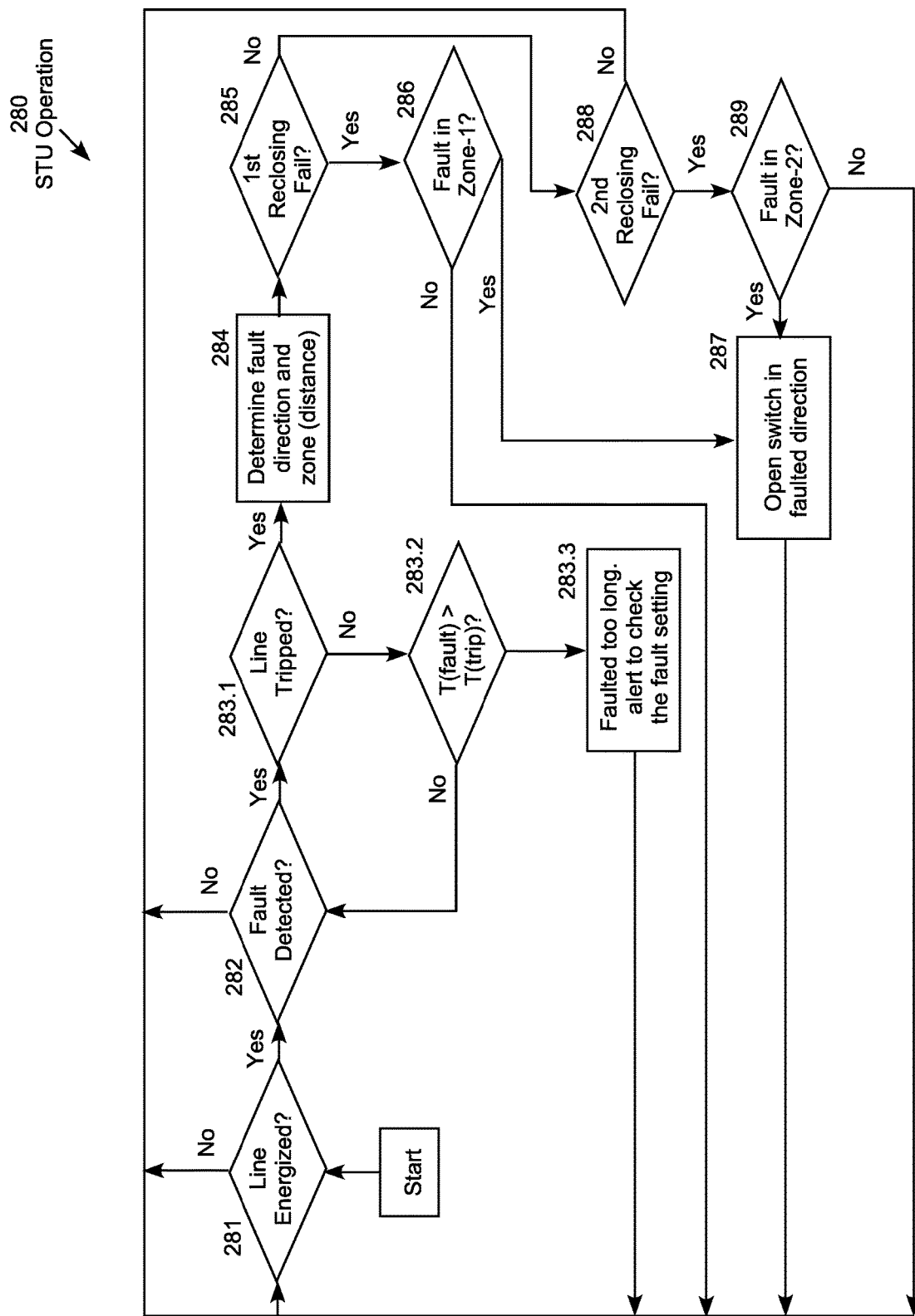
FIG. 28 is a logic flow diagram for operating the smart tap unit (STU) system.

FIG. 28 is a logic flow diagram 280 for operating an STU in the T-FDIR system 272. Each STU operates independently according to self-contained programmed logic, zone definitions and timing parameters, and typically performs routine 280 for each line and tap direction with separate zone definitions and timing parameters for each direction. In step 281, the STU determines whether its associated power line is energized. If the line is not energized, the "no" branch loops back to step 281, in which the STU waits for energization. If the line is energized, the "yes" branch is followed from step 281 to step 282, in which the STU determines whether it has detected a fault. If a fault has not been detected, the "no" branch loops back to step 281, in which the STU waits for energization. If a fault has been detected, the "yes" branch is followed from step 282 to step 283.1, in which the STU determines whether the switch for the faulted line segment has already tripped. If the switch for the faulted line segment has not already tripped, the "no" branch is followed to step 283.2, in which the STU determines whether the fault duration exceeds the trip time. If the fault duration does not exceed the trip time, the "no" branch is followed from step 282.2 to step 283.1, in which the STU continues to determine whether the switch for the faulted line segment has already tripped. If the fault duration does exceed the trip time, the "yes" branch is followed from step 282.2 to step 283.3, in which the STU records locally and ultimately reports to a control center that that switch has malfunctioned or requires reprogramming of the trip time.

Referring again to step 283.1, if the switch for the faulted line segment has already tripped, the "yes" branch is followed to step 284, in which the STU determines the direction to the fault and the distance-based zone of the fault. Step 284 is followed by step 285, in which the STU determines whether a first reclosing attempt has already failed (i.e., whether the switch has already reclosed into the fault and tripped a first time). If a first reclosing attempt has already failed, the "yes" branch is followed from step 285 to step 286, in which the STU determines whether the fault is in Zone-1 for the switch. If the fault is in Zone-1 for the switch, the "yes" branch is followed from step 286 to step 287, in which the STU trips (opens) the switch in the direction of the fault. The first reclose attempt typically utilizes a "fuse-safe" step-distance reclosing logic as described with reference to the timing chart in FIG. 24 and the logic flow diagram in FIG. 26. Following step 287, the routine returns to step 281 for continued operations.

Referring again to step 285, if a first reclosing attempt has not already failed, the "no" branch is followed from step 285 to step 288, in which the STU determines whether a second reclosing attempt has already failed (i.e., whether the switch has already reclosed into the fault twice and tripped both times). If a second reclosing attempt has not already failed, the "yes" branch is followed from step 288 to step 289, in which the STU determines whether the fault is in Zone-2 for the switch. If the fault is in Zone-2 for the switch, the "yes" branch is followed from step 289 to step 287, in which the STU trips (opens) the switch in the direction of the fault. The second reclose attempt typically utilizes a "fuse-trip" step-ascend reclosing logic as described with reference to the timing chart in FIG. 25 and the logic flow diagram in FIG. 26. Referring again to step 288, if the fault is not in Zone-2 for the switch, the "no" branch returns to step 281 for continued operations.

Referring again to FIG. 27, each STU is programmed to perform routine 280 in coordination with the operation of the substation breakers FB1 and FB2. This allows the STUs to automatically detect and isolate faults occurring on the transmission line 271 (including faults occurring on the tapped lines Tap-1 to Tap-4) and restore service to the non-faulted portions of the transmission lines to the extent possible, without altering the normal reclosing cycles of the substation breakers. The zone-based distance-to-fault estimation implemented by purely local control logic in the STUs allows each STU to operate autonomously without involving communication to the substations or the neighboring taps. Voltage and current measurement at the STUs utilizes light weight, cost effective line sensors measuring line current and voltage from each phase of the line installed at each tap. Because the voltage measurement from each phase of the line is coupled with the other two phases through the air in a capacitive way dominated by the geometric layout, the voltages from the three phase lines can exhibit relatively low accuracy. Phase voltage decoupling and phasor correction logic may be used to enhance the voltage measurement accuracy. The distance-to-fault logic accommodates voltage measurements with low accuracy by relying on zone-based distance estimation rather than exact fault location.

Using direction-to-fault and zone-based distance-to-fault estimation, the fault direction and zone is determined at each tap point. In in illustrative embodiment, for example, the zones the are defined in four categories: (1) Zone 1—the fault distance is less than a user-defined base percentage (e.g., 80%) of the distance to the adjacent tap, and the fault can therefore be considered "definitely" in the closest section of the main transmission line in the fault direction; (2) Zone 2—the fault distance is between the base percentage and extended user-defined base percentage (e.g., 80% to 120%) of the distance to the adjacent tap, and the fault can therefore be considered "possibly" in the closest section of the main transmission line in the fault direction; (3) Zone 3 (null)—the fault distance is greater than the extended percentage (e.g., 120%) of the distance to the adjacent tap, and the fault can therefore be considered "definitely not" in the closest section of the main transmission line in the fault direction; and (4) Zone 4—the sensors on both sides of the tap point indicate that the fault is toward the tap point, and the fault is therefore "definitely" in the tapped line off the main transmission line.

For Zone 1, the STU is timed to open the switch along the main transmission line in the direction of the fault in coordination with the substation breaker in that direction. As a matter of design choice, and on a case-by-case basis, the Zone 1 STUs may be programmed to kick in after the substation breakers initially trip and before their first reclosing attempt (i.e., during the first reclosing cycle), after the first reclosing attempt of the substation breakers and before their second reclosing attempt (i.e., during the second reclosing cycle), or during a subsequent reclosing cycle if desired. In any case, the Zone 1 STU trip time is set to occur between during the breaker recharge between opening and reclosing of the substation breaker (e.g., 8 to 10 seconds), which allows the STUs to operate according to their programmed logic while the substation breakers are open. In a typical timing configuration, for example, the substation breakers are timed to trip first upon fault detection, the Zone-1 STUs are programmed to operate during the first substation breaker reclosing cycle, and the Zone 2 STUs are programmed to operate during the second substation breaker reclosing cycle. Zone 3 STUs take no action along the main transmission line, and any STU detecting a Zone 4 fault on the tapped line segment trips immediately upon detecting the fault to isolate the tapped line experiencing the fault.

If desired, the Zone 1 STUs may be programmed to kick in after detecting a fault and before the substation breakers initially trip. This alternative allows the T-FDIR system to isolate faults without operation of the substation breakers, which may be advantageous in situations where the system operator wants to avoid operation of the substation breakers. This situation may occur, for example, where the substation breakers do not have automatic reclosing capability, or where only a portion of the transmission system includes T-FDIR equipment and the system operator wants the T-FDIR equipment to isolate faults occurring within the T-FDIR enabled portion of the transmission system without involvement of the substation breakers. As additional examples, this alternative may be advantageous to avoid wear-and-tear on the substation breakers, where load-side generation is located on the T-FDIR enabled portion of the transmission system and the T-FDIR system has single-phase switching capability that is lacking at the substation breakers, the T-FDIR system has fuse-safe, fuse-trip capability the is lacking at the substation breakers, the T-FDIR switches have resistor insertion capability to suppress transient switching disturbances that is lacking at the substation breakers, or where different parties operate the substations versus the T-FDIR enabled portion of the transmission system.

With this logic, when a fault occurs at any line section along the main transmission line, or a tapped line section, the T-FDIR isolates the fault without requiring reconfiguration of the substation breakers or remote communications. Fault isolation operates autonomously and, therefore, is not affected by the reliability of the communications backbone and far less expensive than communication-based systems. The T-FDIR system does not require full network topology modeling. Each STU operates independently by following common rules, which makes it relatively easy to provision. The T-FDIR system operates very quickly. The entire fault detection and isolation process can be completed with only one or two reclosing cycles of the substation breakers, during which the STUs isolate the fault down to the smallest segment possible. In a typical T-FDIR embodiment, up to 80% of the faults are successfully isolated with the first reclosing, and 100% of the faults are successfully isolated with the second reclosing, after the STU logic kicks in. Service is quickly restored without multiple "trial-and-error" reclosing attempts by the substation breakers. If the substation breakers are timed to allow the STUs to kick in before the substation breakers trip, the T-FDIR system can be configured to isolate faults and restore service without any operation by the substation breakers. In addition, the STUs can be designed to trip the fuses on the faulted line segment if the fault does not clear on the first or second reclose attempts. In addition, the smart switches always trip and lock open in response to fault that do not clear, without the need for communications, and therefore never leaves a fault connected to a substation breaker as a result of data error or device malfunction. Because the T-FDIR system can be configured to operate during a normal breaker reclosing cycle, or without operation of the substation breakers, it requires minimal or no reconfiguration of the existing substation equipment to reclosing protocol. The T-FDIR system can therefore improve system reliability metrics significantly compared to the traditional methods, for example by a factor of 10 to 20 in practical implementations, without expensive substation reconfiguration.

FIGS. 29A-29B, 30A-30B, and 31A-31B illustrate T-FDIR operation for three fault scenarios. In these examples, the substation breakers are programmed to trip first, the Zone-1 STUs are programmed to operate after the substation breakers initially trip and before their first reclosing attempt (i.e., during the first reclosing cycle), and the Zone-2 STUs are programmed to operate after the first reclosing attempt of the substation breakers and before their second reclosing attempt (i.e., during the second reclosing cycle). Zone-1 is set to be within 80% of the distance to the adjacent STU, and Zone-2 is set to be between 80% and 160% of the distance to the adjacent STU, and Zone-3 is set to be more than 160% of the distance to the adjacent STU. In addition, the feeder breakers are configured to utilize the "fuse-safe" step-distance timing during their first reclose attempt, and to utilize the "fuse-trip" step-ascent timing during their second reclose attempt. The substation breakers and the STUs can be equally spaced along the transmission line for the purpose of the illustrations.

Figure 29A:
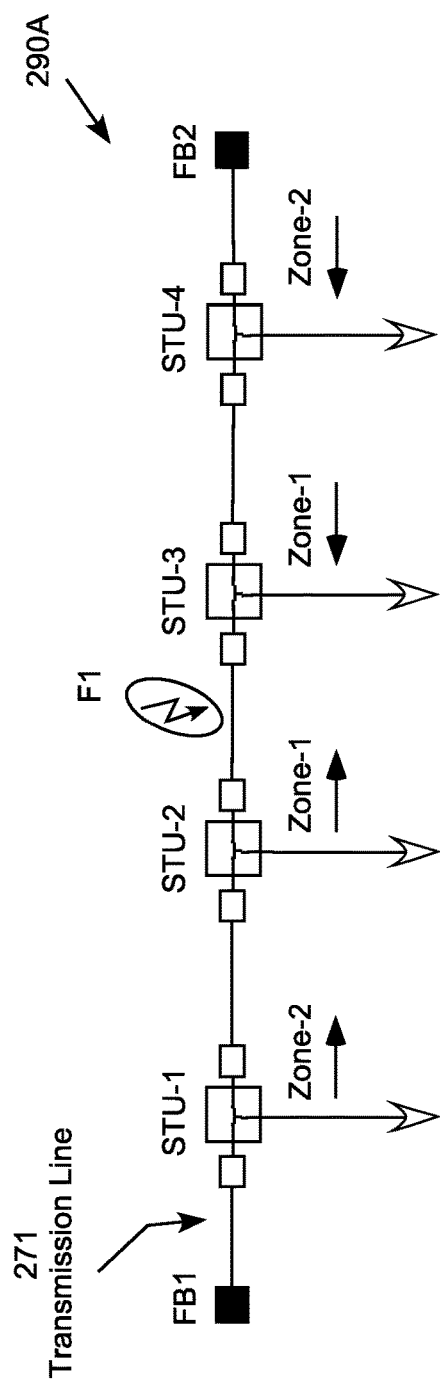
FIG. 29A illustrates the STU system before reacting to a first power line fault.
Figure 29B:
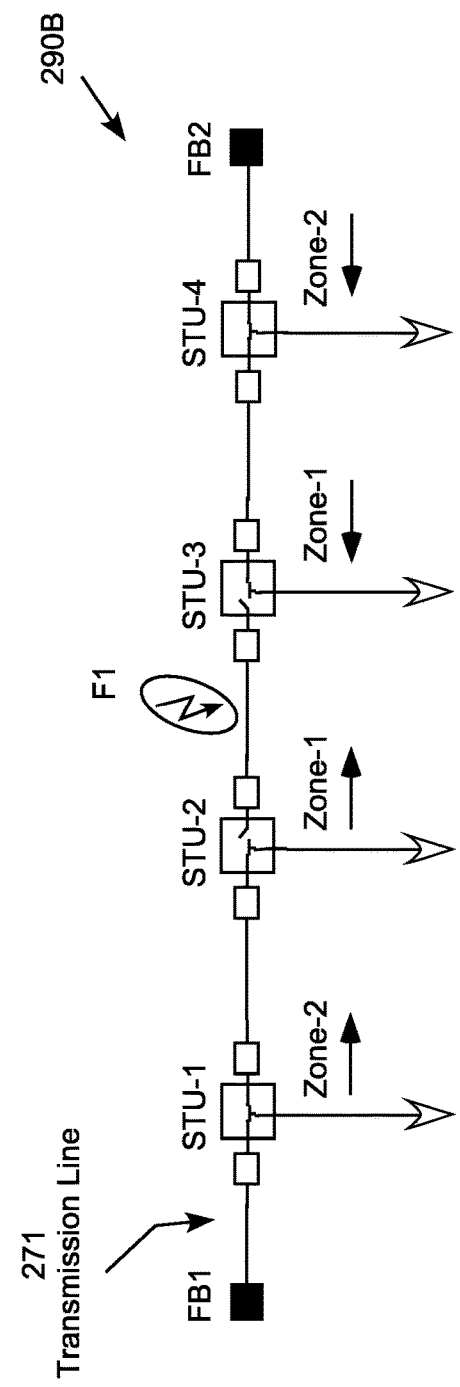
FIG. 29B illustrates the STU system after reacting to the first power line fault.

FIG. 29A illustrates an example T-FDIR system 290A before reacting to a first power line fault F1, and FIG. 29B illustrates the system 290B after reacting to the fault. In this example, the fault F1 occurs approximately 50% of the distance along the transmission line 271 between STU-2 (tap-2) and STU-3 (tap 3). When fault F1 occurs, the substation breakers FB1 and FB2 trip first. STU-1 and STU-2 determine the direction of the fault to be in the direction away from substation breaker FB1, while STU-3 and STU-4 determine the direction of the fault to be in the direction away from substation breaker FB2. In addition, STU-2 and STU-3 determine the fault to be in Zone-1 (i.e., within 80% of the distance to the adjacent STU), and STU-1 and STU-4 determine the fault to be in Zone-2 (i.e., between 80% and 160% of the distance to the adjacent STU). Applying the T-FDIR logic, STU-1 and STU-4 take no action during the first reclose cycle because they determine the fault to be in Zone-2. STU-2 and STU-3 each open their respective switch along the main transmission line 271 in the direction of the fault during the first reclose cycle in response to detecting a Zone-1 fault. This isolates the faulted line section between STU-2 and STU-3. After the substation breaker recharge period (e.g., 8 to 10 seconds), the substations breakers FB1 and FB2 automatically reclose to reenergize the transmission line with the fault F1 isolated as shown in FIG. 29B.

FIG. 30A illustrates an example T-FDIR system 300A before reacting to a second power line fault F2, and FIG. 30B illustrates the system 290B after reacting to the fault. In this example, the fault F1 occurs approximately 10% of the distance along the transmission line 271 between STU-2 (tap-2) and STU-3 (tap 3). When fault F2 occurs, the substation breakers FB1 and FB2 trip first. STU-1 and STU-2 determine the direction of the fault to be in the direction away from substation breaker FB1, while STU-3 and STU-4 determine the direction of the fault to be in the direction away from substation breaker FB2. In addition, STU-2 determines the fault to be in Zone-1 (i.e., within 80% of the distance to the adjacent STU), STU-1 and STU-3 determine the fault to be in Zone-2 (i.e., between 80% and 160% of the distance to the adjacent STU), and STU-4 determines the fault to be in Zone-3 (i.e., more than 160% of the distance to the adjacent STU). While the substations breakers FB1 and FB2 recharge, STU-2 opens its switch along the main transmission line 271 in the direction of the fault in response to detecting the Zone-1 fault. STU-1 and STU-3 take no action during the first reclose cycle because they determined the fault to be in Zone-2. STU-4 also takes no action during the first reclose cycle because it determined the fault to be in Zone-3. After the first recharge period, the substations breakers FB1 and FB2 automatically reclose. Since a line switch at STU-2 is open, only STU-3 and STU-4 detect the fault. This causes STU-3 to open its switch along the main transmission line 271 in the direction of the fault during the second substation breaker recharge period. STU-4 again takes no action because the fault is determined to be in Zone-3 (null). This isolates the faulted line section between STU-2 and STU-3. After the second recharge period, the substations breakers FB1 and FB2 automatically reclose a second time, reenergizing the transmission line with the fault F2 isolated as shown in FIG. 30B.

Figure 31A:
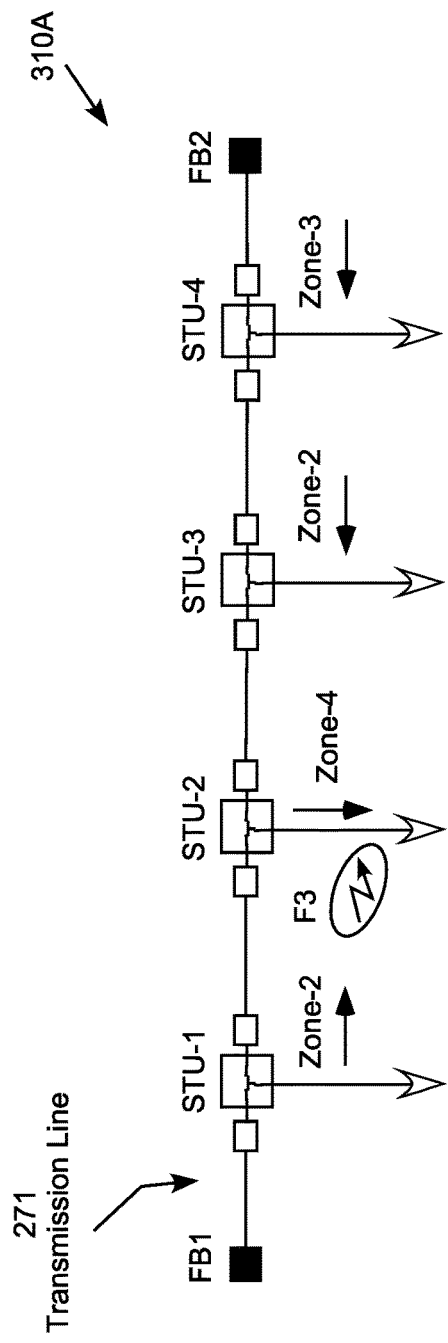
FIG. 31A illustrates the STU system before reacting to a third power line fault.
Figure 31B:
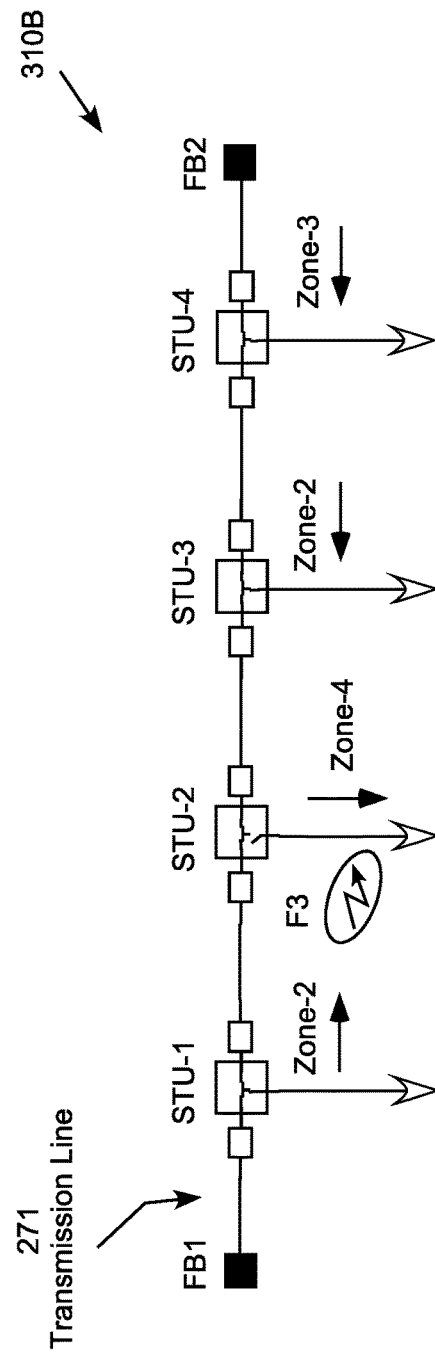
FIG. 31B illustrates the STU system after reacting to the third power line fault.

FIG. 31A illustrates the T-FDIR system 310A before reacting to a third power line fault F3, and FIG. 31B illustrates the T-FDIR system 310B before reacting to the fault, which occurs on the tapped line at STU-2. When fault F3 occurs, the substation breakers FB1 and FB2 trip first. STU-2 determine the direction of the fault to be toward STU-2 from both directions along the transmission line 271, which classifies the fault as Zone-4 (i.e., along the tapped line segment). In addition, STU-1 and STU-3 determine the fault to be in Zone-2 (i.e., between 80% and 160% of the distance to the adjacent STU), and STU-4 determines the fault to be in Zone-3 (i.e., more than 160% of the distance to the adjacent STU). During the substation recharge period, STU-2 opens its switch on the tapped line segment. STU-1 and STU-3 take no action during the first reclose cycle because they determined the fault to be in Zone-2. STU-4 also takes no action during the first reclose cycle because it determined the fault to be in Zone-3. This causes STU-2 to isolate the fault F3 on the tapped line segment. After the recharge period, the substations breakers FB1 and FB2 automatically reclose to reenergize the transmission line with the fault F3 isolated as shown in FIG. 31B.

Figures 32, 33:
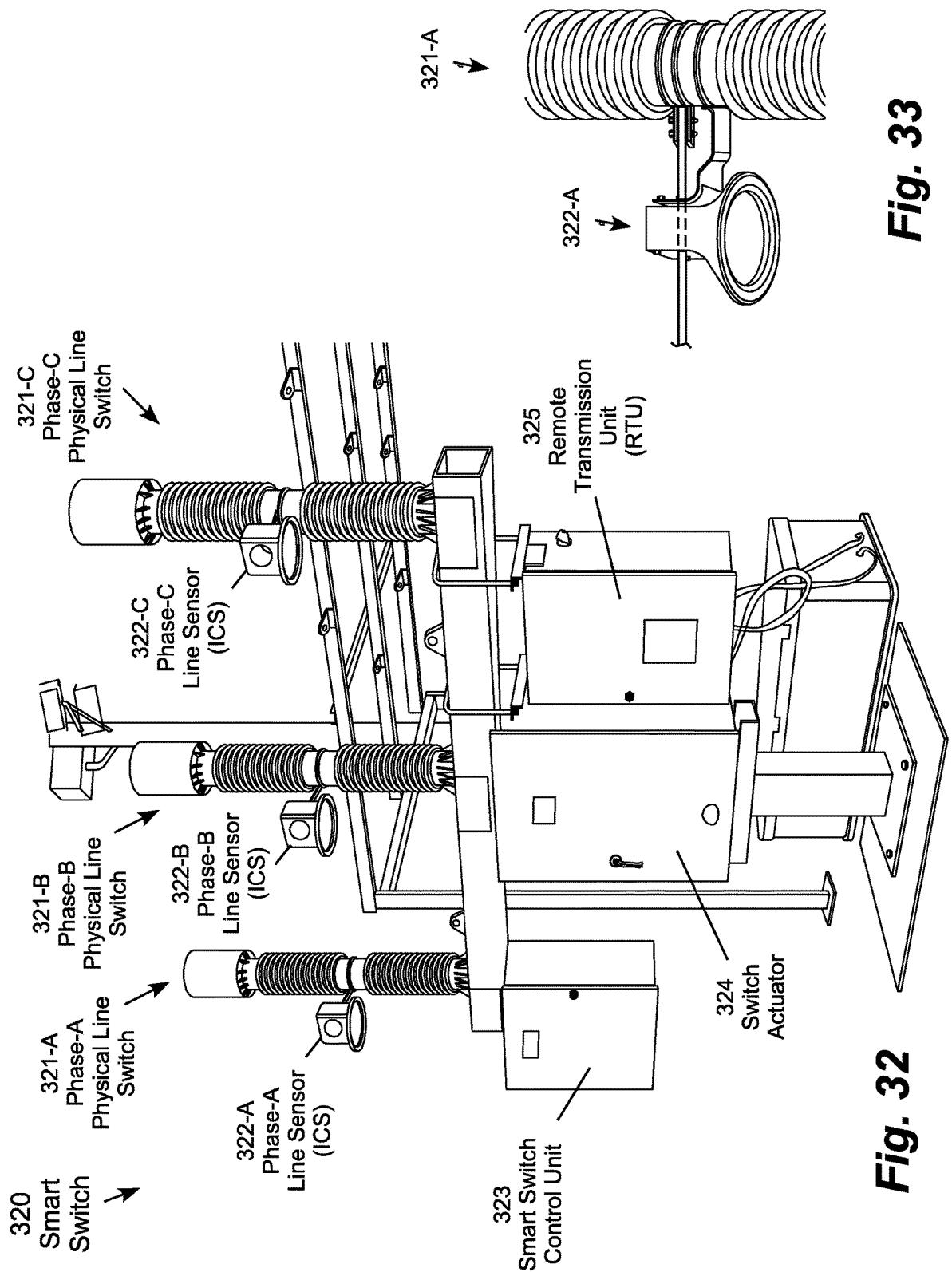
FIG. 32 is a perspective view of an illustrative smart switch.
FIG. 33 is a side view of a portion of the smart switch of FIG. 32.

A representative example smart switch is described in U.S. patent application Ser. No. 15/971,968 (Pub. No. 20180321285), which is incorporated by reference. To give the reader a visual image of the representative smart switch, FIG. 32 is a reproduction of FIG. 1 and FIG. 33 is a reproduction of FIG. 2 from this publication with the reference numerals changed. Although these figures depict a smart switch in a substation environment, similar ICS units may be installed on transmission and distribution towers, poles and other rights-of-way, outside of substation environments, where the power lines connect to physical switches located inside insulators operated by mechanical actuators. The smart switch controllers are electronic units that may be housed within much smaller housings. In a typical D-FDIR smart switch, the controller may be located within the ICS unit itself, which carries its own energy harvesting power supply, rechargeable battery, wireless radio, microprocessor and memory. Although the FDIR smart switches have a somewhat different physical configuration and are generally located outside the substations, the embodiment shown in FIGS. 32 and 33 is instructive because it includes all of the components of an FDIR smart switch in a transmission voltage substation unit. While a transmission voltage STU is depicted in the figures, a distribution voltage smart switch has equivalent functionality in a smaller package with some different features suitable for the lower service voltage. For example, transmission voltage switches are typically filled with a dielectric gas (e.g., SF6) and utilize penetrating "puffer" type contactors, while distribution voltage switches are physically smaller, typically filled with a vacuum, and utilize "butt" type contactors. Distribution voltage smart switches are typically configured to interrupt the line current, while transmission STU are typically configured to operate during the substation breaker reclose cycles while the power line is temporarily deenergized. It will be appreciated, however, that physical variations may be utilized depending on the power line voltage and the desired operating characteristics.

In a representative embodiment, each ICS sensor includes three sets of voltage and current sensors, one set for each transmission line phase, installed at the tap switch terminal connecting to the physical line switch to the transmission line. Each ICS includes an onboard rechargeable battery that remains charged with an onboard power supply that harvests power from the transmission line. The ICS takes digital samples of line current and voltage at a rate of 2 KHz and transmits the digital samples with an onboard 2.4 GHz radio to an associated ground-based controller (represented by the controller 272-1 to 272-4 in FIG. 27), which synthesizes and processes the data from the individual ICS line sensors to perform fault detection and isolation. The ICS may also capture three phase GPS location and time stamped voltage and current waveforms both before and after fault events using a common reference clock (e.g., common GPS clock), which may be stored, analyzed and used for real-time power system control and post-operation reporting and analysis. The three phase voltage and current measurements references to a common clock signal enables the smart switch to conduct direction-to-fault and distance-to-fault estimations used to operate the STU.

The STU 320 includes three physical line switches, 321-A, 321-B and 321-C, one for each electric power phase; and three ICS current and voltage monitors 322-A, 322-B and 322-C, one for each electric power. In this example, each ICS unit is physically supported by a respective electric power switch and has an aperture (hole) allowing the unit to surround an associated power line near the connection of the power line to the circuit switch. Each ICS unit is supported by a respective bracket that positions the ICS unit so that the monitored power line connected to a respective switch passes through the hole in the ICS unit without physically contacting the ICS unit, as shown in FIG. 33. Each ICS unit inductively measures current and capacitively measures voltage on its respective power line and transmit those measurements wirelessly to a control unit 323. The smart switch 320 also includes a mechanical actuator 324 that drives the physical line switches based on instructions from the control unit. This installation also includes a Remote Transmission Unit (RTU) 325 (such as a SCADA unit) that communicates with the local control unit 323 and a remote SCADA control center. In an FDIR embodiment, the remote SCADA control center typically provisions the local control unit 323 but does not control the switch during autonomous operation. The SCADA control center also receives data from the local control unit 323 in order to record, analyze and display the power line measurements and switch operating data. The SCADA control center may also control a variety of other response equipment based on the power line measurements and associated computations., such as capacitor switches, reactor switches, voltage regulators, renewable generation sources, load switches, and so forth.

In view of the foregoing, it will be appreciated that present invention provides significant improvements distribution automation system for high voltage electric power transmission and distribution systems. The foregoing relates only to the exemplary embodiments of the present invention, and that numerous changes may be made therein without departing from the spirit and scope of the invention as defined by the following claims.

The invention claimed is:

1. An electric power fault detection, isolation and restoration system for an electric power line comprising a first substation breaker serving as an upstream power supply for the electric power line, a second substation breaker serving as a selectable downstream power supply for back-feeding the electric power line from the second substation breaker, and a plurality computer-controlled smart switches configured to operate autonomously to isolate electric faults occurring on the electric power line, the smart switches comprising non-transitory computer storage media storing computer-executable instructions that, when executed by the smart switches, cause them to perform the steps of:
   a first smart switch automatically detects a fault on the electric power line and utilizes direction-to-fault and zone-based distance-to-fault detection to determine that it is closest to the fault on the upstream side of the fault, and therefore trips, attempts to reclose to clear the fault, and locks open to isolate the fault on the upstream side,
   a second smart switch operating as a tie-switch automatically detects that it has lost voltage on only one side of the tie-switch and therefore closes, and
   a third smart switch automatically detects the fault and utilizes direction-to-fault and zone-based distance-to-fault detection to determine that it is closest to the fault on the downstream side of the fault, and therefore trips and locks open to isolate the fault on the downstream side with a portion of the electric power line back-fed through the tie-switch.

2. The electric power fault detection, isolation and restoration system of claim 1, wherein the smart switches are further configured to automatically respond to the electric fault without communications between the smarts switches and a central controller or among the smart switches at the time of fault isolation.

3. The electric power fault detection, isolation and restoration system of claim 1, wherein the first smart switch determines that it is closest to the fault on the upstream side of the fault by determining that it is within a Zone-1 for the fault on the upstream side of the fault.

4. The electric power fault detection, isolation and restoration system of claim 3, wherein the Zone-1 represents a probability of at least an upper percentage limit that the first smart switch is closest to the fault.

5. The electric power fault detection, isolation and restoration system of claim 4, wherein the smart switches comprise:
a plurality of normally-closed Type-A switches, wherein each Type-A switch is configured to utilize direction-to-fault and zone-based distance-to-fault detection to automatically open when it detects a fault, to automatically attempt to reclose and reopen when it continues to detect the fault, and to remain in its current position with no automatic opening when detect a loss voltage on both sides of the Type-A switch;
one or more normally-closed Type-B switches, wherein each Type-B switch is configured to operate like a Type-A switch, except that each Type-B switch automatically opens when it detects a loss of voltage on both sides of the Type-B switch;
one or more normally-open tie-switches, wherein each tie-switch is configured to automatically close when it detects a loss of power on only one side of the tie-switch, and to operate as a Type-A or Type-B switch once closed.

6. The electric power fault detection, isolation and restoration system of claim 1, wherein the first smart switch determines that it is closest to the fault by determining that it is within a Zone-2 for the fault, and that a Zone-1 response time has expired.

7. The electric power fault detection, isolation and restoration system of claim 6, wherein:
Zone-1 represents a probability of at least a upper percentage limit that the first smart switch is closest to the fault; and
Zone-2 represents a probability of at least a lower percentage limit but less than the upper percentage limit that the first smart switch is closest to the fault.

8. The electric power fault detection, isolation and restoration system of claim 7, wherein the upper percentage limit is about 70% and the lower percentage limit is about 30%.

9. The electric power fault detection, isolation and restoration system of claim 3, wherein Zone-1 represents an upper distance limit to a next adjacent smart switch in the direction of the fault.

10. The electric power fault detection, isolation and restoration system of claim 9, wherein the upper distance limit is about 80% of the distance to the next adjacent smart switch in the direction of the fault.

11. The electric power fault detection, isolation and restoration system of claim 10, wherein the first smart switch determines that it is closest to the fault by determining that it is within a Zone-3 for the fault, and that Zone-1 and Zone-2 response times have expired.

12. The electric power fault detection, isolation and restoration system of claim 11, wherein:
Zone-1 represents a first range in the direction of the fault; and
Zone-2 represents a second range that is greater than the first range in the direction of the fault.

13. The electric power fault detection, isolation and restoration system of claim 12, wherein:
The first range is about 80% of the distance to the next adjacent smart switch in the direction of the fault;
the second range is about 160% of the distance to the next adjacent smart switch in the direction of the fault.

14. The electric power fault detection, isolation and restoration system of claim 1, wherein the first smart switch that locks open to isolate the fault on the upstream side of the fault is further configured to:
during a first reclose attempt, to utilize a fuse-safe reclose timing protocol selected to prevent fuses on the electric power line from tripping in response to the first reclose attempt; and
during a second reclose attempt, to utilize a fuse-trip reclose timing protocol selected to cause as least one fuse on the electric power line to trip in response to the second reclose attempt.

15. An electric power fault detection, isolation and restoration system for an electric power line comprising a first substation breaker serving as an upstream power supply for the electric power line, a second substation breaker serving as a selectable downstream power supply for back-feeding the electric power line from the second substation breaker, a third substation breaker serving as another selectable downstream power supply for back-feeding the electric power line from the third substation breaker, and a plurality computer-controlled smart switches configured to operate autonomously to isolate electric faults occurring on the electric power line, the smart switches comprising non-transitory computer storage media storing computer-executable instructions that, when executed by the smart switches, cause them to perform the steps of:
a first smart switch automatically detects a fault on the electric power line and utilizes direction-to-fault and zone-based distance-to-fault detection to determines that it is closest to the fault on the upstream side of the fault, and therefore trips, attempts to reclose to clear the fault, and locks open to isolate the fault on the upstream side,
a second smart switch operating as a first tie-switch automatically detects that it has lost voltage on only side of the first tie-switch and therefore closes to back-feed a non-faulted portion of the first circuit from the second substation breaker,
the first tie-switch automatically detects an overload condition, trips and locks open,
a third smart switch operating as a second tie-switch autonomously detects that it has lost voltage on only side of the second tie-switch and therefore closes to back-feed the non-faulted portion of the first circuit from the third substation breaker, and
a fourth smart switch automatically detects the fault and utilizes direction-to-fault and zone-based distance-to-fault detection to determine that it is closest to the fault on the downstream side of the fault, and therefore trips and locks open to isolate the fault on the downstream side with a portion of the first circuit back-fed through the second tie-switch.

16. The electric power fault detection, isolation and restoration system of claim 15, wherein the smart switches are further configured to automatically respond to the electric fault without communications between the smarts switches and a central controller or among the smart switches at the time of fault isolation.

17. The electric power fault detection, isolation and restoration system of claim 15, wherein the first smart switch that locks open to isolate the fault on the upstream side of the fault is further configured to:
during a first reclose attempt, to utilize a fuse-safe reclose timing protocol selected to prevent fuses on the electric power line from tripping in response to the first reclose attempt; and during a second reclose attempt, to utilize a fuse-trip reclose timing protocol selected to cause as least one fuse on the electric power line to trip in response to the second reclose attempt.

18. An electric power system fault detection, isolation and restoration system for an electric power line comprising a first substation breaker serving as an upstream power supply for the electric power line, a second substation breaker serving as a selectable downstream power supply for back-feeding the electric power line from the second substation breaker, and a plurality computer-controlled smart switches configured to operate autonomously to isolate electric faults occurring on the electric power line, the smart switches comprising non-transitory computer storage media storing computer-executable instructions that, when executed by the smart switches, cause them to perform the steps of:
- a first smart switch automatically detects the fault and utilizes direction-to-fault and zone-based distance-to-fault detection to determine that it is closest to the fault on the upstream side of the fault, and therefore trips, attempts to reclose to clear the fault, and locks open to isolate the fault on the upstream side;
- a second smart switch automatically detects that it has lost voltage on both sides of the second smart switch and therefore opens;
- a third smart switch operating as a tie-switch automatically detects that it has lost voltage on only one side of the tie-switch and therefore closes; and
- a fourth smart switch automatically detects the fault and utilizes direction-to-fault and zone-based distance-to-fault detection to determine that it is closest to the fault on the downstream side of the fault, and therefore trips and locks open to isolate the fault on the downstream side with a portion of the electric power line back-fed through the tie-switch.

19. The electric power fault detection, isolation and restoration system of claim 18, wherein the smart switches are further configured to automatically respond to the electric fault without communications between the smarts switches and a central controller or among the smart switches at the time of fault isolation.

20. The electric power fault detection, isolation and restoration system of claim 18, wherein the first smart switch that locks open to isolate the fault on the upstream side of the fault is further configured to:
- during a first reclose attempt, to utilize a fuse-safe reclose timing protocol selected to prevent fuses on the electric power line from tripping in response to the first reclose attempt; and
- during a second reclose attempt, to utilize a fuse-trip reclose timing protocol selected to cause as least one fuse on the electric power line to trip in response to the second reclose attempt.

* * * * *